United States Patent
Komiya et al.

(10) Patent No.: US 7,848,832 B2
(45) Date of Patent: Dec. 7, 2010

(54) ALIGNMENT APPARATUS

(75) Inventors: Takehiko Komiya, Kitakyushu (JP);
Toshiyuki Osuga, Kitakyushu (JP);
Toshihiro Sawa, Kitakyushu (JP)

(73) Assignee: Kabushiki Kaisha Yaskawa Denki, Kitakyushu-shi (JP)

( * ) Notice: Subject to any disclaimer, the term of this patent is extended or adjusted under 35 U.S.C. 154(b) by 705 days.

(21) Appl. No.: 11/720,271

(22) PCT Filed: Nov. 7, 2005

(86) PCT No.: PCT/JP2005/020343
§ 371 (c)(1),
(2), (4) Date: May 25, 2007

(87) PCT Pub. No.: WO2006/059457
PCT Pub. Date: Jun. 8, 2006

(65) Prior Publication Data
US 2008/0019817 A1    Jan. 24, 2008

(30) Foreign Application Priority Data
Nov. 30, 2004   (JP)  ............................ 2004-345925
Jun. 1, 2005   (JP)  ............................ 2005-160929

(51) Int. Cl.
    *G05B 19/18*     (2006.01)
    *G06F 19/00*     (2006.01)
(52) U.S. Cl. ........................ 700/60; 700/57; 700/114
(58) Field of Classification Search ............... 700/60, 700/57, 114
See application file for complete search history.

(56) References Cited

U.S. PATENT DOCUMENTS

| | | | | |
|---|---|---|---|---|
| 5,758,429 | A * | 6/1998 | Farzan et al. | 33/503 |
| 6,577,923 | B1 * | 6/2003 | White et al. | 700/245 |
| 2004/0130690 | A1 * | 7/2004 | Koren et al. | 355/53 |
| 2005/0203664 | A1 * | 9/2005 | Schauer et al. | 700/213 |
| 2009/0152785 | A1 * | 6/2009 | Komiya et al. | 269/63 |

FOREIGN PATENT DOCUMENTS

| | | |
|---|---|---|
| JP | 5-162035 A | 6/1993 |
| JP | 8-099243 A | 4/1996 |
| JP | 10-043978 A | 2/1998 |
| JP | 11-245128 A | 9/1999 |
| JP | 2002-328191 A | 11/2002 |

* cited by examiner

*Primary Examiner*—Albert DeCady
*Assistant Examiner*—Sivalingam Sivanesan
(74) *Attorney, Agent, or Firm*—Sughrue Mion, PLLC

(57) ABSTRACT

To be able to restrain a height of a machine even when the machine is large-sized and smoothly move a table in $XY\theta$ directions.

An alignment apparatus includes two translational freedom degree guide portion (13), one rotational freedom degree guide portion (12), a translational drive/translational/rotational freedom degree mechanism module (6) including a linear motor provided at one of the translational freedom degree guide portion (13), a machine base portion (7), a reference generator portion (8), a two-dimensional position sensor (9), a calculating portion of compensation value (10). At least three of the translational drive/translational/rotational freedom degree mechanism modules (6) are uniformly arranged to a table (4).

14 Claims, 63 Drawing Sheets

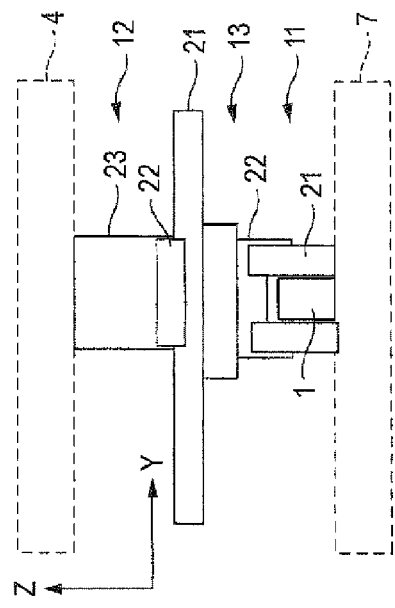
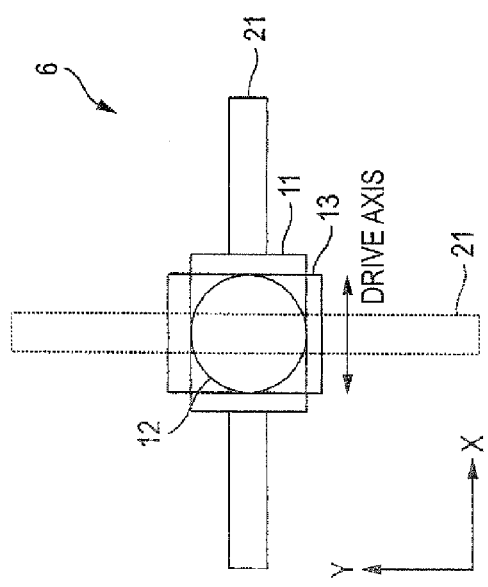
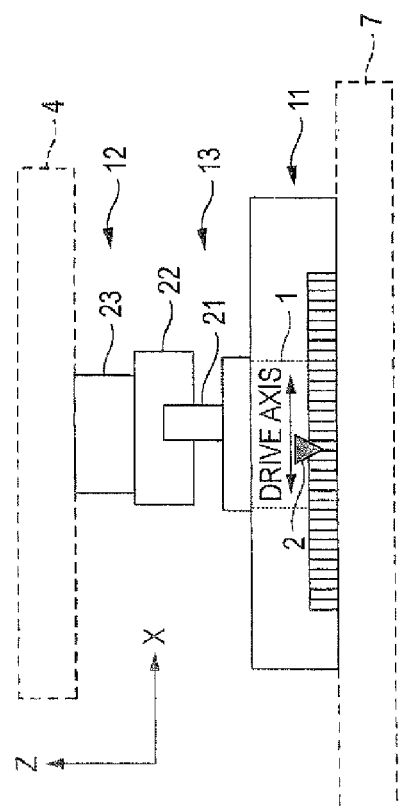
FIG. 3A
FIG. 3B
FIG. 3C

FIG. 36
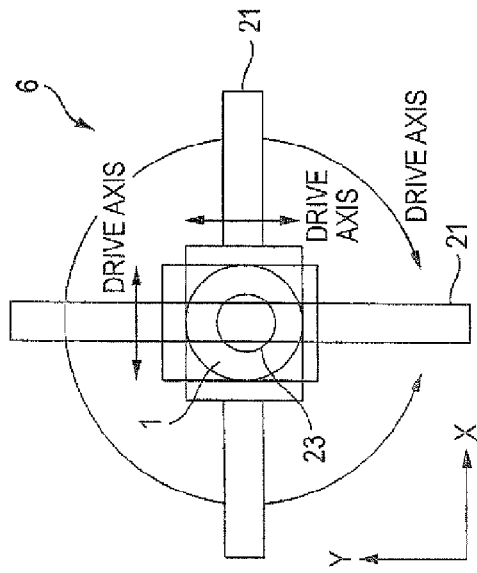
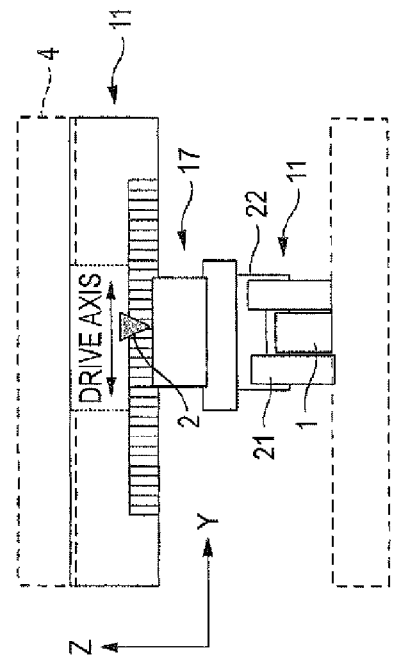
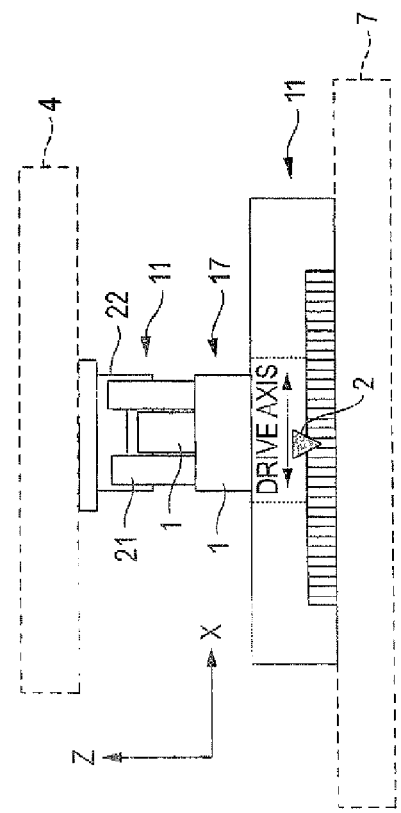

FIG. 37
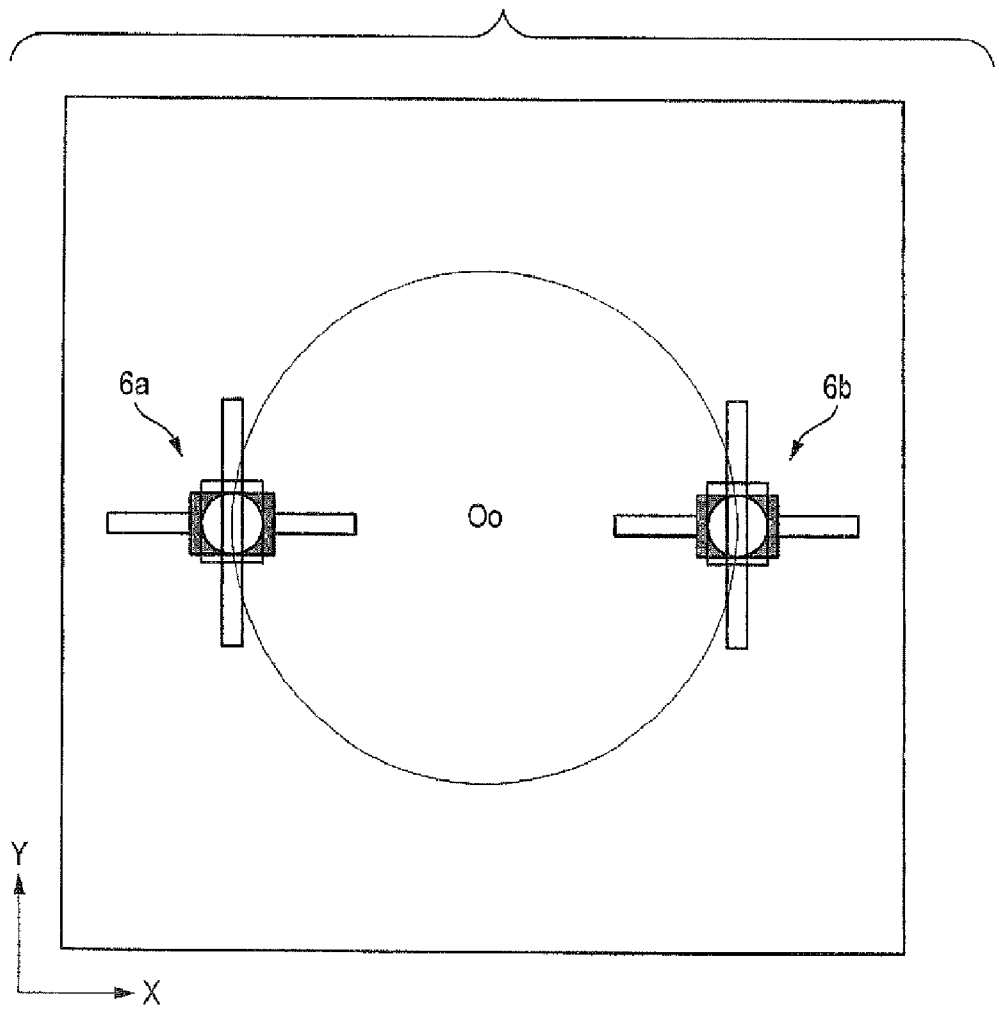
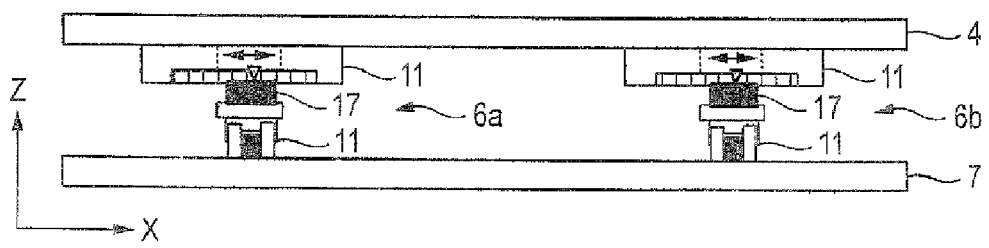

FIG. 43
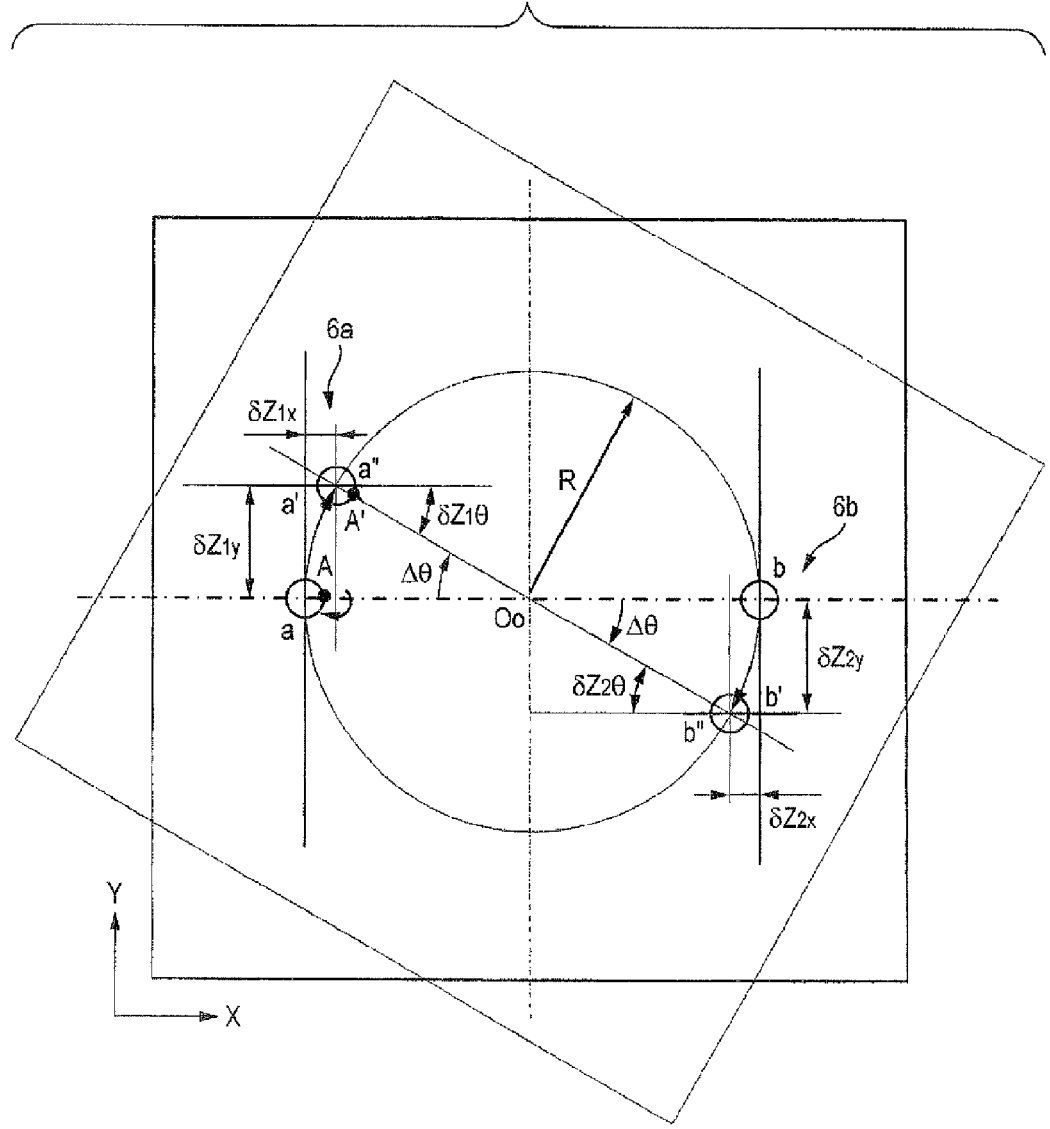
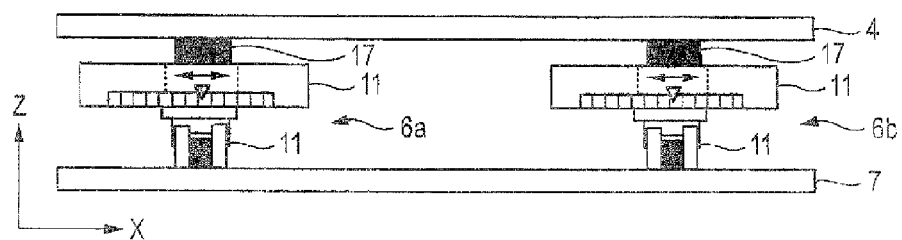

FIG. 45
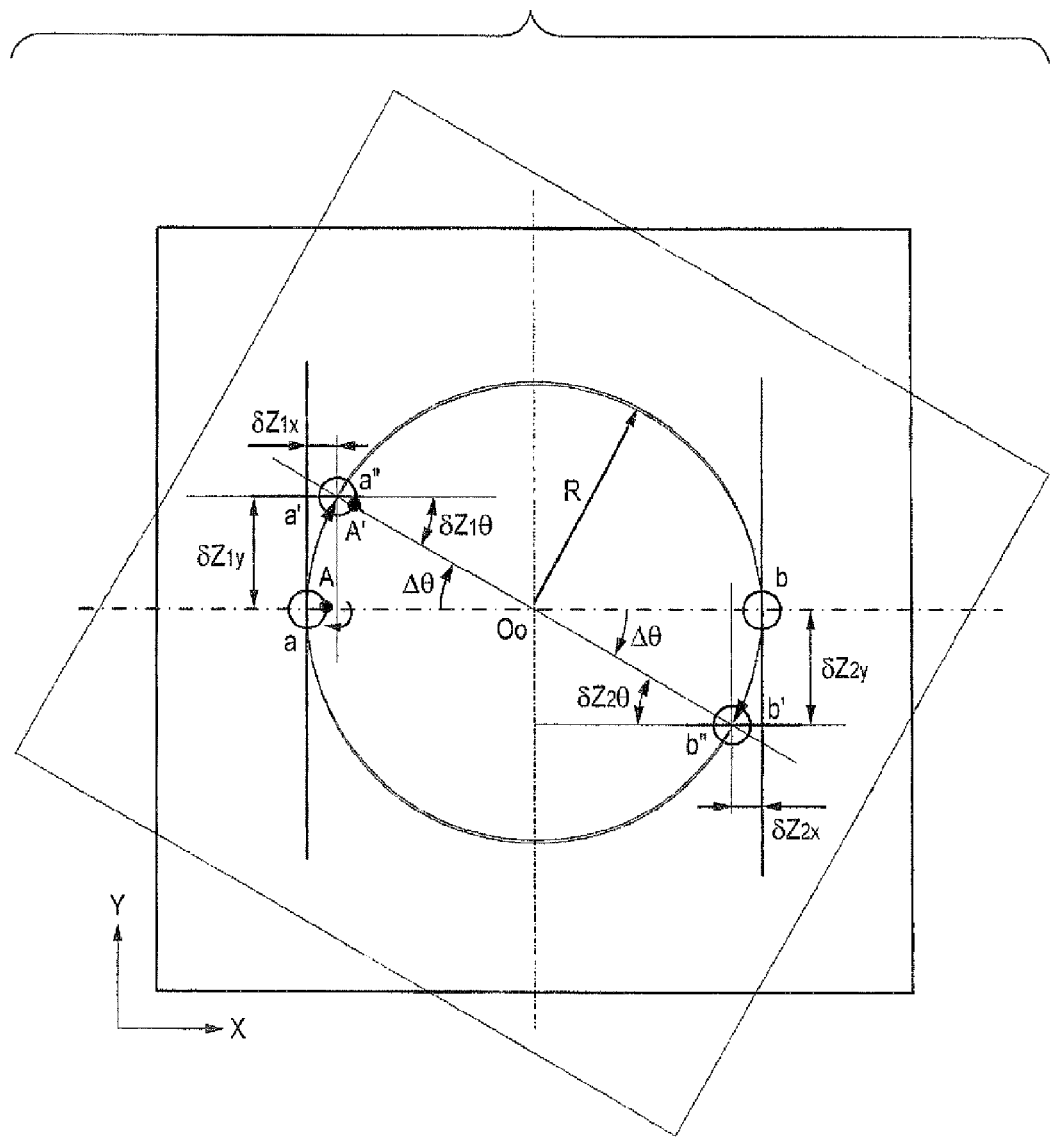
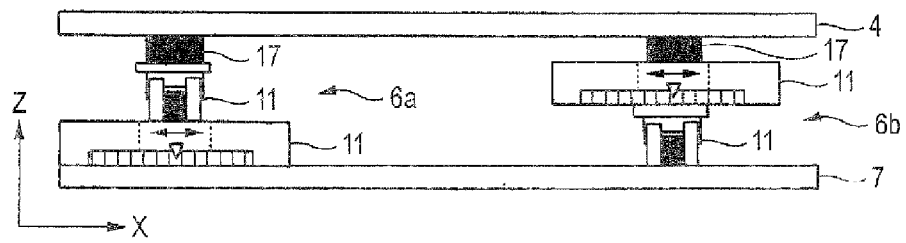

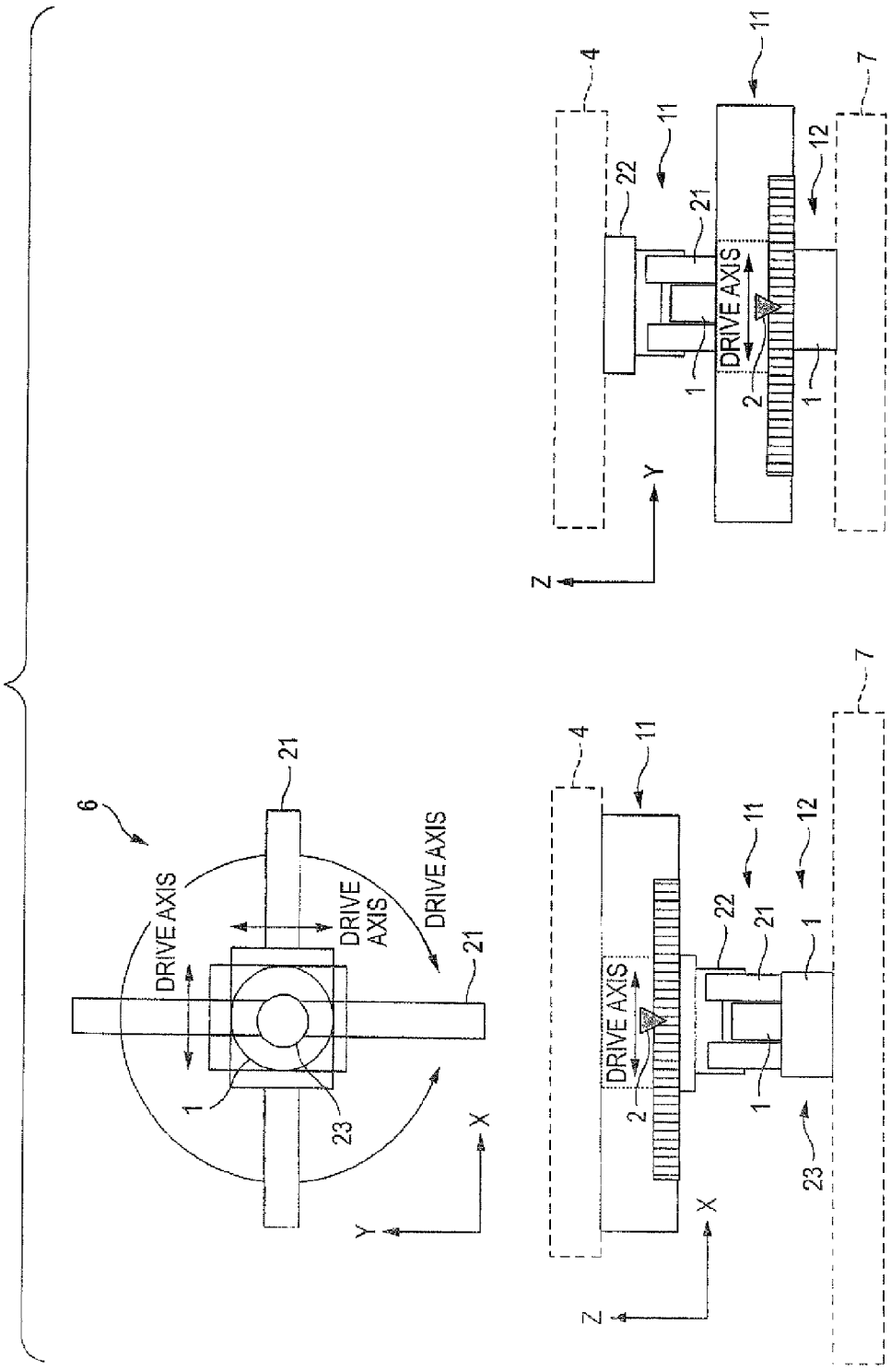

ALIGNMENT APPARATUS

TECHNICAL FIELD

The present invention relates to an alignment apparatus for positioning a positioned member (hereinafter, referred to as object member) on a table to a predetermined position by moving the table by driving a motor in an exposure apparatus or the like of a semiconductor apparatus, a printed board, a liquid crystal display element or the like.

BACKGROUND ART

A stage apparatus including a linear motor constituting a first example of a background art is constituted by small-sized and thinned formation and, enables to a small angle positioning by using the linear motor (refer to, for example, Patent Reference 1).

Further, a biaxial parallel/monoaxial swiveling motion guide mechanism and a biaxial parallel/monoaxial swiveling table apparatus using the same constituting a second example of the background art are constituted as a table apparatus using the biaxial parallel/monoaxial swiveling motion guide mechanism which is simple in being integrated to the table and capable of highly accurately guide and support the table (refer to, for example, Patent Reference 2).

First, the stage apparatus including the linear motor of the first example of the background art will be explained.

FIG. 59 is a front view showing an embodiment of the stage apparatus including the linear motor according to the first example of the background art viewed from X direction constituting one direction.

FIG. 60 is a plane view showing the stage apparatus of FIG. 59 according to the first example of the background art.

The stage apparatus including the linear motor is a rotational stage apparatus integrated with a rotating linear motor 113 as a drive apparatus of moving in a rotational direction by a small amount between a rotational stage 103 and a second stage 102, particularly, applying a movable magnet type linear motor as the rotating linear motor 113 in consideration of positioning by a small amount of an angle of the rotational stage 103, and positioning an angle of a part of a work or the like by moving the rotating linear motor 113 and the rotational stage 103 constituting a rotational direction portion in a rotational direction (that is, θ direction) by a small amount.

The rotational stage 103 (that is, θ stage apparatus) is integrated to an XY stage apparatus constituted by a first stage 101 reciprocally moving in X direction constituting a linear direction in one direction and the second stage 102 reciprocally moved in Y direction orthogonal to X direction to constitute a compound stage apparatus of an XY-θ stage apparatus, and constitute a structure of positioning a part of a work or the like on a plane in X direction, Y direction and a rotational direction (θ direction).

In this way, the stage apparatus including the linear motor according to a first example of the background art is small-sized and thinned for positioning in XYθ directions.

Next, a biaxial parallel/monoaxial swiveling motion guide mechanism and a biaxial parallel/monoaxial swiveling table apparatus using the same constituting a second example of the background art will be explained. FIG. 61 is a partially broken disassembled perspective view of the biaxial parallel/monoaxial swiveling motion guide mechanism according to the second example of the background art.

FIG. 61 shows a biaxial parallel/monoaxial swiveling table apparatus using the biaxial parallel/monoaxial swiveling motion guide mechanism according to the second example of the background art, a drawing (a) is a plane view omitting and showing a table by a two-dotted chain line, a drawing (b) is a front view.

FIGS. 62A and 62B are plane views of the table according to the second example of the background art.

As shown by FIGS. 62A and 62B, a biaxial parallel/monoaxial swiveling motion guide mechanism 201 is constituted by a biaxial parallel motion guide portion 270, and a swiveling motion guide portion 280 integrated to the biaxial parallel motion guide portion 270.

Further, as shown by FIG. 61, FIGS. 62A and 62B, a biaxial parallel/monoaxial swiveling table apparatus using the biaxial parallel/monoaxial swiveling motion guide mechanism 201 supports a table 233 movably in biaxial directions in parallel with a base 234 and orthogonal to each other using by four of biaxial/monoaxial swiveling motion guide mechanisms 201A, 201B, 201C, 201D and is made to be able to swivel centering on a swiveling axis C0 disposed at a center portion of the table 233.

Three of the biaxial parallel/monoaxial swiveling motion guide mechanisms 201A, 201B, 201D in four thereof are operably connected with linear drive mechanisms 237A, 237B, 237D constituted by a rotating motor 238, and feed screw mechanisms 239 for converting rotational motion of the rotational motors 238 into linear motion for being driven to elongate and contract respectively in linear directions. Thereby, the biaxial parallel/monoaxial swiveling motion guide mechanism 201C can carry out a motion freely.

When the table 233 is moved in parallel, the two linear drive mechanisms 237A, 237B or the linear drive mechanism 237C is driven.

When the table 233 is swiveled relative to the swiveling axis C0, as shown by FIG. 63, the linear drive mechanisms 237A, 237B are driven in directions inverse to each other by the same amount +ΔX, −ΔX, on the other hand, the linear drive mechanism 237D is driven in Y axis direction by a predetermined amount ΔY.

In this way, the biaxial parallel/monoaxial swiveling motion guide mechanism and the biaxial parallel/monoaxial swiveling table apparatus using the same according to the background art moves in parallel or swivel the table to position.

Patent Reference 1: JP-A-2002-328191 (FIG. 1, FIG. 2)
Patent Reference 2: JP-A-11-245128 (FIG. 2, FIG. 4, FIG. 5)

DISCLOSURE OF THE INVENTION

Problems that the Invention is to Solve

According to the stage apparatus including the linear motor of the first example of the background art, the apparatus is constituted by overlapping respective axes in three directions of XYθ. Thus, there has been a problem that the stage apparatus becomes physically high when the object member to be positioned is large-sized. In recent years, a liquid crystal material becomes large-sized year by year, in order to reciprocally move or rotationally move the table, that is, the stage, the linear motor and the stage apparatus are obliged to be enlarged as they are. When a center of gravity of the stage apparatus becomes high, there is brought about also a drawback that the stage apparatus is weak at a disturbance of a vibration or the like.

Further, due to the apparatus constitution overlapping the respective axes of 3 directions of XYθ, in a case in which the stage is large-sized, when the stage is moved in XY directions, a position of the center of gravity is shifted. Therefore, depending on a position of moving the stage by the drive portion, load is concentrated to connecting portions of the respective axes, a large moment load is generated at the stage. Thus, there is a problem that smooth movement of the stage is hampered, or an unexpected rotational movement is produced to deteriorate a positional accuracy.

Further, according to the biaxial parallel/monoaxial swiveling motion guide mechanism and the biaxial parallel/monoaxial swiveling motion table apparatus using the same of the second example of the background art, the biaxial parallel/monoaxial swiveling motion table apparatus are constituted by 3 axes constitution that the biaxial parallel/monoaxial swiveling motion guide mechanisms are positioned at 3 of 4 corners of the table. Therefore, there is a direction of being driven only by one axis, due to nonuniformity of capacitances of the motors, a function the same as that in the biaxially driving directions cannot be achieved. Therefore, there poses a problem that time is taken in moving and positioning to a direction of being driven only by one axis. As a result, there is posed a problem that efficiency/productivity is deteriorated. Further, due to ball screw driving, a mechanical loss of backlash or the like is present.

Further, when a large-sized table is moved, in the monoaxial driving, the table is driven on one side of the table. Therefore, one side of the table not provided with a drive shaft is delayed to also pose a problem that a table positioning accuracy is deteriorated.

Furthermore, when an external force is exerted in working an object member on the table, a rotational freedom degree or a translational freedom degree that cannot be held by a control system is present. Therefore, there is a case in which the table is moved in accordance with the external force. Thereafter, there is not a portion of detecting movement of the table or the object member by the external force. Therefore, a problem that the position of the table cannot be compensated is posed.

The invention has been carried out in view of such a problem and it is an object thereof to provide an alignment apparatus constituted such that even when a table is large-sized, a height of the apparatus is restrained, supporting a load by a table or an object member by dispersing the load with excellent balance, operated accurately and efficiently by the same function in translational movement, rotational movement in respective directions by operating a drive force with excellent balance, in addition, being capable of compensating the table again even when the table is moved by exerting an external force to the table.

Means for Solving the Problems

In order to solve the above-described problem, the invention is constituted as follows.

The invention as set forth in Claim 1 is characterized in an alignment apparatus positioning a table mounted with an object member to a predetermined position using by a drive mechanism arranged at a machine base portion, wherein the drive mechanism comprises: two translational freedom degree guide portions; and one rotational freedom degree guide portion, and wherein the alignment apparatus comprises: a translational drive/translational/rotational freedom degree mechanism module including a linear motor provided at one of the translational freedom degree guide portions; a detecting portion that detects a moving distance of the mechanism portion constituting a detected member; a motor control apparatus comprising a controller that controls the motor using by reference signal; and a reference generator portion that instructs the reference to the controller, and wherein at least three of the translational drive/translational/rotational freedom degree mechanism modules are provided to be arranged uniformly to the table portion such that directions of other of the translational freedom degree guide portion and the rotational freedom degree guide portion can be determined by positive and negative operating directions of the linear motor, the linear motor of the translational drive/translational/rotational freedom degree mechanism module is arranged to provide two separately directions of translational components in a plane, and the table portion is translationally moved or rotationally moved in two directions by operating the linear motors respectively in translational directions.

Further, the invention as set forth in Claim 2 is characterized in that the translational drive/translational/rotational freedom degree mechanism modules are provided to be arranged uniformly to the table portion such that at least three of the translational drive/translational/rotational freedom degree mechanism modules can determine directions of other of the translational freedom degree guide portion and the rotational freedom degree guide portion by the positive and negative operating directions of the linear motor, and the translational drive/translational/rotational freedom degree mechanism module is added to provide.

Further, the invention as set forth in Claim 3 is characterized in that the reference generator portion includes a calculating portion of moving distance that calculates a moving distance of the linear motor provided to the translational drive/translational/rotational freedom degree mechanism module from an operation of the table.

Further, the invention as set forth in Claim 4 is characterized in further comprising: a two-dimensional position sensor that detects an arrangement of the object member placed on the table portion; and a calculating portion of compensation value that calculates a compensation value for compensating a position of the object member placed on the table portion, wherein the position of the object member is compensated by translationally moving or rotationally moving the table portion in two directions by driving the linear motor to thereby compensate the position of the object member placed on the table portion detected by the two-dimensional position sensor.

Further, the invention as set forth in Claim 5 is characterized in that the translational drive/translational/rotational freedom degree mechanism module further provides the translational freedom degree guide portion on a translational drive portion to which the linear motor is attached at the translational freedom degree guide portion, and the rotational freedom degree guide portion is provided on the translational freedom degree guide portion.

Further, the invention as set forth in Claim 6 is characterized in that the translational drive/translational/rotational freedom degree mechanism module provides the rotational freedom degree guide portion on a translational drive portion to which the linear motor is attached at the translational freedom degree guide portion, and the rotational freedom degree guide portion is provided further on the rotational drive portion.

Further, the invention as set forth in Claim 7 is characterized in further comprising: a 3 freedom degree module that includes two the translational freedom degree guide portions and one of the rotational freedom degree guide portion without the linear motor.

Further, the invention as set forth in Claim 8 is characterized in an alignment apparatus positioning a table mounted with an object member to a predetermined position using by a drive mechanism arranged at a machine base portion, wherein the drive mechanism comprises at least two sets of translational drive/translational/rotational freedom degree mechanism modules comprising: two translational drive portions having a translational freedom degree; one rotational drive portion having a rotational freedom degree; three motors that respectively drives the drive portions at two the translational drive portions and one of the rotational drive portions; a detecting portion that detects a moving distance of the mechanism portion constituting a detecting member; and a motor control apparatus comprising a controller that controls the motor using by reference signal and, wherein the translational drive/translational/rotational freedom degree mechanism modules comprises a reference generator apparatus that provides an operating reference to the controller and moves the table translationally or rotationally in two directions by operating two the translational drive portions and one of the rotational drive portion by the motor.

Further, the invention as set forth in Claim 9 is characterized in that the translational drive/translational/rotational freedom degree mechanism module comprises at least one translational drive portion and one rotational drive portion, and a rotational center of table of the rotational drive portion is arranged on the same radius from the rotational center of table and is arranged axially symmetrically with respect to the rotational center of the table.

Further, the invention as set forth in Claim 10 is characterized in that the translational drive/translational/rotational freedom degree mechanism module is arranged such that one of moving directions of the translational drive portion coincides with the rotational center of the table.

Further, the invention as set forth in Claim 11 is characterized in that the translational drive/translational/rotational freedom degree mechanism module includes the rotational drive portion arranged at an upper portion or a lower portion of the translational drive portion having two freedom degrees.

Further, the invention as set forth in Claim 12 is characterized in that in the translational drive/translational/rotational freedom degree mechanism module, the rotational drive portion is arranged at an upper portion of the translational drive portion having at least one freedom degree, and the translational drive portion having at least one freedom degree is arranged at an upper portion of the rotational drive portion.

Further, the invention as set forth in Claim 13 is characterized in further comprising: a two-dimensional position sensor that detects a position of the object member on the table; and a calculating portion of compensation value that calculates a compensation value for compensating the position of the object member by a image processing of the object member detected by the two-dimensional position sensor to an image processing, wherein the position of the table is compensated by driving the motor based on the compensation value calculated by the calculating portion of compensation value.

Further, the invention as set forth in Claim 14 is characterized in that the calculating portion of compensation value generates the compensating value so as to compensate the position of the object member after the position of the object member is detected by the two-dimensional position sensor and the table is translationally moved or rotationally moved by the translational drive/translational/rotational freedom degree mechanism module.

Further, the invention as set forth in Claim 15 is characterized in that the reference generator portion generates an instruction so as to move the translational drive portion after the position of the object is detected by the two-dimensional position sensor, the compensation value is generated to compensate the position of the object member by the calculating portion of compensation value and the rotational drive portion is moved.

ADVANTAGE OF THE INVENTION

According to the invention, the following effect is achieved.

According to the invention as set forth in Claim 1, the table operated in 3 directions of XYθ can be realized by restraining a height of the apparatus. A load of the table or the object member can dispersingly be supported with excellent balance. Further, a drive force moving the table can be outputted by being dispersed with excellent balance. Therefore, in translationally moving or rotationally moving the table, the respective linear motors are operated in any direction, and operated without being deviated from a center of gravity, and therefore, the linear motor can accurately and efficiently be operated with a uniform function.

Further, according to the invention as set forth in Claim 2, in addition to a situation in which the load of the table or the object member can be dispersingly supported with excellent balance. The drive force moving the table can be dispersingly outputted with excellent balance. Therefore, the respective linear motors are operated in any direction, and operated without being deviated from the center of gravity. In addition, a drive output necessary for a specific direction can be added.

Further, according to the invention as set forth in Claim 3, when an angle of rotation or a translational moving distance of the table is determined, the moving distance of the table and the moving distances of the respective linear motors can be determined by the geometrically relationship. Therefore, moving distances of translational drive portions of the respective translational drive/translational/rotational freedom degree mechanism modules can be calculated and can be used as an operation reference.

Further, according to the invention as set forth in Claim 4, the operation moving the table can swiftly be operated by calculating the compensating value of the position using the two-dimensional position sensor in a situation of arranging the object member on the table.

Further, according to the invention as set forth in Claim 5, angles of attaching the two translational freedom degree guide portions are fixed, and therefore, the moving distances necessary in moving the table can comparatively simply be calculated.

Further, according to the invention as set forth in Claim 6, the rotational drive portion can be placed by interposing the linear movement guides of the two the translational drive portions. The apparatus can continuously be supported from the table to the machine base. Therefore, the translational drive/translational/rotational freedom degree mechanism module can support the apparatus while restraining a deformation against a load of the table or the like.

Further, according to the invention as set forth in Claim 7, the load of the table or the object member can dispersingly be supported with excellent balance without restraining an operation in a plane of the table.

According to the invention as set forth in Claim 8, the table operated in three directions of XYθ can be realized. A load of the table or the object member can dispersingly be supported with excellent balance. Further, a drive force of moving the table can dispersingly be outputted with excellent balance. Therefore, in translationally moving or rotationally moving the table, the respective translational drive/translational/rotational freedom degree mechanism modules are operated in any direction, and operated without being deviated from the center of gravity. Therefore, the respective translational drive/translational/rotational freedom degree mechanism modules can accurately and efficiently be operated by a uniform function.

Further, according to the invention as set forth in Claim 9, a center of the rotational drive portion of the translational drive/translational/rotational freedom degree mechanism module is arranged on the same radius from the center of the table and is arranged axially symmetrically relative to the center of the table. Therefore, the translational drive/translational/rotational freedom degree mechanism module can accurately be operated by being able to be operated without bringing about a deviation in the center of gravity.

Further, according to the invention as set forth in Claim 10, by making one moving direction of the translational drive portion coincides with the rotational center of the table, a moving distance necessary for moving the table can comparatively simply be calculated.

Further, according to the invention as set forth in Claim 11, angles of attaching two the translational drive portions are fixed, and therefore, the moving distance necessary in moving the table can comparatively simply be calculated.

Further, according to the invention as set forth in Claim 12, by arranging the rotational drive portion interposed by two the translational drive portions, the rotational drive portion and two the translational drive portions can continuously be supported from the table to the machine base. Therefore, deformation of the translational/translational/rotational freedom degree mechanism module is retrained and the table is accurately positioned.

Further, according to the invention as set forth in Claim 13, the position of the object member on the table is calculated by the two-dimensional position sensor. By providing the calculating portion of compensation value for calculating the compensation value of the position, even when a positional shift is brought about on the table, the table is firmly positioned to the predetermined position.

Further, according to the invention as set forth in Claim 14, by calculating the compensation value of the position by a detecting signal of the two-dimensional position sensor in a situation of arranging the object member on the table, the table can swiftly be operated to move.

Further, according to the invention as set forth in Claim 15, by providing the reference generator portion generating an instruction to move the translational drive portion after moving the rotational drive portion, calculation of the compensation value is facilitated, and the table is efficiently positioned.

BRIEF DESCRIPTION OF THE DRAWINGS

FIGS. 3A to 3C illustrate outline views of a translational drive/translational/rotational freedom degree mechanism module used in the alignment apparatus showing the first embodiment of the invention, FIG. 3A is a plane view, FIG. 3B is a front view and FIG. 3C is a side view.

FIG. 28A is a plane view, FIG. 28B is a front view and FIG. 28C is a side view.

FIG. 31A is a plane view, FIG. 31B is a front view and FIG. 31C is a side view.

FIG. 36 illustrates a top view and a side view of a translational/rotational drive mechanism showing the fifth embodiment of the invention.

FIG. 37 illustrates a top view and a side view of the alignment apparatus showing the fifth embodiment of the invention.

FIG. 43 illustrates views showing an arrangement of a translational/rotational drive mechanism of an alignment apparatus showing the seventh embodiment of the invention and a rotational movement of a table.

FIG. 45 illustrates views showing an arrangement of a translational/rotational drive mechanism showing an eighth embodiment of the invention and a rotational movement of a table.

FIG. 46 illustrates views showing an arrangement of a translational/rotational drive mechanism showing a ninth embodiment of the invention and a rotational movement of a table.

FIG. 62A is a plane view omitting a table to show by a two-dotted chain line, FIG. 62B is a front view.

Figure 1:
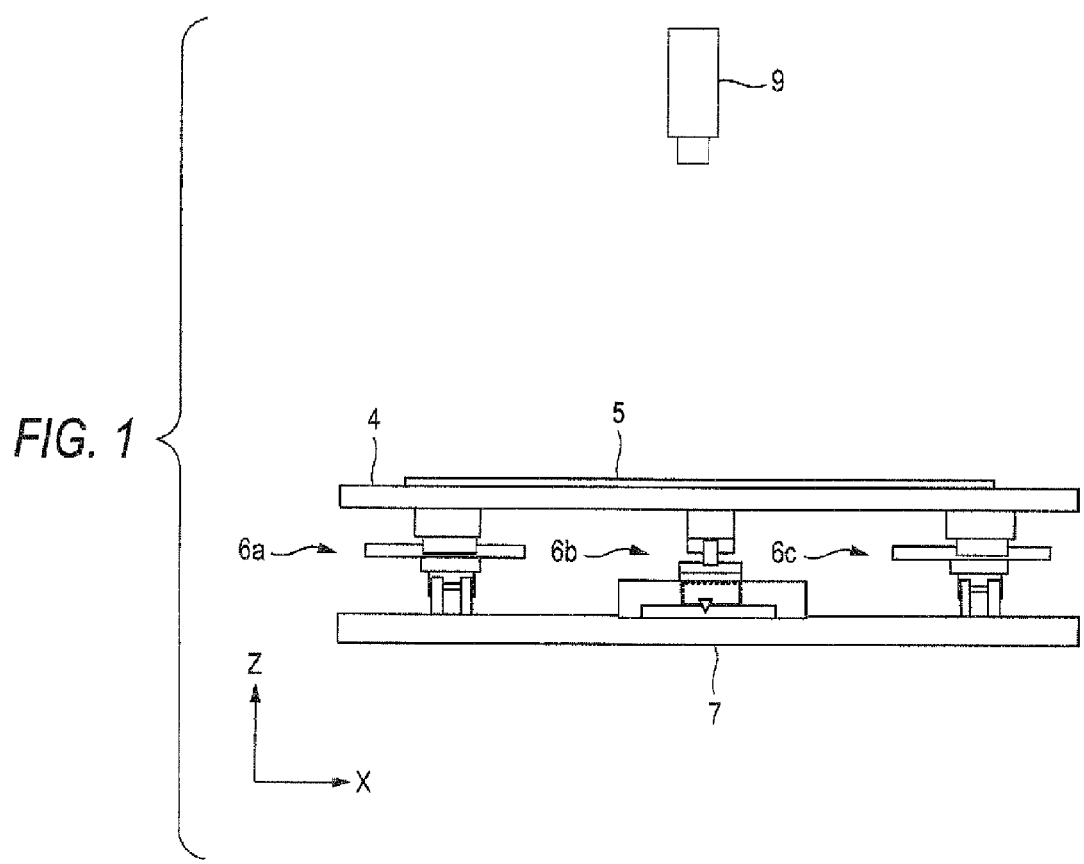
FIG. 1 is an outline view of an alignment apparatus showing a first embodiment of the invention.

DESCRIPTION OF REFERENCE NUMERALS AND SIGNS 1 linear motor
2 moving distance detecting portion
3 controller 4 table
5 object member
6 translational drive/translational/rotational freedom degree mechanism module
7 machine base portion
8 reference generator portion
9 two-dimensional position sensor
10 calculating portion of compensation value
11 translational drive portion
12 rotational freedom degree guide portion
13 translational freedom degree guide portion
14 3 freedom degree module
15 calculating portion of moving distance
16 motor
16L linear motor
16R rotational type motor
17 rotational drive portion
21 linear movement guide
22 linear movement guide block
23 rotating bearing
101 first stage
102 second stage
103 rotational stage
104 base
105, 106 linear movement guide units
107 track rail
108 slider
109 stopper
110, 114, 115 cords
111 first linear motor
112 second linear motor
113 rotating linear motor
117 sensor
118 linear scale
119, 121, 122, 125 projected portions
120 table
126 attaching screw hole
128 bed
134 primary side of third linear motor
141 attaching hole
139 secondary side of third linear motor
201 biaxial parallel/monoaxial swiveling motion guide mechanism
202 first track rail
204 moving block
205 ball (rolling member)
206 second track rail
210 first recess portion
211 second recess portion
212 ball rolling groove (first track rail)
213 ball rolling groove (first recess portion)
214 ball escape path
215 direction change path
216 side lid
217 ball rolling groove (second track rail)
218 ball rolling groove (second recess portion)
219 ball escape path
220 direction change path
221 side lid
223 table (second member)
234 base (first member)
237 linear drive mechanism
238 rotating motor
239 feed screw mechanism
241 nut
242 screw shaft
243 bearing (double angular contact type)
244 bearing support
247 joint member
249 brake mechanism
270 biaxial parallel motion guide portion
280 swiveling motion guide portion
206 rotating motor

BEST MODE FOR CARRYING OUT THE INVENTION

Embodiments of the invention will be explained in reference to the drawings as follows.

Embodiment 1

A constitution of an alignment apparatus of the first embodiment of the invention is as follows.

FIG. 1 is an outline view of an alignment apparatus showing a first embodiment of the invention.

Figure 2:
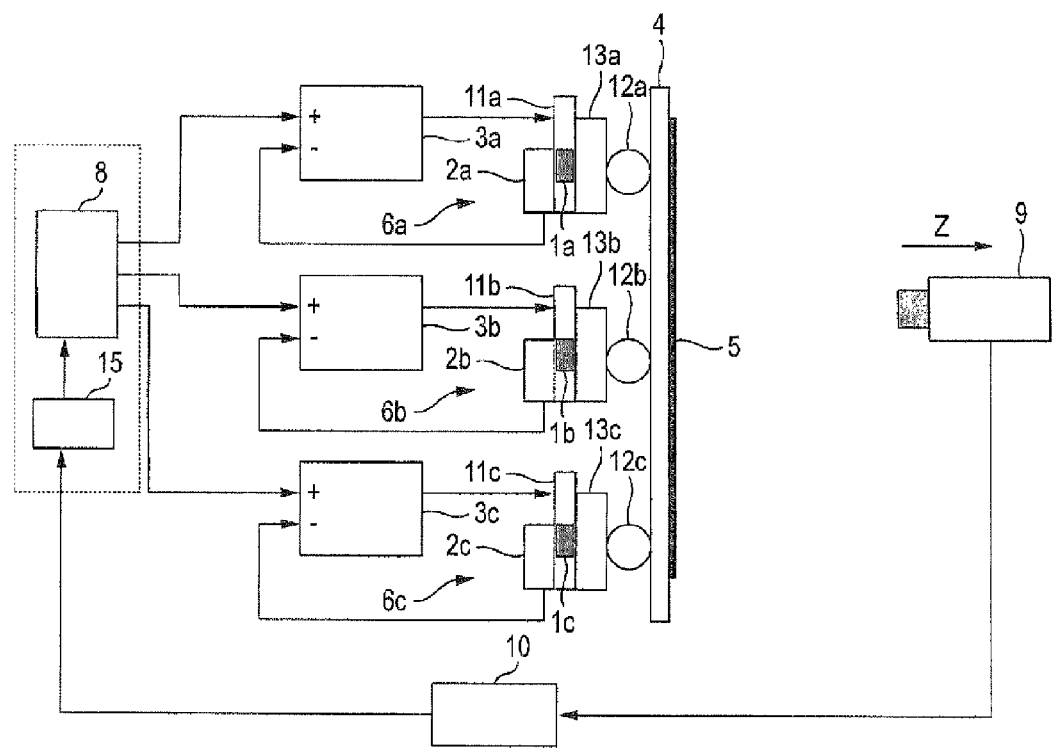
FIG. 2 is a constitution view of the alignment apparatus showing the first embodiment of the invention.

FIG. 2 is a constitution view of the alignment apparatus showing the first embodiment of the invention.

FIGS. 3A to 3C illustrate outline views of a translational drive/translational/rotational freedom degree mechanism module used in the alignment apparatus showing the first embodiment of the invention, FIG. 3A is a plane view, FIG. 3B is a front view, FIG. 3C is a side view.

Figure 4:
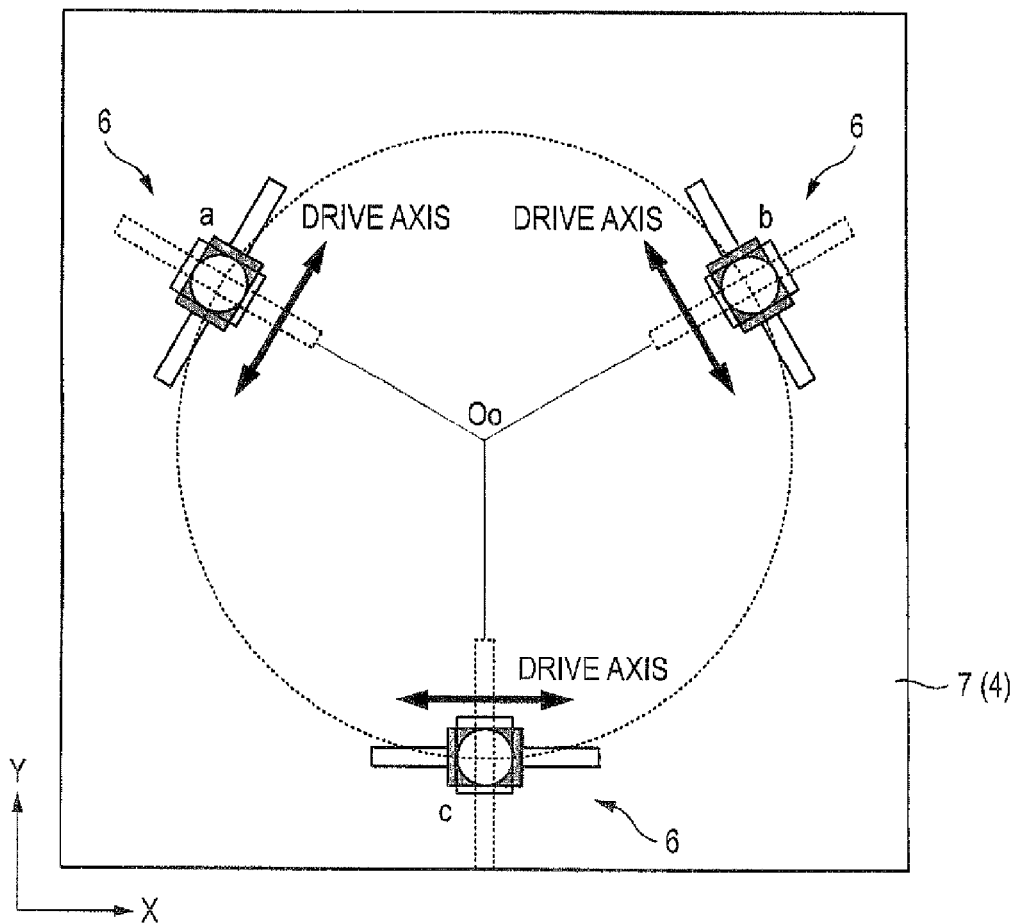
FIG. 4 illustrates a top view of the alignment apparatus showing the first embodiment of the invention and a view showing arrangement example 1 of the translational drive/translational/rotational freedom degree mechanism module.

FIG. 4 illustrates a top view of the alignment apparatus showing the first embodiment of the invention and a view showing arrangement example 1 of the translational drive/translational/rotational freedom degree mechanism module.

In the drawings, numeral 1 (1a, 1b, 1c) designates the linear motor, numeral 2 (2a, 2b, 2c) designates the moving distance detecting portion, numeral 3 (3a, 3b, 3c) designates the controller, numeral 4 designates the table, numeral 5 designates the object member, numeral 6 (6a, 6b, 6c) designates the translational drive/translational/rotational freedom degree mechanism module, numeral 7 designates the machine base portion, numeral 8 designates the reference generator portion, numeral 9 designates the two-dimensional position sensor, numeral 10 designates the calculating portion of compensation value, numeral 11 (11a, 11b, 11c) designates the translational drive portion, numeral 12 (12a, 12b, 12c) designates the rotational freedom degree guide portion, numeral 13 (13a, 13b, 13c) designates the translational freedom degree guide portion, numeral 15 designates the moving distance operating portion, numeral 21 designates the linear movement guide, numeral 22 designates the linear movement guide block, numeral 23 designates the rotating bearing.

A portion of the invention which differs from Patent Reference 1 is a portion in which movement of the table to XYθ directions is not realized by overlapping the linear motor but the movement of the table in XYθ directions is realized by providing at least 3 of the translational drive/translational/rotational freedom degree mechanism module 6.

A portion of the invention which differs from Patent Reference 2 is a portion in which at least 3 of the translational drive/translational/rotational freedom degree mechanism module 6 are provided, an arrangement thereof is uniformly arranged, and movement of the table in the respective directions is realized unevenly.

As shown by FIG. 1, an arrangement of the object member 5 detected by the two-dimensional position sensor 9 is driven by the translational drive/translational/rotational freedom degree mechanism modules 6 (6a, 6b, 6c), the table 4 is moved, and the position is compensated.

The translational drive/translational/rotational freedom degree mechanism modules 6 (6a, 6b, 6c) are fixed to the table 4 and the machine base 7.

As shown by FIG. 2, the table 4 is provided by 3 (6a, 6b, 6c) of the translational drive/translational/rotational freedom degree mechanism module 6, the translational drive/translational/rotational freedom degree mechanism modules 6 (6a, 6b, 6c) comprise the translational drive portions 11 (11a, 11b, 11c), the rotational freedom degree guide portions 12 (12a, 12b, 12c), and the translational freedom degree guide portions 13 (13a, 13b, 13c), the translational drive portions 11 (11a, 11b, 11c) are mounted with the linear motors 1 (1a, 1b, 1c), and operation of the linear motors 1 (1a, 1b, 1c) is controlled by the controllers 3 (3a, 3b, 3c) in accordance with the reference generator portion 8. An image of the object member 5 detected by the two-dimensional position sensor 9 is subjected to an image processing, the reference generator portion 8 calculates a moving distance of the linear motor 1 from a moving distance of the table 4 by the respective rotational amount operating portions 15 from a value provided by calculating an arrangement position at which the object member 5 is to be disposed by the calculating portion of compensation value 10 and instructs compensation values to the respective controllers 3 (3a, 3b, 3c).

As shown by FIGS. 3A to 3C, the translational drive/translational/rotational freedom degree mechanism module 6 comprises the translational drive portion 11 having the linear motor 1, the rotational freedom degree guide portion 12, and the translational freedom degree guide portion 13 and is constituted to provide a translational freedom degree, a translational freedom degree, a rotational freedom degree successively from the machine base 7 to the table 4.

The rotational freedom degree guide portion 12 includes the rotating bearing 23 and realizes a rotational freedom degree, the translational drive portion 11 and the translational freedom degree guide portion 13 are provided with the linear movement guide block 22 capable of moving the linear movement guide 21 to thereby realize the translational freedom degree.

Further, the two translational freedom degrees are constituted to be orthogonal to each other.

As shown by FIG. 4, there are 3 of the translational drive/translational/rotational freedom degree mechanism modules 6 (6a, 6b, 6c) shown in FIGS. 3A to 3C, and arranged such that a center of gravity of a regular triangle constituted by initial positions thereof coincides with a center gravity of the table 4, and the linear motors 1 (1a, 1b, 1c) of the translational drive portions 11 (11a, 11b, 11c) drive the module 6 in a tangential direction of a circle constituted from the center of the table 4.

Next, operation of the translational drive/translational/rotational freedom degree mechanism module 6 and the alignment apparatus using the same will be explained.

Figure 5:
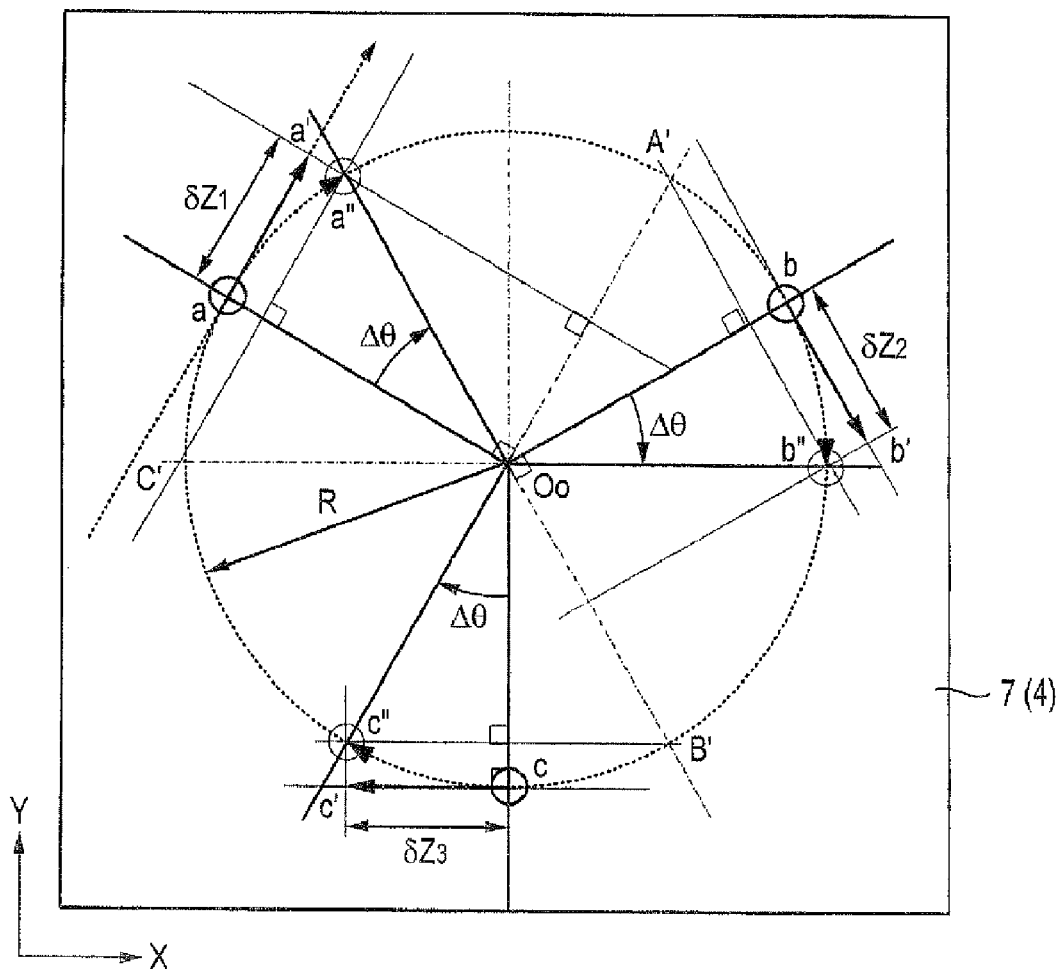
FIG. 5 is a view showing a rotational movement of the alignment apparatus showing the first embodiment of the invention.

FIG. 5 is a view showing a rotational movement of the table of the alignment apparatus showing the first embodiment.

In FIG. 5, notation Oo designates a center of the table and a rotational center of table, notation R designates a radius of rotation, notation $\delta Zi$ designates a moving distance of the linear motor 1 of the translational drive portion 11 of the translational drive/translational/rotational freedom degree mechanism module 6, notation $\Delta\theta$ designates an angle of rotating the table, notations a, b, c designate initial positions of the linear motors 1 of the translational drive portions 11 of the translational/rotational freedom degree mechanism modules 6, notations a', b', c' designate positions after moving the linear motors 1 of the translational drive portions 11 of the translational/rotational freedom degree mechanism modules 6 in moving by $\delta Zi$, notations a", b", c" designate positions after moving the rotational freedom degree guide portions 12 of the translational/rotational freedom mechanism modules 6.

When the linear motors (1a, 1b, 1c) of the translational drive portions 11 (11a, 11b, 11c) of the translational/rotational freedom mechanism modules 6 (6a, 6b, 6c) are advanced by the same amount, the linear motor 1a is moved from the initial position a to a', the linear motor 1b is moved from the initial position b to b', the linear motor 1c is moved from the initial position c to c'.

Although upper ends and lower ends of the translational drive/translational/rotational freedom degree mechanism modules 6 (6a, 6b, 6c) are fixed to the table 4 and the machine base portion 7, the translational drive/rotational freedom degree mechanism modules 6 are provided with the translational freedom degree and the rotational freedom degree by the translational freedom degree guide portions 13 (13a, 13b, 13c) and the rotational freedom degree guide portions 12 (12a, 12b, 12c). Therefore, the translational freedom degree guide portion 13a having an orthogonal relationship of the translational drive/translational/rotational freedom degree mechanism module 6a is operated with the linear motors 1b, 1c of other axes, and therefore, the linear movement guide 21 is moved, and also the rotational freedom degree guide portion 12a is rotated.

Similarly, the linear movement guide 21 of the translational freedom degree guide portion 13b is moved and the rotational freedom degree guide portion 12b is also rotated. The linear movement guide 21 of the translational freedom degree guide portion 13c is moved and the rotational freedom degree guide portion 12c is also rotated. Therefore, the table 4 carries out a rotational movement.

The rotational freedom degree guide portions 12 (12a, 12b, 12c) are constituted above the translational freedom degree guide portions 13 (13a, 13b, 13c). Therefore, the rotational freedom degree guide portions 12 (12a, 12b, 12c) are moved on radii from a rotational center of the rotational movement (a", b", c").

The translational drive/translational/rotational freedom degree mechanism modules 6 (6a, 6b, 6c) are arranged uniformly and symmetrically relative to a center of the table, and therefore, when the linear motors 1 (1a, 1b, 1c) of the translational drive portions 11 of the respective translational drive/translational/rotational freedom degree mechanism modules 6 (6a, 6b, 6c) are advanced by the same amount, the table 4 is rotated to move relative to the center of the table.

Further, ranges of moving the linear motors 1 (1a, 1b, 1c) are limited, and therefore, the table 4 cannot be moved by a large rotational angle.

Further, a relationship between the rotational angle $\Delta\theta$ of the table 4 constituting the rotational center of the center of the table and the moving distance $\delta zi$ of the linear motor 1 (1a, 1b, 1c) of the translational drive portions 11 (11a, 11b, 11c) is as shown by FIG. 4.

That is, initial arrangement positions of the rotational drive/translational/rotational freedom degree mechanism modules 6 (6a, 6b, 6c) are already known, and therefore, when the rotational angle $\Delta\theta$ of the table 4 is determined, the moving distances $\delta zi$ of the linear motors 1 (1a, 1b, 1c) of the translational drive portions 11 (11a, 11b, 11c) are calculated.

Here, although the rotational center is constituted by the center of the table 4, even when the rotational center is constituted by any positions, similarly, the moving distances $\delta zi$ of the linear motors 1 (1a, 1b, 1c) of the respective translational drive/translational/rotational freedom degree mechanism modules 6 (6a, 6b, 6c) are determined from a position of the rotational center and the rotational angle.

Therefore, the relationship between the rotational angle of the table 4 and the moving distances δzi of the linear motors 1 (1a, 1b, 1c) of the respective translational drive/translational/rotational freedom degree mechanism modules 6 (6a, 6b, 6c) is determined geometrically, when the intrusting portion 8 instructs the moving distances, the respective controllers 3 can drive the linear motor 1 by the moving distances δzi.

Figure 6:
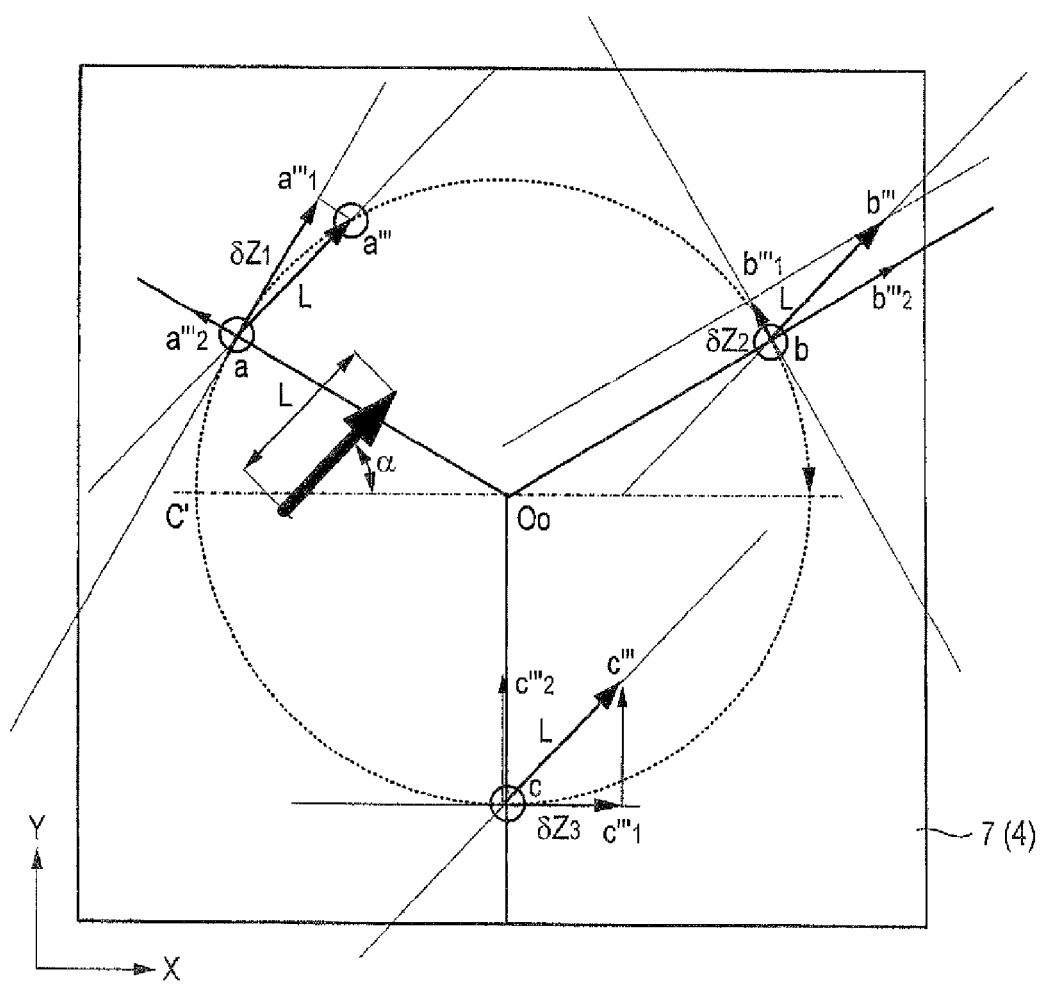
FIG. 6 is a view showing a translational movement of the table of the alignment apparatus showing the first embodiment of the invention.

FIG. 6 is a view showing a translational movement of the table of the alignment apparatus showing a first embodiment of the invention.

In FIG. 6, notation L designates a translational moving distance of the table 4, notation α designates an angle made by a translational moving direction of the table 4, notation δZi designates a moving distance of the linear motor 1 of the translational drive portion 11 of the translational drive/translational/rotational freedom degree mechanism module 6, notations a, b, c designate initial positions of the linear motors 1 of the translational drive portions 11 of the translational/rotational freedom degree mechanism modules 6, notations a'''1, b'''1, c'''1 designate positions after moving linear motors 1 of the translational drive portions 11 of the translational/rotational freedom degree mechanism modules 6 in moving by δZi, notation a''', b''', c''' designate positions after moving the rotational freedom degree guide portions 12 of the translational/rotational freedom degree mechanism modules 6.

Also when the table 4 is translationally moved, the translational moving distance and the direction of the table 4, and respective moving distances δzi of the linear motors 1 (1a, 1b, 1c) of the translational drive/rotational freedom degree mechanism modules 6 (6a, 6b, 6c) can geometrically be determined.

As shown by FIG. 6, when the linear motor 1a is moved from the initial position a to a'''$_1$, the linear motor 1b is moved from the initial positions b to b'''$_1$, the linear motor 1c is moved from the initial positions c to c'''$_1$, the table 4 is translationally moved.

An amount of translationally operating the table 4 is equal to an amount synthesized with a component in a direction of driving the linear motor 1a: from a to a'''$_1$, and a component of moving the linear movement guide 21 of the translational freedom degree guide portion 13a: from a'''$_1$ to a'''. Similarly, an amount of translationally operating the table 4 is equal to an amount synthesized with a component in a direction of driving the linear motor 1b: from b to b'''$_1$, and a component of moving the linear movement guide 21 of the translational freedom degree guide portion 13b: from b'''$_1$ to b''', and an amount synthesized with a component in a direction of driving the linear motor 1c: from c to c'''$_1$ and a component of moving the linear movement guide 21 of the translational freedom degree guide portion 13c: from c'''$_1$ to c'''.

The translational freedom degree guide portion 13a is moved to a''' by operation of the linear motors 1b and 1c. Similarly, the translational freedom degree guide portions 13b, 13c are moved to b''' by operation of the linear motors 1a, 1b, 1c.

Further, a force in a rotational direction is not exerted to the table, and therefore, the rotational freedom degree guide portions 12 (12a, 12b, 12c) are not operated.

As described above, the table 4 can rotationally and translationally be moved using a plurality of the translational drive/translational/rotational freedom degree mechanism modules 6.

Next, a series of operation of the first embodiment of the invention will be explained.

When the object member 5 is placed on the table 4 of the alignment apparatus and operation of working or the like is carried out, it is necessary to arrange the object member 5 in conformity with a working side, and therefore, it is necessary to compensate the position of the object member 5 by moving the table 4 on a plane.

Figure 7A:
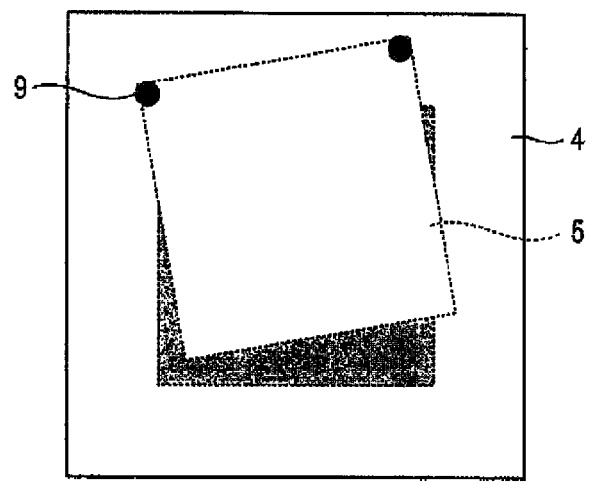
FIGS. 7A to 7B illustrate a view of arranging an object member by a two-dimensional position sensor of the alignment apparatus showing the first embodiment of the invention and a view showing a position compensating method.
Figure 7B:
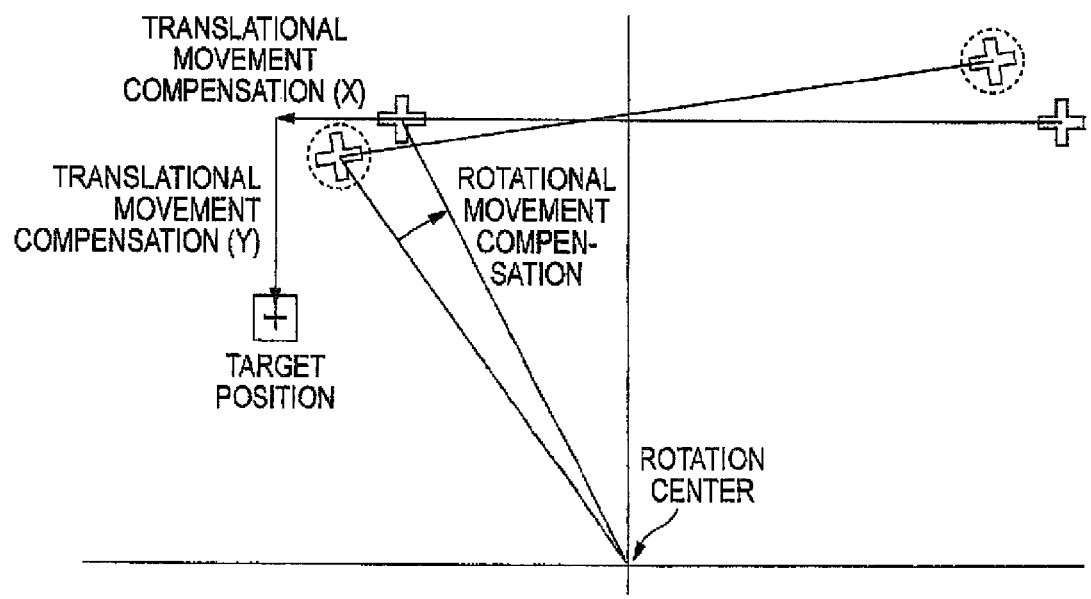

FIGS. 7A and 7B illustrate explanatory views of the alignment apparatus showing the first embodiment of the invention, FIG. 7A shows a view of arranging the object member by the two-dimensional position sensor, FIG. 7B is a view showing a method of compensating the position.

As shown by FIG. 7A, an arrangement of the object member 5 placed on the table 4 can be recognized as the image by the two-dimensional position sensor 9.

When a mark previously described on the object member 5 or a characteristic of the object member 5 can be recognized as shown by FIG. 7B, the calculating portion of compensation value 10 can recognize a rotational angle and a translational moving distance from a rotational center of table from an inclination thereof.

When the calculating portion of compensation value 10 calculates a compensation angle Φ, the moving distance L, as shown by FIG. 5, FIG. 6, the calculating portion 15 can know the moving distances of the linear motors 1 of the translational drive portions 11 of the respective translational drive/translational/rotational freedom degree mechanism modules 6 geometrically, and therefore, the moving distances of respective axes are outputted to the reference generator portion 8. The reference generator portion 8 instructs the moving distances δzi to the respective controllers 3. The respective controllers 3 drive the respective linear motors 1 to execute the moving distances δzi, and therefore, the translational drive/translational/rotational freedom degree mechanism modules 6 are operated, the table 4 is moved, and the position of the object member 5 can be compensated.

After finishing to compensate the position of the object member 5, in working the object member 5 on the table 4, when an external force is exerted, there is a possibility of moving the table 4 in accordance with the external force since there are present the rotational freedom degree guide portion 12 of the translational freedom degree and the translational freedom degree guide portion 13 of the rotational freedom degree which are not held by the control system at the translational drive/translational/rotational freedom degree mechanism module 6. In this case, the arrangement of the object member 5 on the table 4 can be recognized by the two-dimensional position sensor 9. Therefore, again, based on the image of the two-dimensional position sensor 9, the calculating portion of compensation value 10 calculates the compensation value of the table 4, and the compensation can be carried out as described above.

Further, although according to the embodiment, as shown by FIGS. 3A to 3C, the respective translational drive/translational/rotational freedom degree mechanism modules 6 are arranged, other mode may be used.

Figure 8:
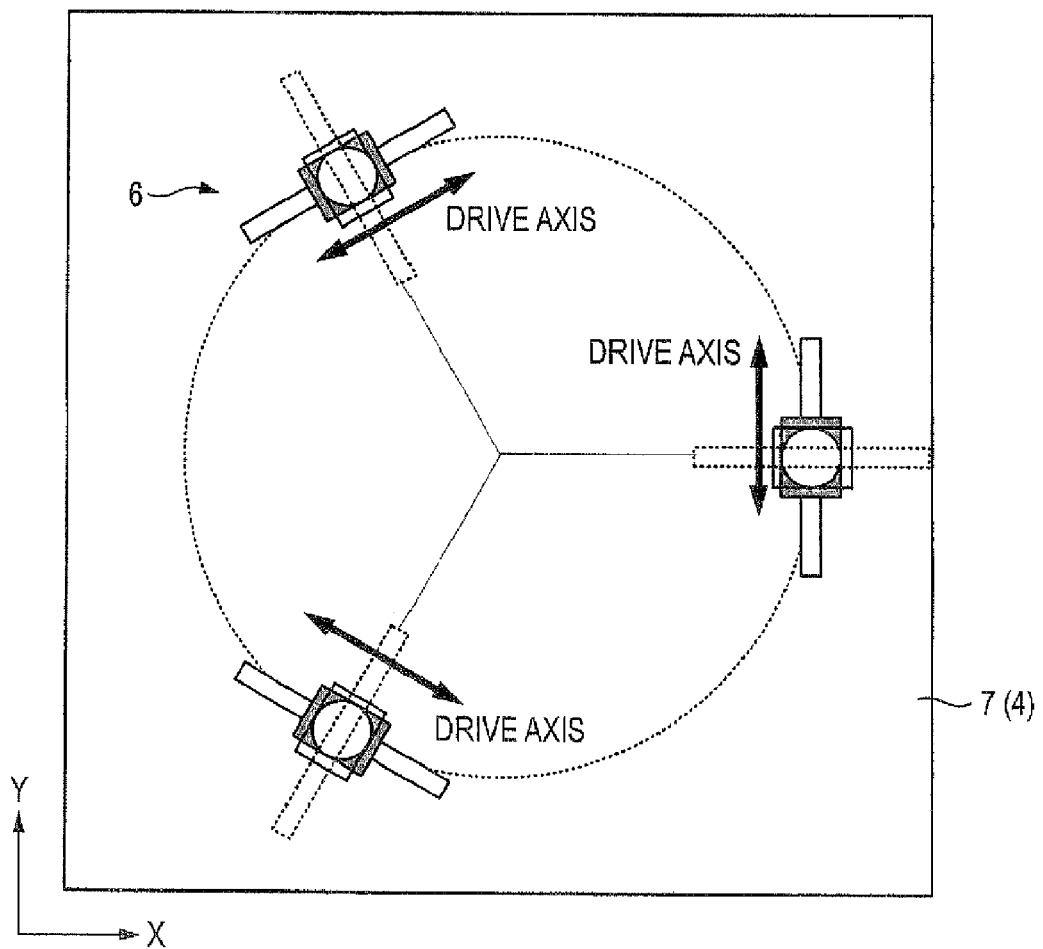
FIG. 8 illustrates a top view of the alignment apparatus showing the first embodiment of the invention and a view showing arrangement example 2 of the translational drive/translational/rotational freedom degree mechanism module.

FIG. 8 illustrates a top view of the alignment apparatus showing the first embodiment of the invention and a view showing arrangement example 2 of the translational drive/translational/rotational freedom degree mechanism module 6.

Figure 9:
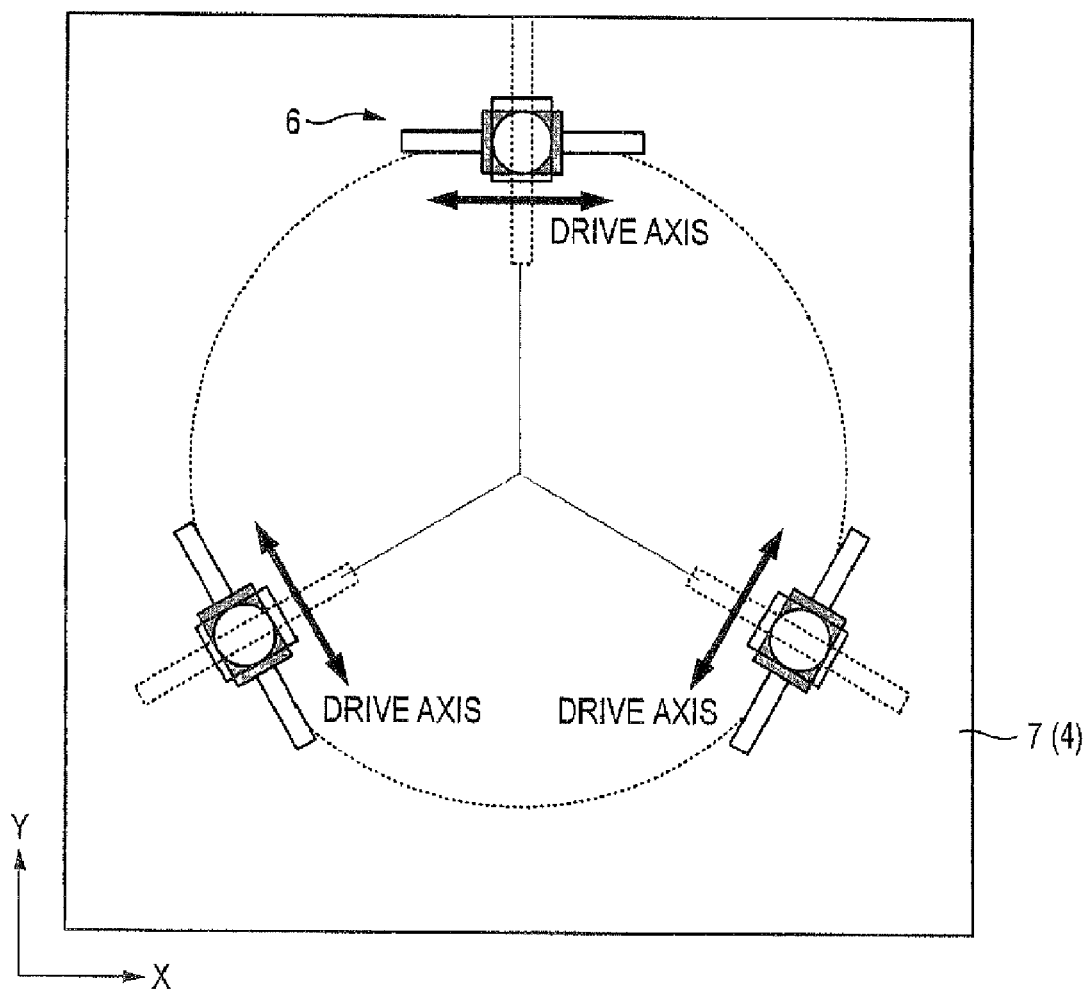
FIG. 9 illustrates a top view of the alignment apparatus showing the first embodiment of the invention and a view showing arrangement example 3 of the translational drive/translational/rotational freedom degree mechanism module.

FIG. 9 illustrates a top view of the alignment apparatus showing the first embodiment of the invention and a view showing arrangement example 3 of the translational drive/translational/rotational freedom degree mechanism module 6.

Arrangement of rotating the arrangement of FIGS. 3A to 3C right-handedly centering on the table by 90 degrees may be used, and an arrangement of rotating the arrangement of FIG. 3A to 3C right-handedly centering the table by 180 degrees may be used. Further, although not illustrated, an arrangement of rotating the arrangement of FIGS. 3A to 3C centering on the table by any angles may be used.

Figure 10:
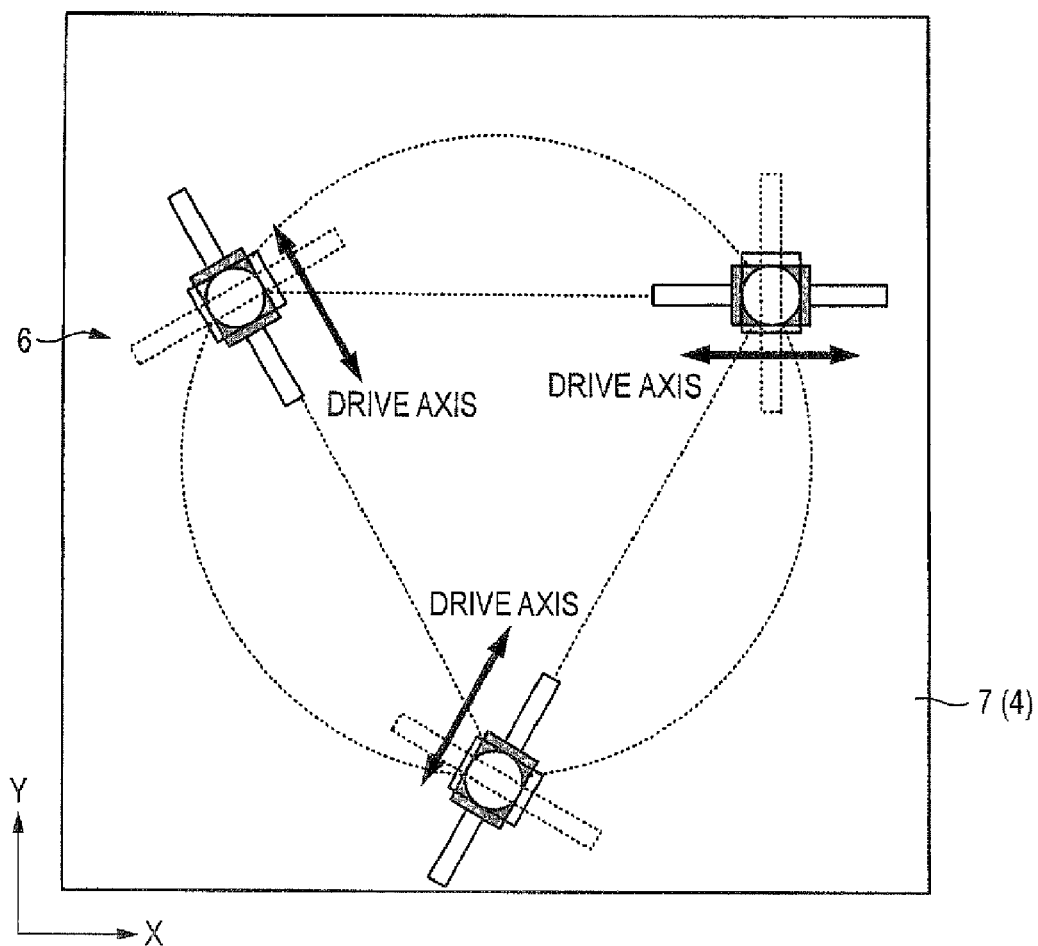
FIG. 10 illustrates a top view of the alignment apparatus showing the first embodiment of the invention and a view showing arrangement example 4 of the translational drive/translational/rotational freedom degree mechanism module.

FIG. 10 illustrates a top view of the alignment apparatus showing the first embodiment of the invention and a view showing arrangement example 4 of the translational drive/translational/rotational freedom degree mechanism module.

Figure 11:
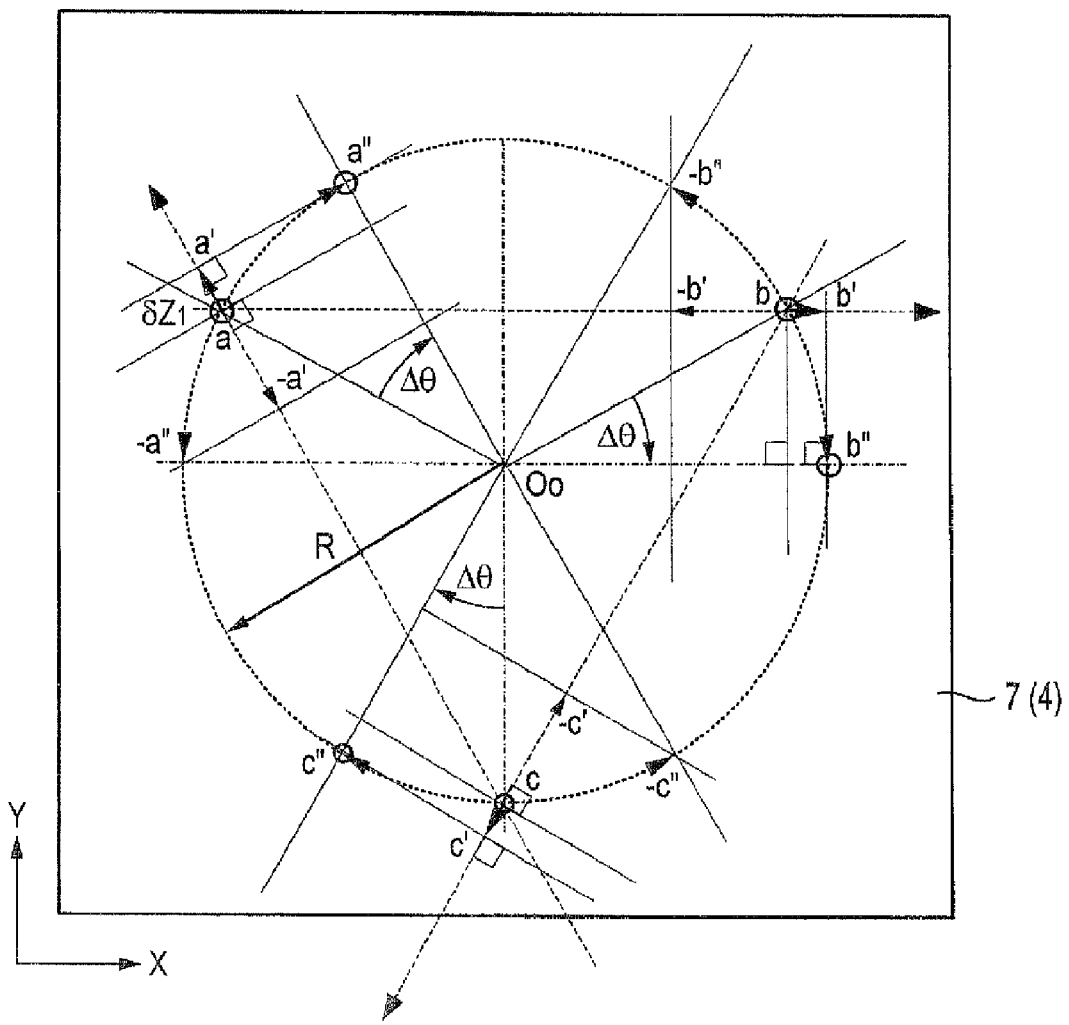
FIG. 11 is a view showing a rotational movement of the table in arrangement example 4 of a translational drive/translational/rotational freedom degree mechanism module of the alignment apparatus showing the first embodiment of the invention.

FIG. 11 is a view showing a rotational movement of the table in arrangement example 4 of the translational drive/translational/rotational freedom degree mechanism module of the alignment apparatus showing the first embodiment of the invention.

When there are three of the translational drive/translational/rotational freedom degree mechanism modules 6, a direction of driving the translational drive portion 11/the linear motor 1 may be arranged to surround a regular triangle.

As shown by FIG. 11, also in this case, similar to FIG. 5, the rotational angle θ of the table 4 and the moving distances δZi of the respective linear motors 1 can geometrically be determined.

When the linear motor 1a is moved from the initial position a to a', the linear motor 1b is moved from the initial position b to b', the linear motor 1c is moved from the initial position c to c', the table 4 is rotationally moved. According thereto, similar to FIG. 5, even when translationally moved centering on any rotational centers of table, similarly, geometrically, the moving distances δZi and the angle of the rotational movement are determined. This is similar also in the translational movement.

Figure 12:
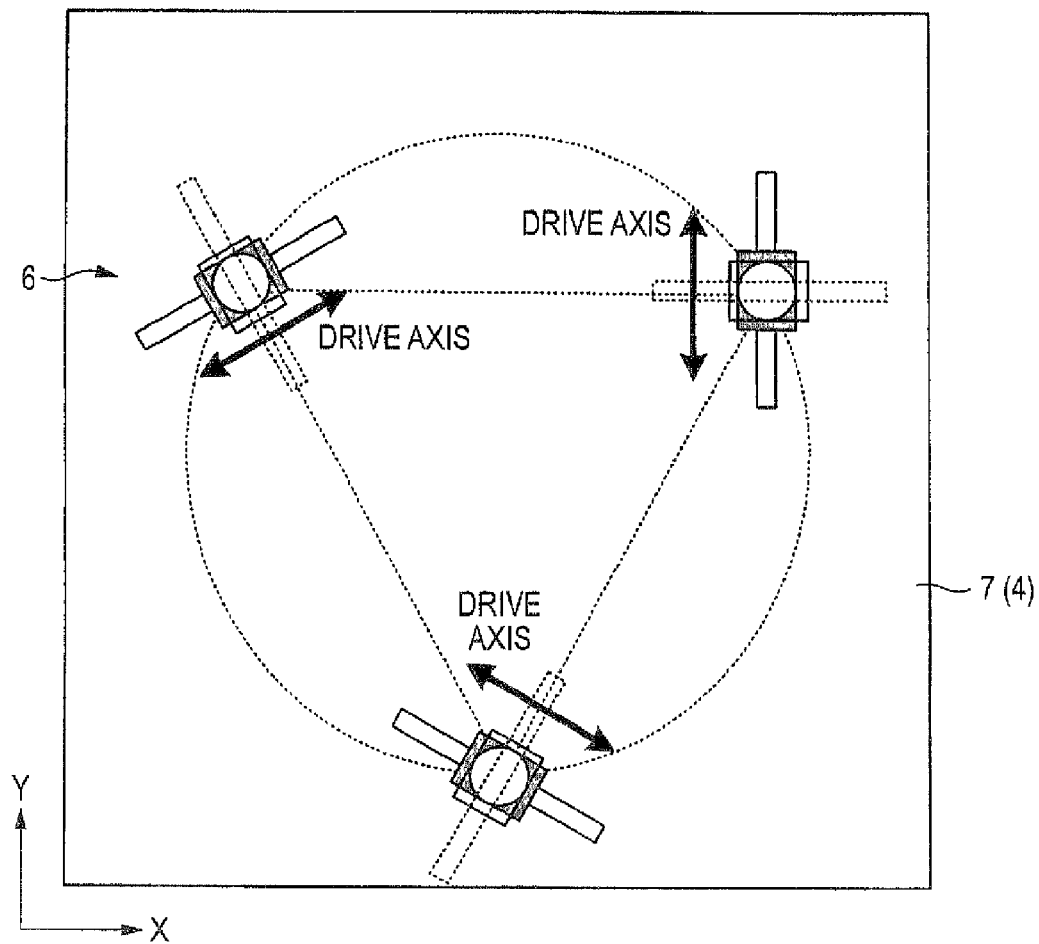
FIG. 12 illustrates a top view of the alignment apparatus showing the first embodiment of the invention and a view showing arrangement example 5 of the translational drive/translational/rotational freedom degree mechanism module.

FIG. 12 illustrates a top view of the alignment apparatus showing the first embodiment of the invention and a view showing arrangement example 5 of the translational drive/translational/rotational freedom degree mechanism module.

Figure 13:
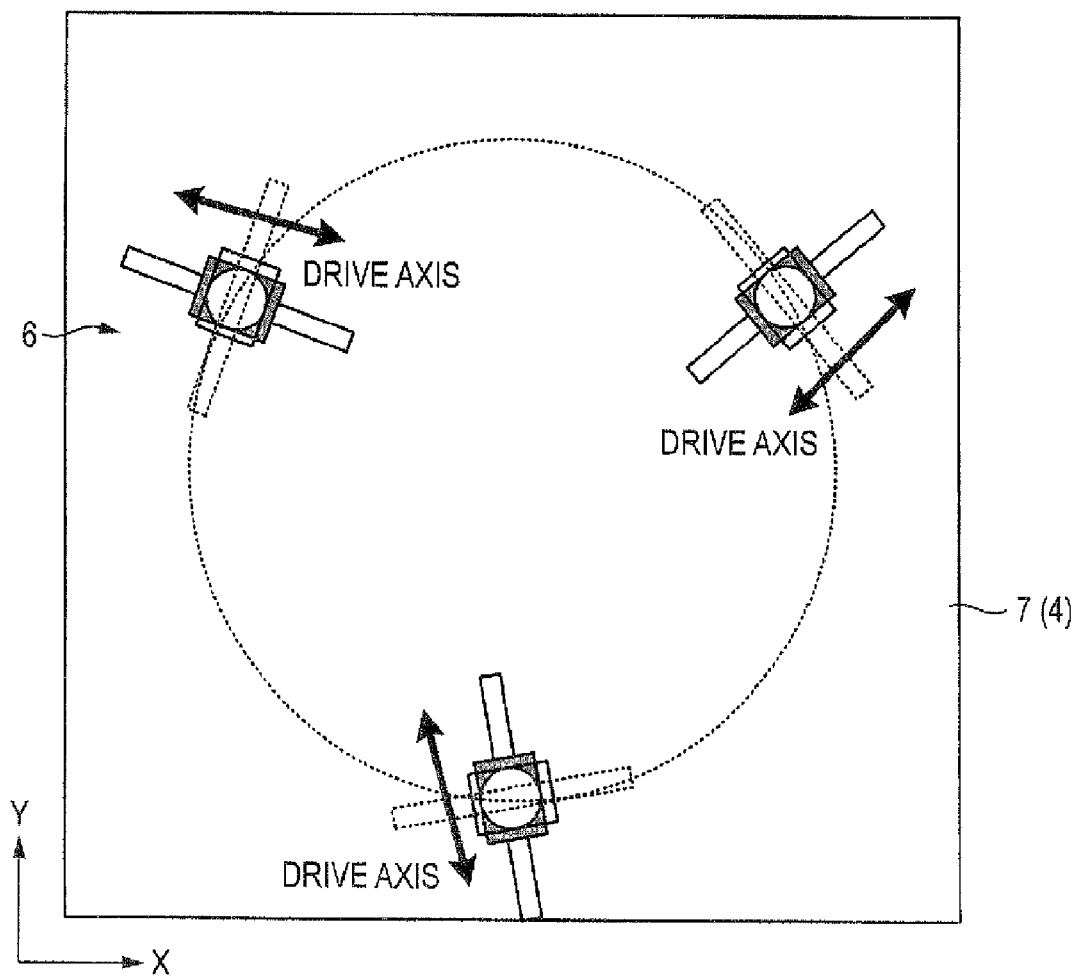
FIG. 13 illustrates a top view of the alignment apparatus showing the first embodiment of the invention and a view showing arrangement example 6 of the translational drive/translational/rotational freedom degree mechanism module.

FIG. 13 illustrates a top view of the alignment apparatus showing the first embodiment of the invention and a view showing arrangement example 6 of the translational drive/translational/rotational freedom degree mechanism module.

As shown by FIG. 12, an arrangement of surrounding the direction of driving the translational drive portion 11/the linear motor 1 by a regular triangle in a direction inverse to that of FIG. 10 may be used.

Further, as shown by FIG. 13, the translational drive/translational/rotational freedom degree mechanism module 6 may be arranged to incline, the module 6 may be arranged such that by a positive/negative operating direction of the linear motor 1, directions of other translational freedom degree guide portion 11 and other rotational freedom degree guide portion 12 may be determined.

Further, although according to the embodiment, 3 of the translational drive/translational/rotational freedom degree mechanism modules 6 are used, the invention is not limited thereto.

Figure 14:
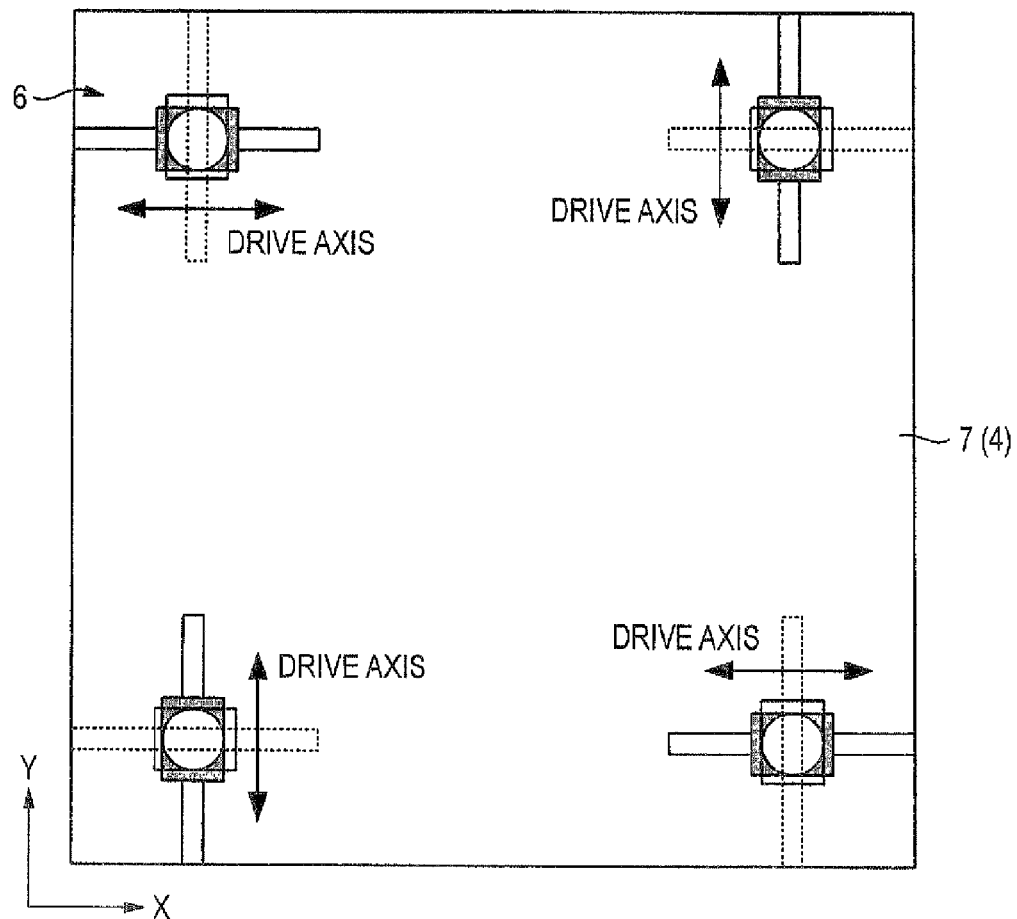
FIG. 14 illustrates a top view of the alignment apparatus showing the first embodiment of the invention and a view showing arrangement example 7 of the translational drive/translational/rotational freedom degree mechanism module.

FIG. 14 illustrates a top view of the alignment apparatus showing the first embodiment of the invention and a view showing arrangement example 7 of the translational drive/translational/rotational freedom degree mechanism module.

Figure 15:
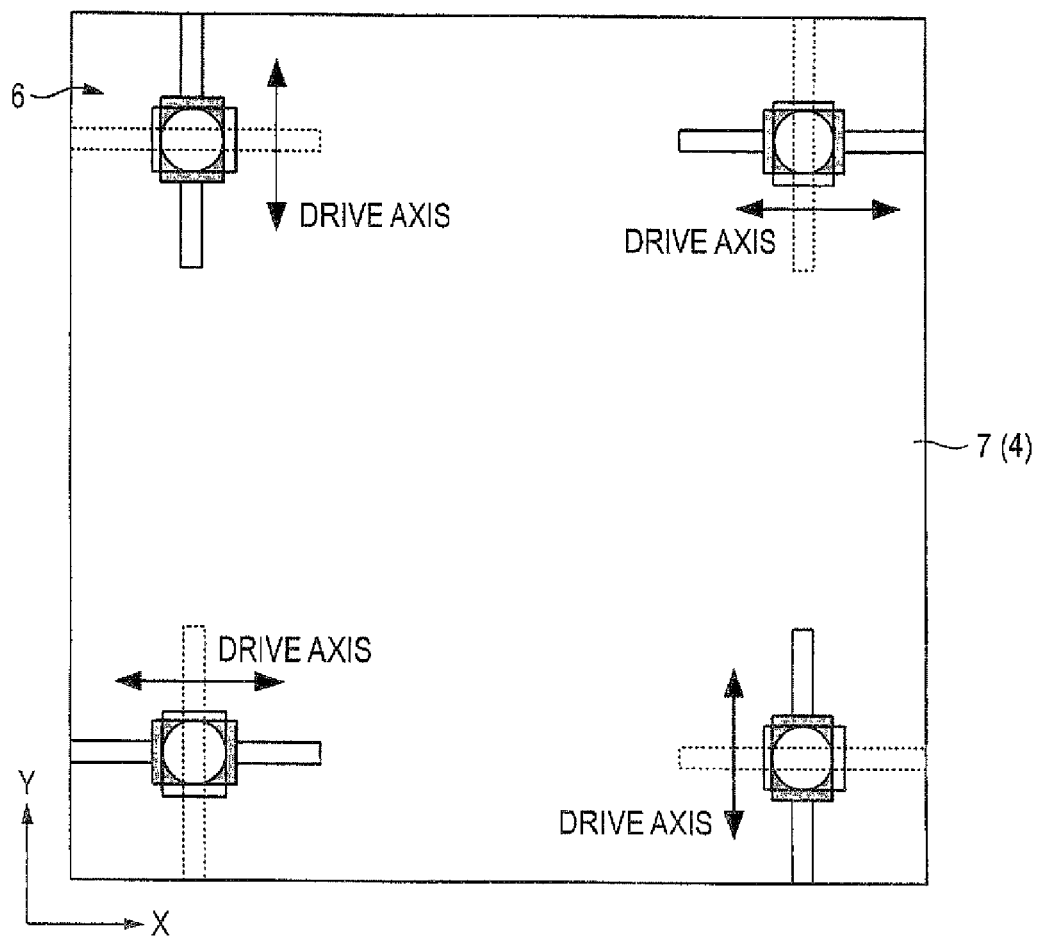
FIG. 15 illustrates a top view of the alignment apparatus showing the first embodiment of the invention and a view showing arrangement example 8 of the translational drive/translational/rotational freedom degree mechanism module.

FIG. 15 illustrates a top view of the alignment apparatus showing the first embodiment of the invention and a view showing arrangement example 8 of the translational drive/translational/rotational freedom degree mechanism module.

Figure 16:
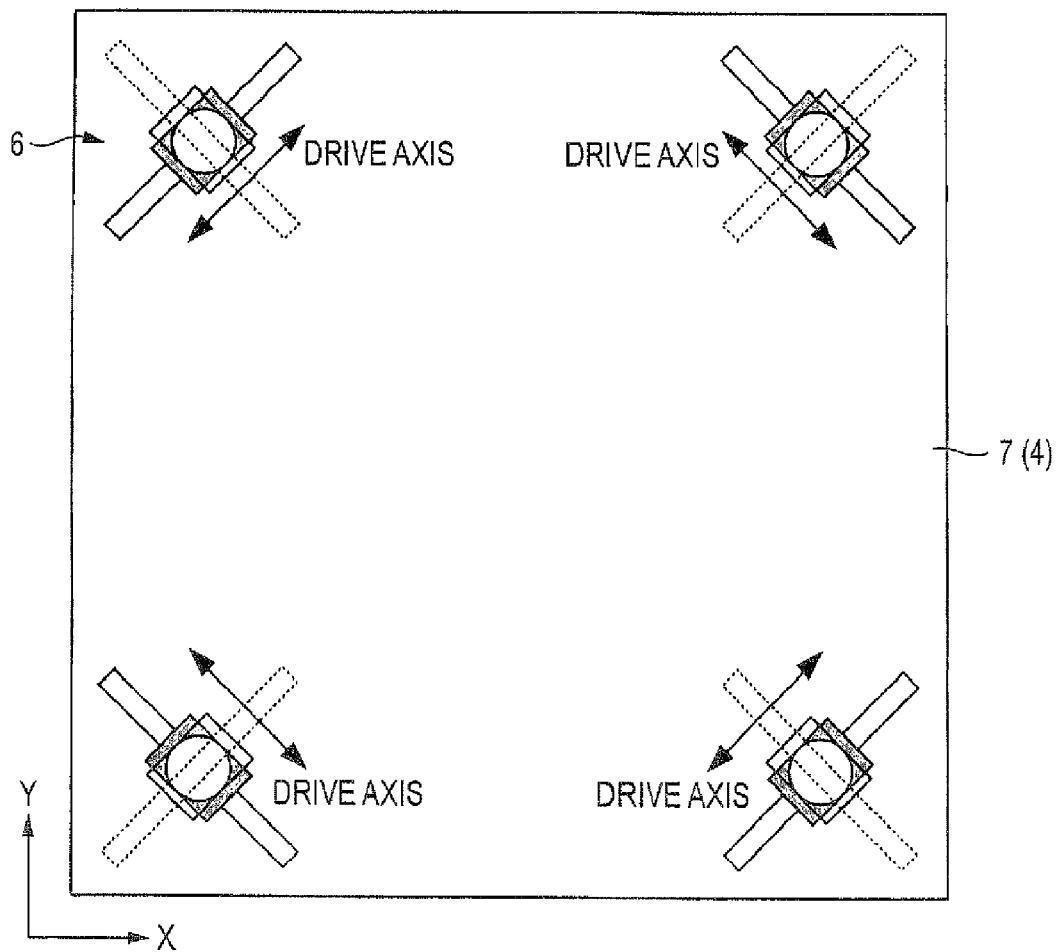
FIG. 16 illustrates a top view of the alignment apparatus showing the first embodiment of the invention and a view showing arrangement example 9 of the translational drive/translational/rotational freedom degree mechanism module.

FIG. 16 illustrates a top view of the alignment apparatus showing the first embodiment of the invention and a view showing arrangement example 9 of the translational drive/translational/rotational freedom degree mechanism module.

Figure 17:
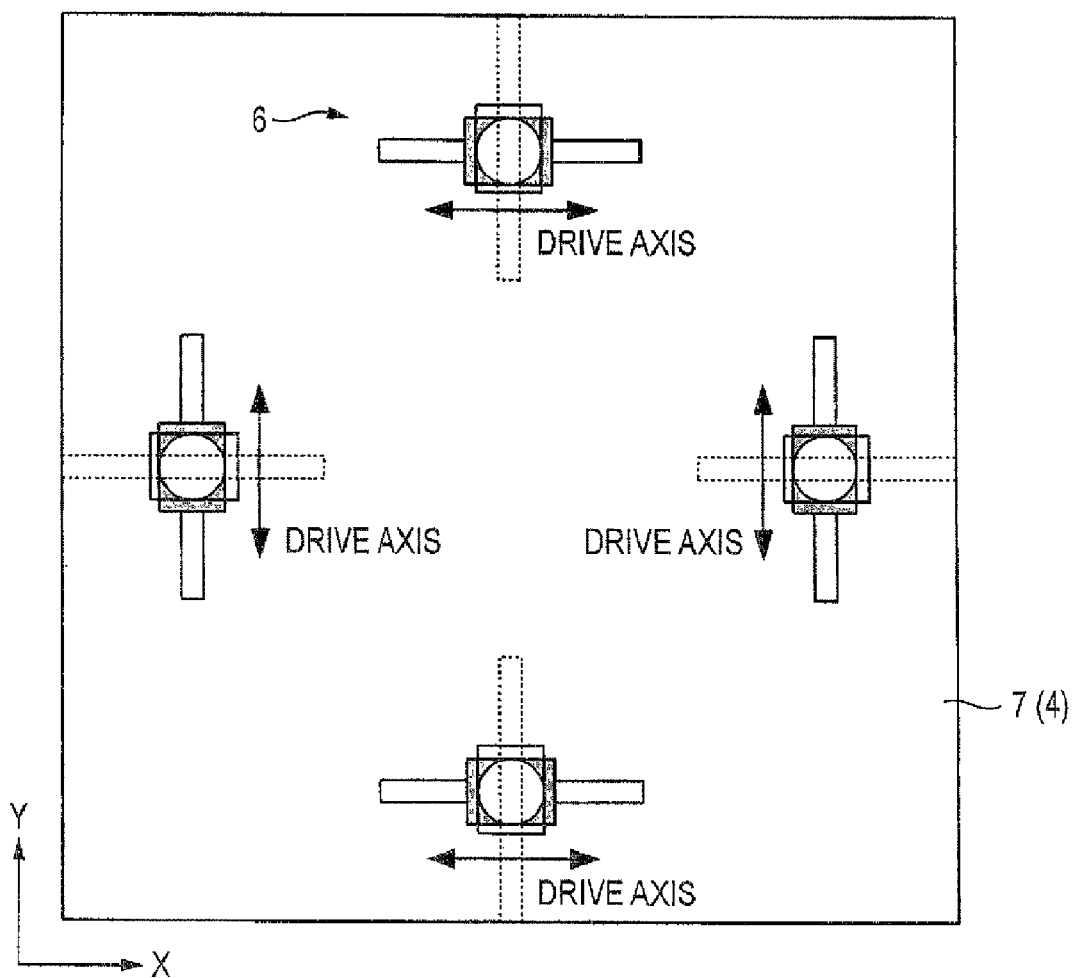
FIG. 17 illustrates a top view of the alignment apparatus showing the first embodiment of the invention and a view showing arrangement example 10 of the translational drive/translational/rotational freedom degree mechanism module.

FIG. 17 illustrates a top view of the alignment apparatus showing the first embodiment of the invention and a view showing arrangement example 10 of the translational drive/translational/rotational freedom degree mechanism module.

As shown by FIG. 14 through 17, the invention may be constituted by arranging 4 of the translational drive/translational/rotational freedom degree mechanism modules 6.

A relationship between the rotational movement or the translational movement of the table and the moving distances of the respective linear motors can geometrically be determined. Further, the modules may be arranged such that by the positive/negative operating direction of the linear motor 1, directions of other translational freedom degree guide portion 11 and other rotational freedom degree guide portion 12 can be determined.

Figure 18:
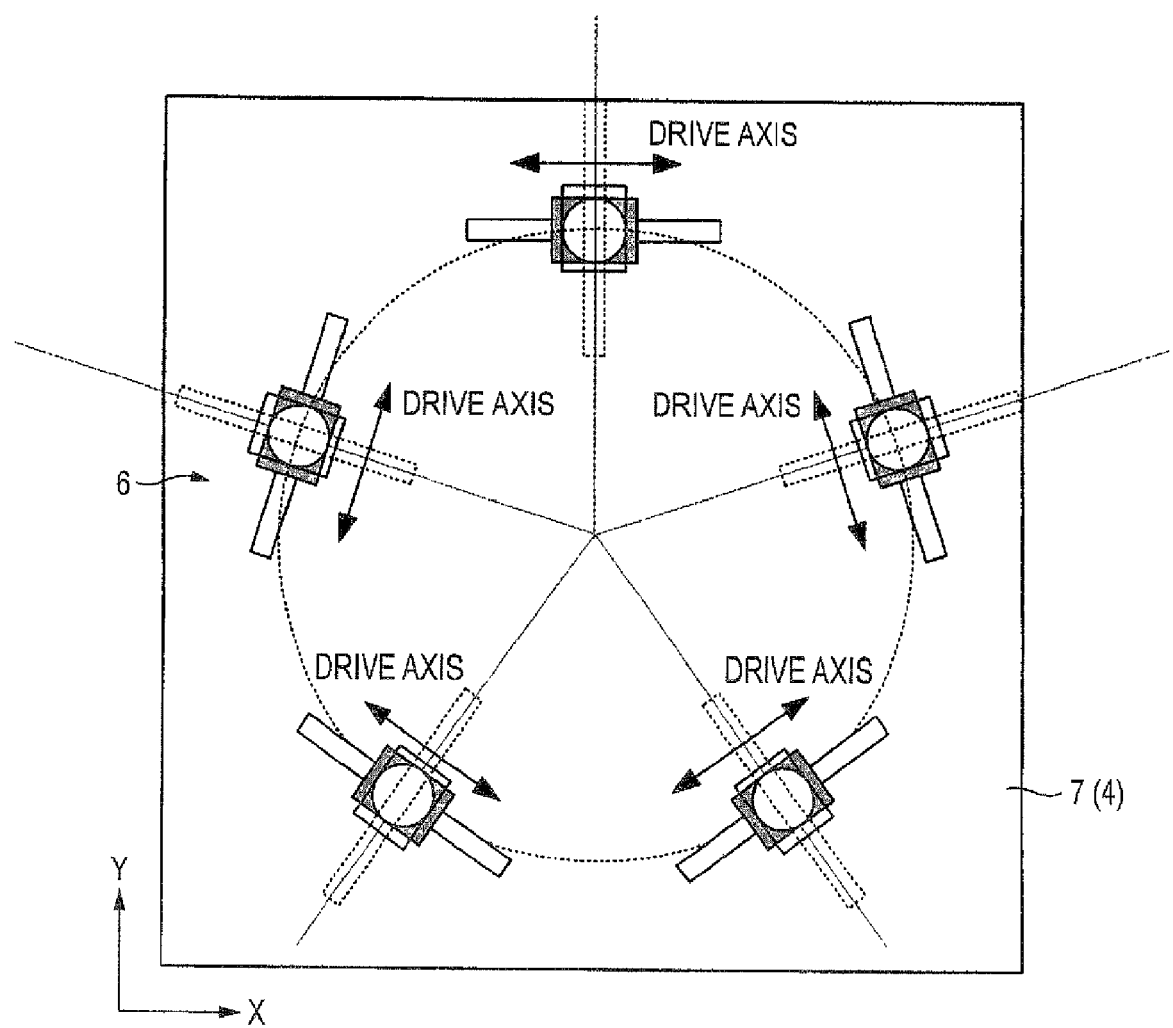
FIG. 18 illustrates a top view of the alignment apparatus showing the first embodiment of the invention and a view showing arrangement example 11 of the translational drive/translational/rotational freedom degree mechanism module.

FIG. 18 illustrates a top view of the alignment apparatus showing the first embodiment of the invention and a view showing arrangement example 11 of the translational drive/translational/rotational freedom degree mechanism module.

Figure 19:
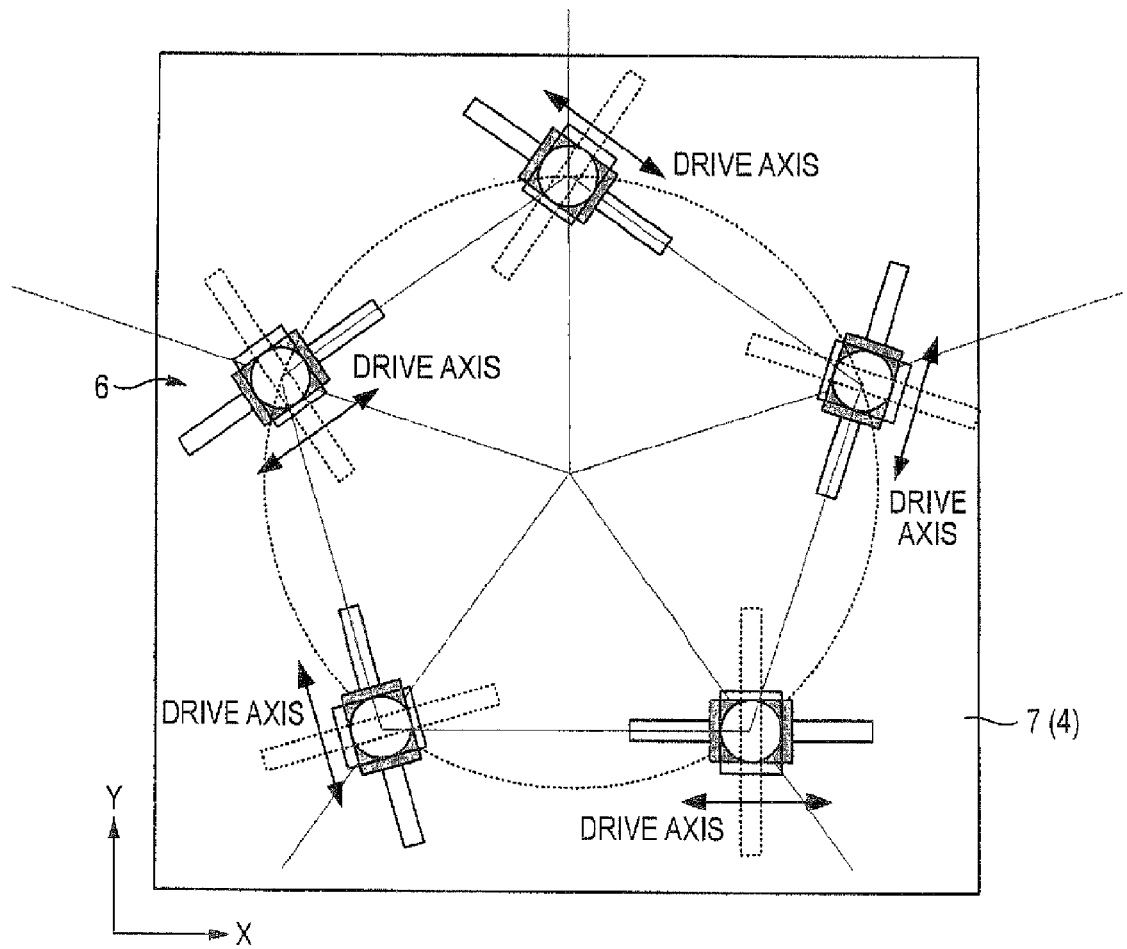
FIG. 19 illustrates a top view of the alignment apparatus showing the first embodiment of the invention and a view showing arrangement example 12 of the translational drive/translational/rotational freedom degree mechanism module.

FIG. 19 illustrates a top view of the alignment apparatus showing the first embodiment of the invention and a view showing arrangement example 12 of the translational drive/translational/rotational freedom degree mechanism module.

Figure 20:
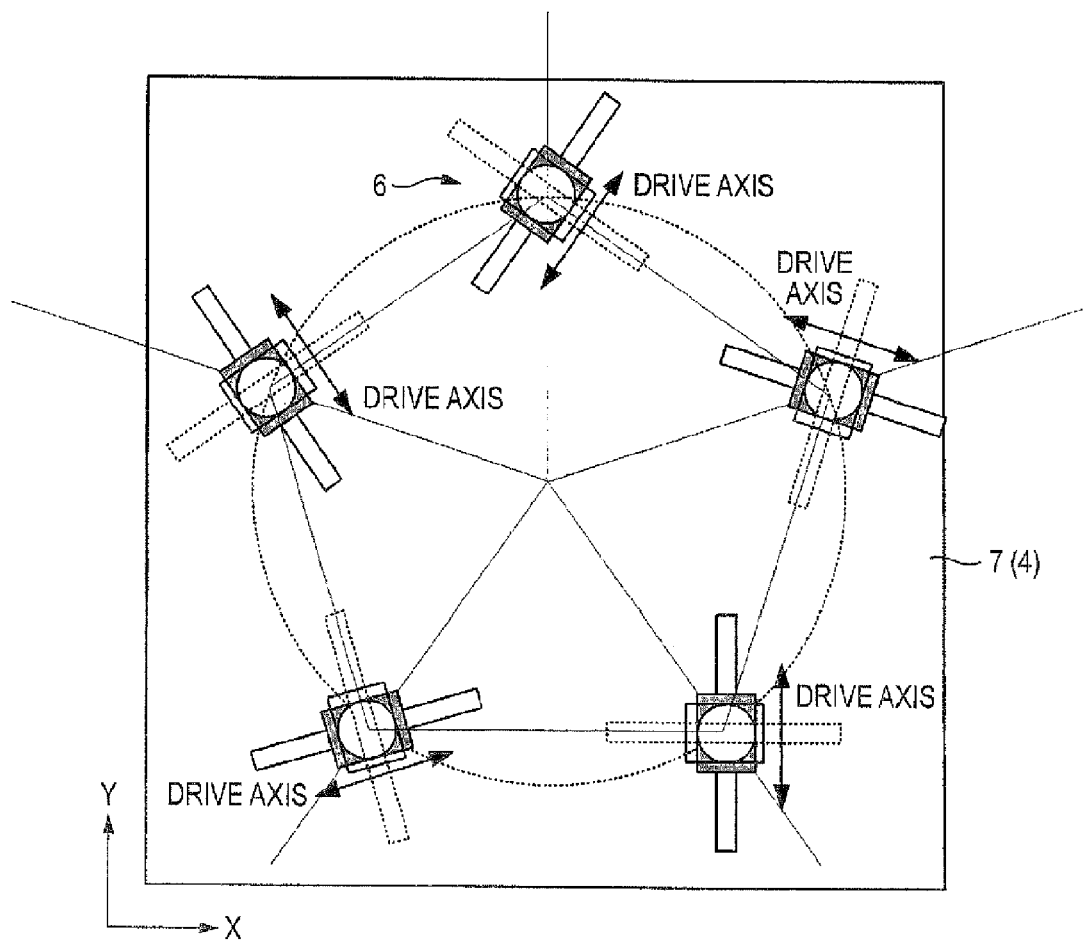
FIG. 20 illustrates a top view of the alignment apparatus showing the first embodiment of the invention and a view showing arrangement example 13 of the translational drive/translational/rotational freedom degree mechanism module.

FIG. 20 illustrates a top view of the alignment apparatus showing the first embodiment of the invention and a view showing arrangement example 13 of the translational drive/translational/rotational freedom degree mechanism module.

Although FIG. 18 through FIG. 20 show examples of arranging 5 of the translational drive/translational/rotational freedom degree mechanism modules 6, similar to the above-described, the relationship between the rotational movement or the translational movement of the table 4 and the moving distances of the respective linear motors 1 can geometrically be determined. Further, the module may be arranged such that by the positive/negative operating direction of the linear motor 1, directions of other translational freedom degree guide portion 11 and the rotational freedom degree guide portion 12 can be determined.

Figure 21:
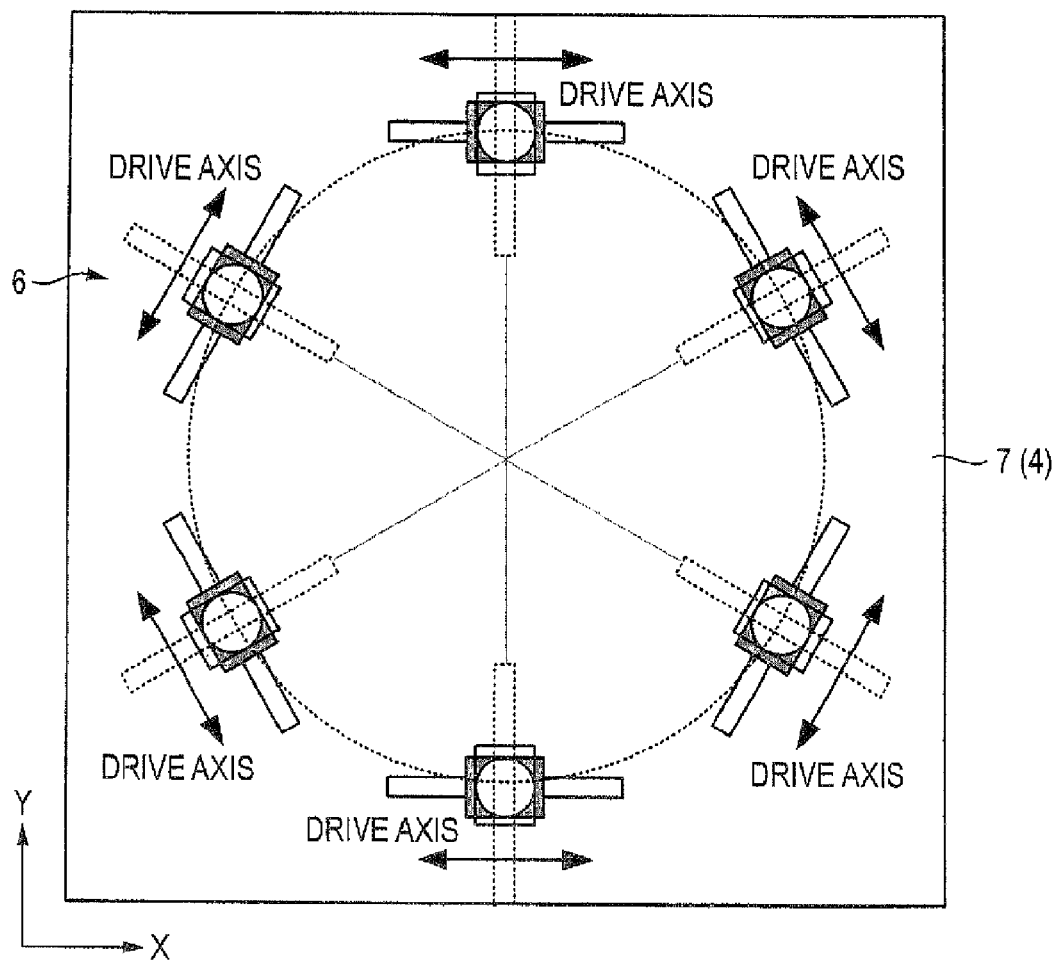
FIG. 21 illustrates a top view of the alignment apparatus showing the first embodiment of the invention and a view showing arrangement example 14 of the translational drive/translational/rotational freedom degree mechanism module.

FIG. 21 illustrates a top view of the alignment apparatus showing the first embodiment of the invention and a view showing arrangement example 14 of the translational drive/translational/rotational freedom degree mechanism module.

Although FIG. 21 shows an example of arranging 6 of the translational drive/translational/rotational freedom degree mechanism modules 6, similarly, the relationship between the rotational movement or the translational movement of the table and the moving distances of the respective linear motors can geometrically be determined. Further, the module may be arranged such that by the positive/negative operating direction of the linear motor 1, directions of other translational freedom degree guide portion 11 and other rotational freedom degree guide portion 12 can be determined.

Further, although not illustrated, 7 of the translational drive/translational/rotational freedom degree mechanism modules 6 may be arranged.

Figure 22:
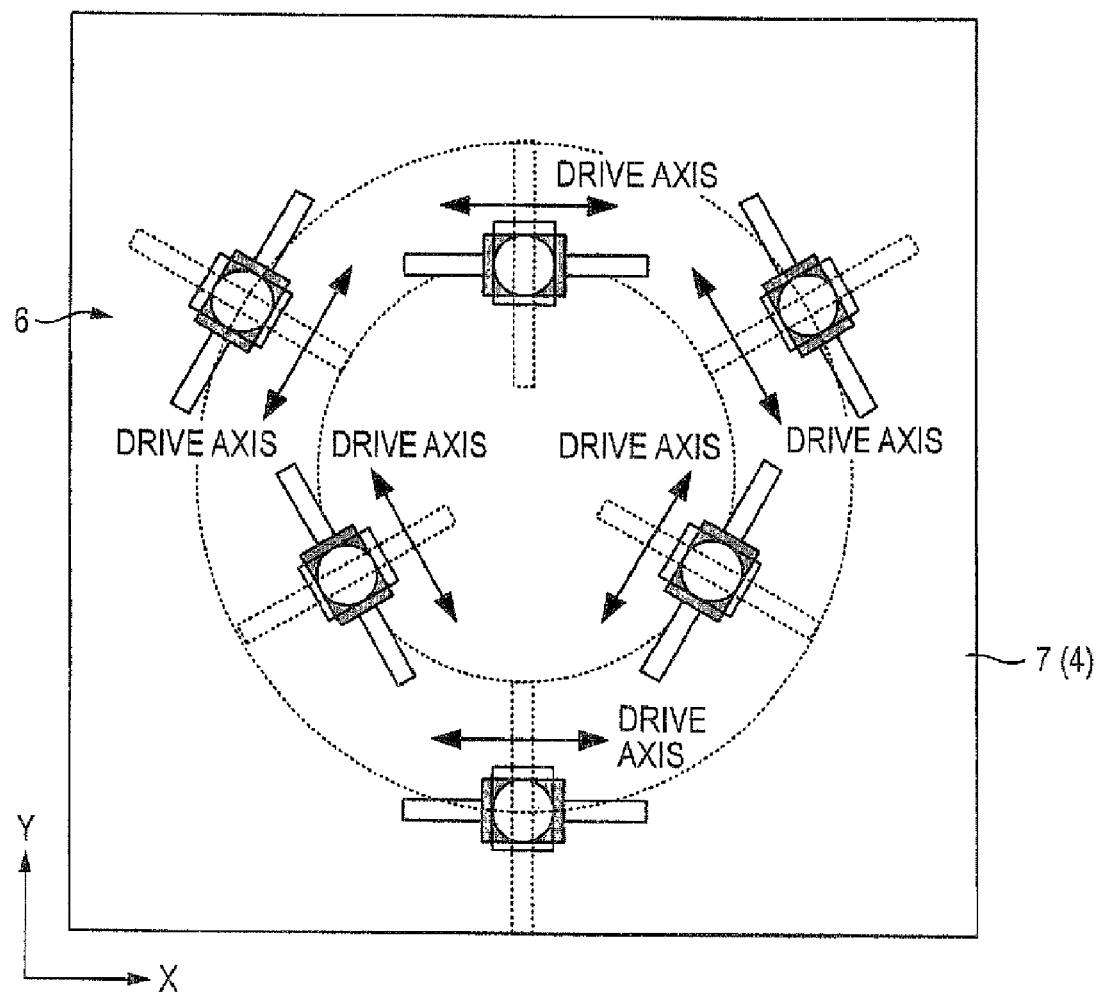
FIG. 22 illustrates a top view of the alignment apparatus showing the first embodiment of the invention and a view showing arrangement example 15 of the translational drive/translational/rotational freedom degree mechanism module.

FIG. 22 illustrates a top view of the alignment apparatus showing the first embodiment of the invention and a view showing arrangement example 15 of the translational drive/translational/rotational freedom degree mechanism module.

Although FIG. 22 shows an example of arranging 6 of the translational drive/translational/rotational freedom degree mechanism modules 6, the example is constituted to constitute 2 kinds of regular triangles from the center of the table 4.

The relationship between the rotational movement or the translational movement of the table and the moving distances of the respective linear motors can geometrically be determined. Further, the module may be arranged such that by the positive/negative operating direction of the linear motor 1, directions of other translational freedom degree guide portion 11 and other rotational freedom degree guide portion 12 can be determined.

Figure 23:
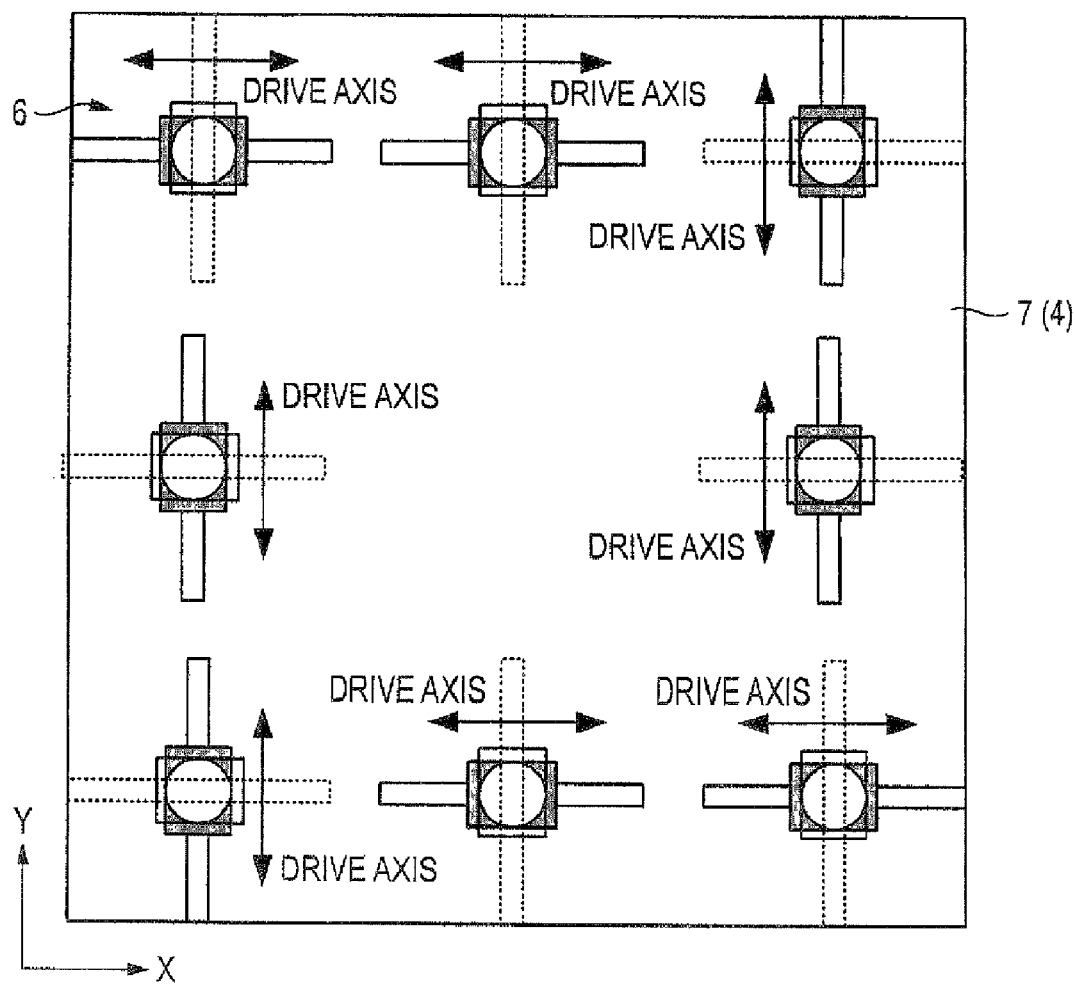
FIG. 23 illustrates a top view of the alignment apparatus showing the first embodiment of the invention and a view showing arrangement example 16 of the translational drive/translational/rotational freedom degree mechanism module.

FIG. 23 illustrates a top view of the alignment apparatus showing the first embodiment of the invention and a view showing arrangement example 16 of the translational drive/translational/rotational freedom degree mechanism module.

Figure 24:
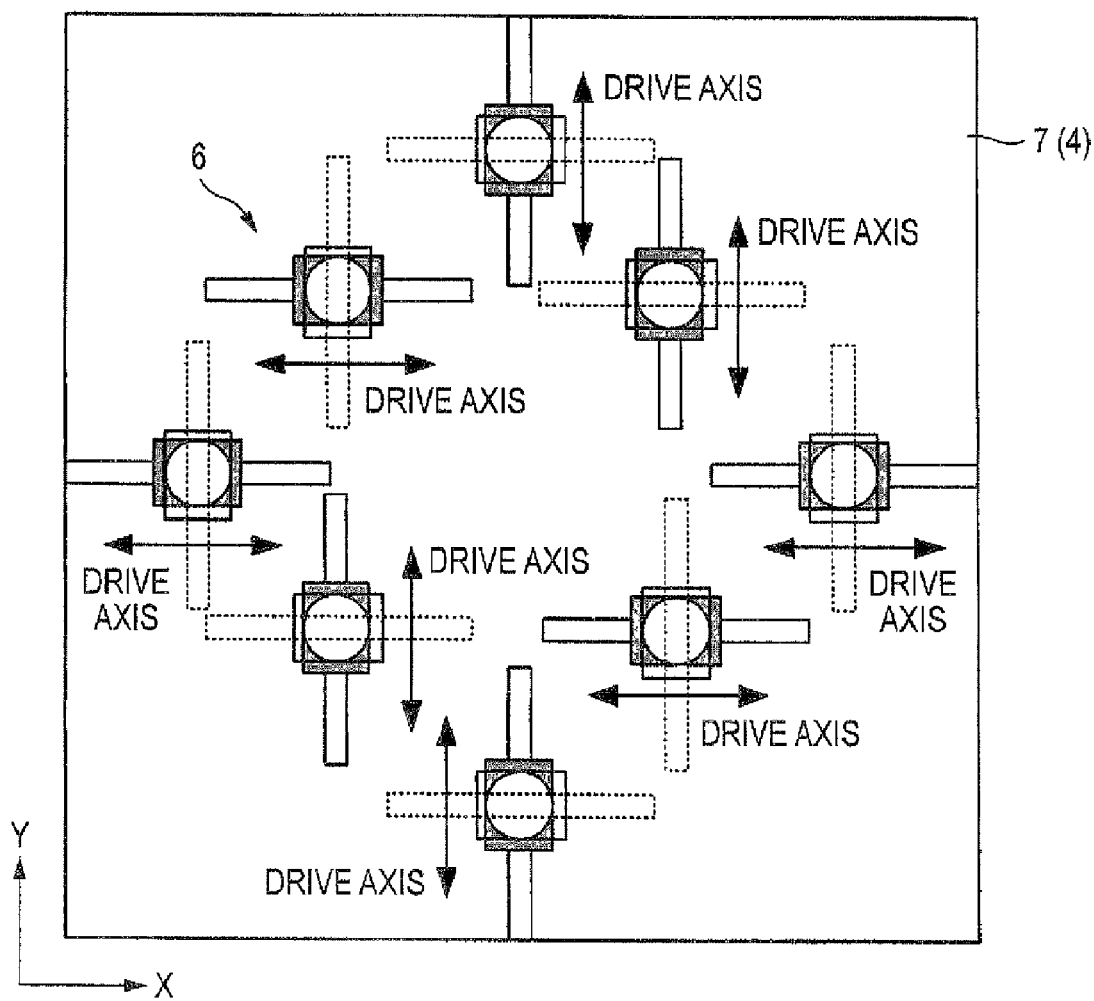
FIG. 24 illustrates a top view of the alignment apparatus showing the first embodiment of the invention and a view showing arrangement example 17 of the translational drive/translational/rotational freedom degree mechanism module.

FIG. 24 illustrates a top view of the alignment apparatus showing the first embodiment of the invention and a view showing arrangement example 17 of the translational drive/translational/rotational freedom degree mechanism module.

Figure 25:
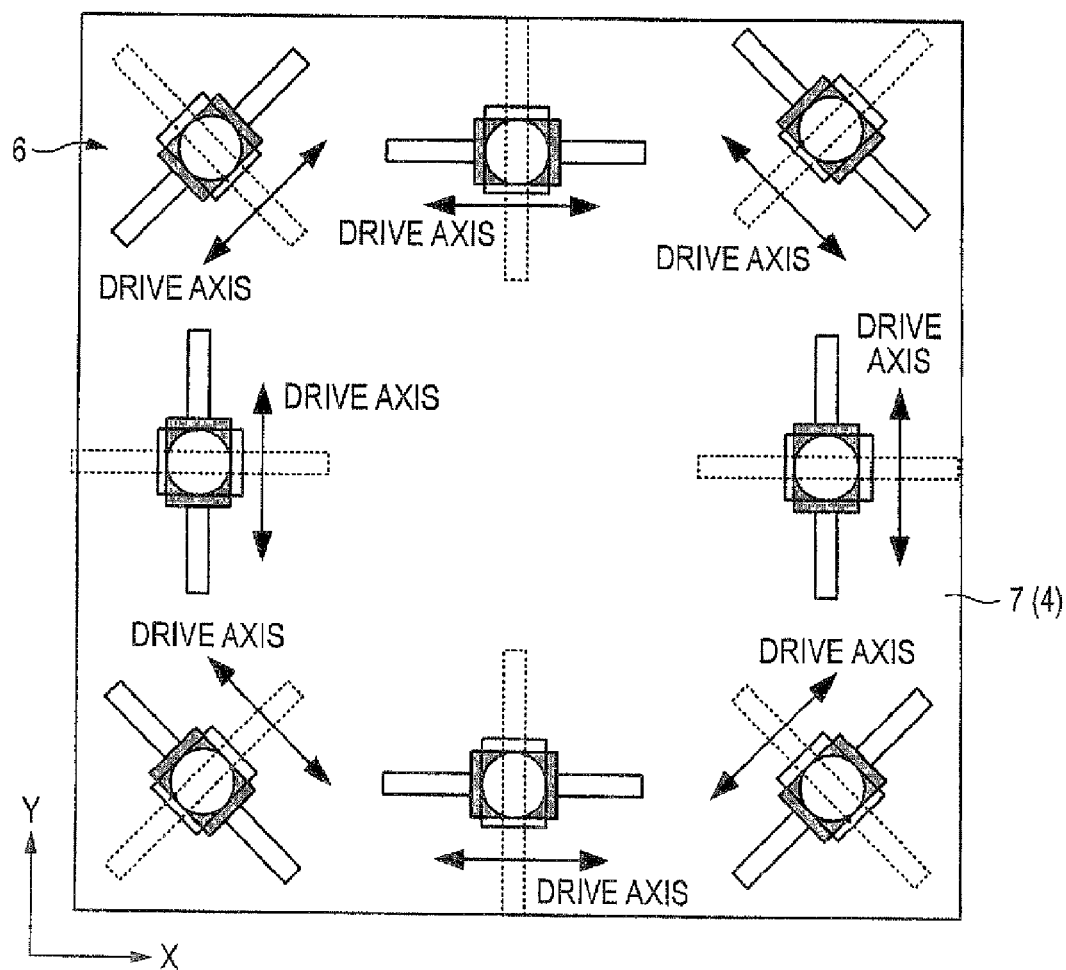
FIG. 25 illustrates a top view of the alignment apparatus showing the first embodiment of the invention and a view showing arrangement example 18 of the translational drive/translational/rotational freedom degree mechanism module.

FIG. 25 illustrates a top view of the alignment apparatus showing the first embodiment of the invention and a view showing arrangement example 18 of the translational drive/translational/rotational freedom degree mechanism module.

Figure 26:
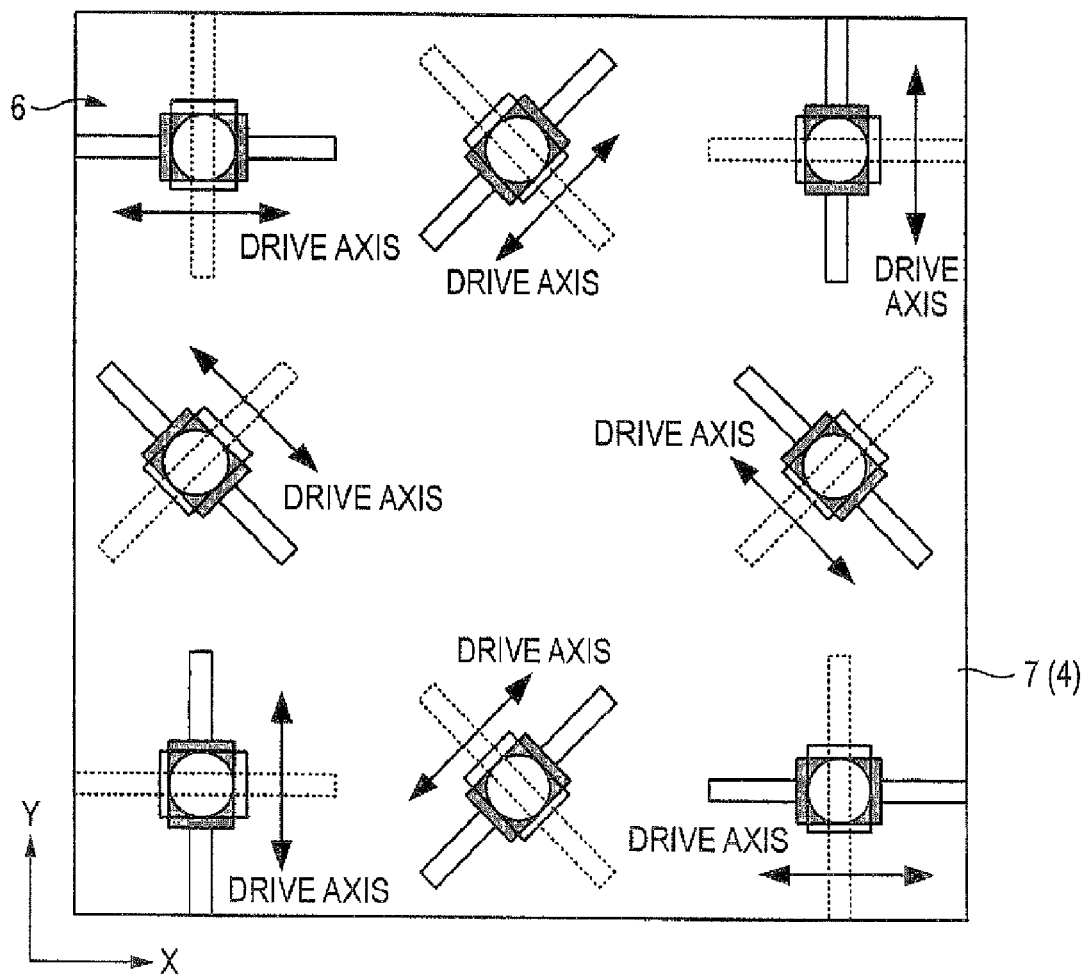
FIG. 26 illustrates a top view of the alignment apparatus showing the first embodiment of the invention and a view showing arrangement example 19 of the translational drive/translational/rotational freedom degree mechanism module.

FIG. 26 illustrates a top view of the alignment apparatus showing the first embodiment of the invention and a view showing arrangement example 19 of the translational drive/translational/rotational freedom degree mechanism module.

Although FIG. 23 through FIG. 26 show examples of arranging 8 of the translational drive/translational/rotational freedom degree mechanism modules 6, similar to the above-described, the relationship between the rotational movement or the translational movement of the table 4 and the moving distances of the respective linear motors can geometrically be determined. Further, as shown by FIG. 22, initial positions of the translational drive/translational/rotational freedom degree mechanism modules 6 may be arranged to constitute a plurality of radii from the center of the table 4, further, may be arranged such that by the positive/negative operating direction of the linear motor 1, directions of other translational freedom degree guide portion 11 and other rotational freedom degree guide portion 12 can be determined.

The invention is not limited to the illustrated examples but the module may be arranged to provide at least 3 of the translational drive/translational/rotational freedom degree mechanism modules and to be able to determine directions of other translational freedom degree guide portion 11 and other rotational freedom degree guide portion 12 by the positive/negative operating direction of the linear motor 1.

The relationship between the rotational movement or the translational movement of the table and the moving distances of the respective linear motors can geometrically be determined.

Thereby, even when the table 4 is large-sized and heavy-loaded, the load can be supported by the translational drive/translational/rotational freedom degree mechanism module 6 with excellent balance, further, the table 4 can carry out the translational movement, or the rotational movement in respective directions with excellent balance.

Embodiment 2

A constitution of the alignment apparatus of a second embodiment of the invention is as follows.

Figure 27:
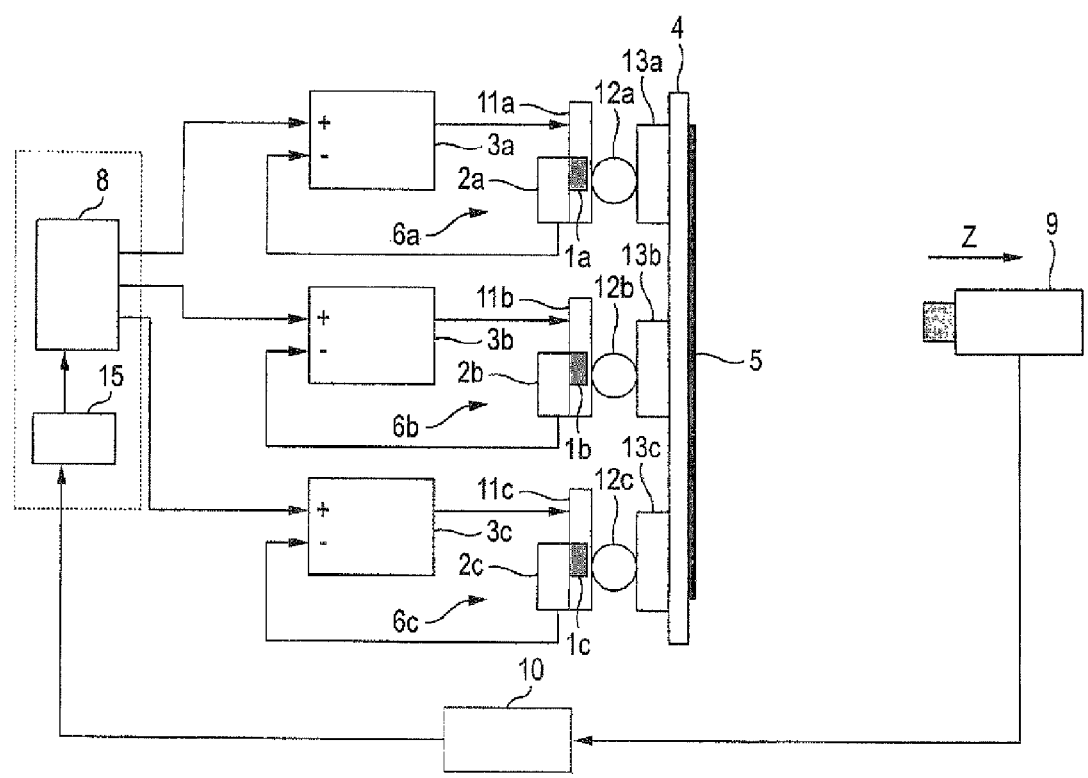
FIG. 27 is a constitution view of the alignment apparatus showing a second embodiment of the invention.

FIG. 27 is a constitution view of the alignment apparatus showing the second embodiment of the invention.

Figure 28C:
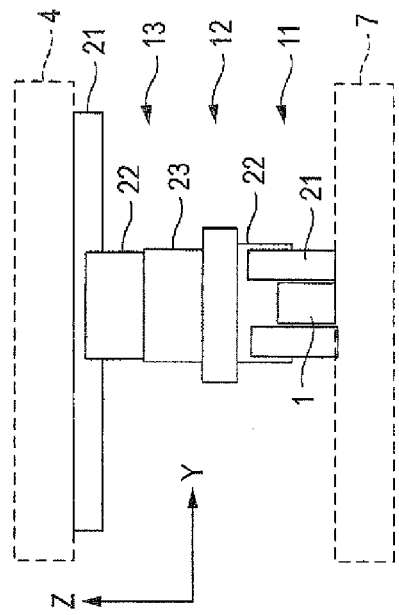
FIGS. 28A to 28C illustrate outline views of a translational drive/translational/rotational freedom degree mechanism module used in the alignment apparatus showing the second embodiment of the invention.
Figure 28A:
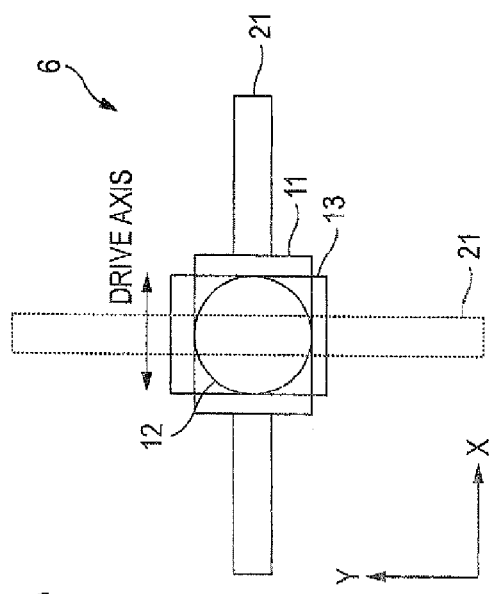
Figure 28B:
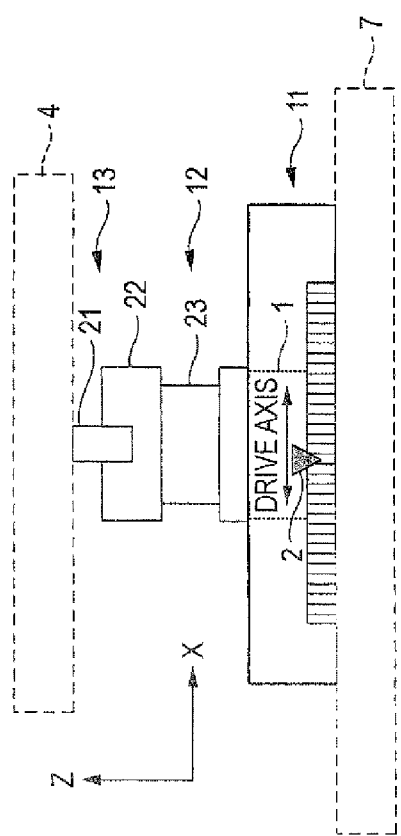

FIGS. 28A to 28C are outline views of the translational drive/translational/rotational freedom degree mechanism module used in an alignment showing the second embodiment of the invention.

In the drawings, numeral 1 (1a, 1b, 1c) designates the linear motor, numeral 2 (2a, 2b, 2c) designates the moving distance detecting portion, numeral 3 (3a, 3b, 3c) designates the controller, numeral 4 designates the table, numeral 5 designates the object member, numeral 6 (6a, 6b, 6c) designates the translational drive/translational/rotational freedom degree mechanism module, numeral 7 designates the machine base portion, numeral 8 designates the reference generator portion, numeral 9 designates the two-dimensional position sensor, numeral 10 designates the calculating portion of compensation value, numeral 11 (11a, 11b, 11c) designates the translational drive portion, numeral 12 (12a, 12b, 12c) designates the rotational freedom degree guide portion, numeral 13 (13a, 13b, 13c) designates the translational freedom degree guide portion, numeral 21 designates the linear movement guide, numeral 22 designates the linear movement guide block, numeral 23 designates the rotating bearing.

An outline of the second embodiment of the invention is the same that of FIG. 1 of the first embodiment, and arrangement of the translational drive/translational/rotational freedom degree mechanism module 6 is the same as that of FIGS. 3A to 3C of the first embodiment.

A portion of the second embodiment of the invention which differs from the first embodiment resides in the constitution of the translational drive/translational/rotational freedom degree mechanism module 6.

As shown by FIGS. 28A to 28C, the translational drive/translational/rotational freedom degree mechanism module 6 comprises the translational drive portion 11 having the linear motor 1, the rotational freedom degree guide portion 12, the translational freedom degree guide portion 13, and is constituted to be provided with the translational freedom degree, the rotational freedom degree, the translational freedom degree in this order between the machine base portion and the table 4.

The order of the rotational freedom degree, the translational freedom degree differs from that of FIG. 4, two the rotational freedom degrees are constituted using by the rotational freedom degree, and therefore, the second embodiment differs from the first embodiment in that an angle made by the translational drive portion 11 and the translational freedom degree guide portion 13 is changed therefrom.

Similar to the first embodiment, by driving the arrangement of the object member 5 detected by the two-dimensional position sensor 9 by the translational drive/translational/rotational freedom degree mechanism modules 6 (6a, 6b, 6c), the table 4 is moved and the position is compensated.

Other than that the constitution of the translational drive/translational/rotational freedom degree mechanism module 6 differs, the function and basic operation are similar to those of the first embodiment.

The constitution of the translational drive/translational/rotational freedom degree mechanism module 6 differs from that of the first embodiment, and therefore, the geometrical relationship between the movement of the table 4 and the moving distance of the linear motor 1 of the translational drive portion 11 of the translational drive/translational/rotational freedom degree mechanism module 6 differs therefrom.

Figure 29:
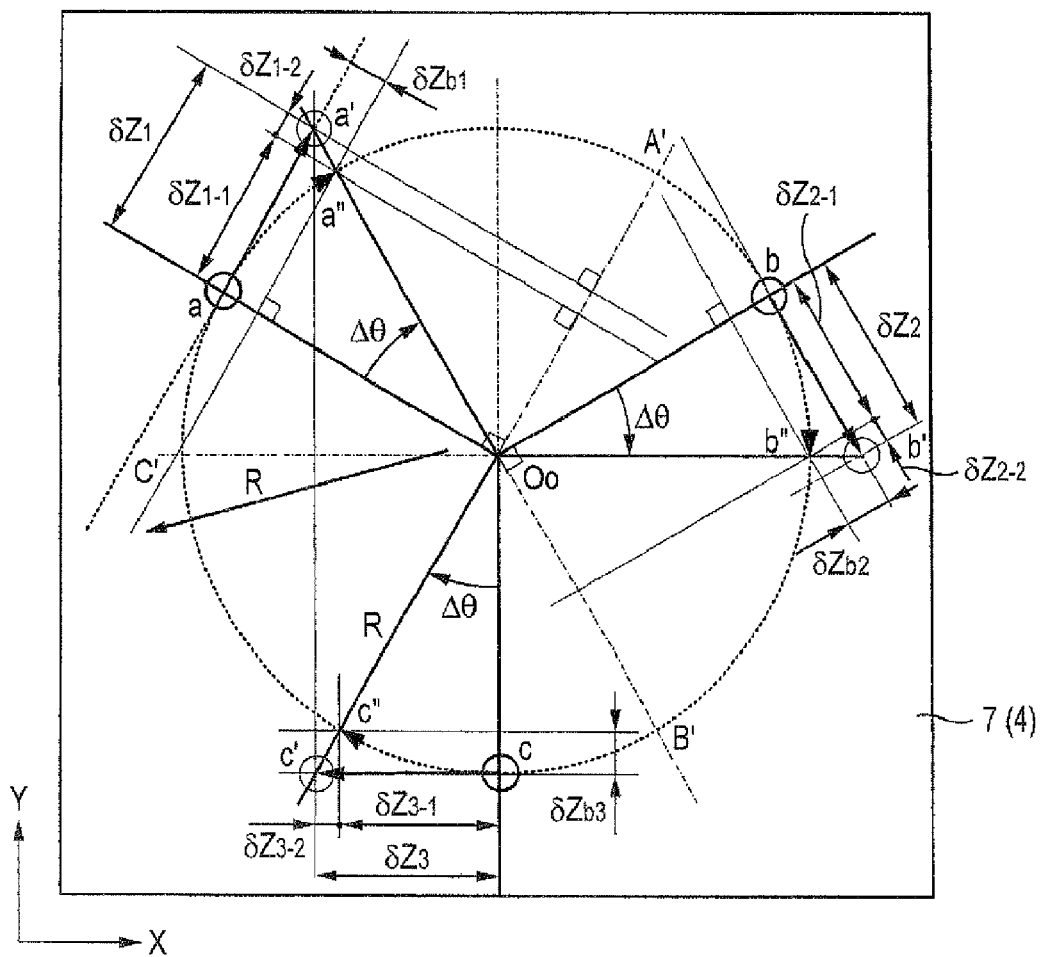
FIG. 29 is a view showing a rotational movement of a table of the alignment apparatus showing the second embodiment of the invention.

FIG. 29 is a view showing the rotational movement of the table of the alignment apparatus showing the second embodiment of the invention.

Figure 30:
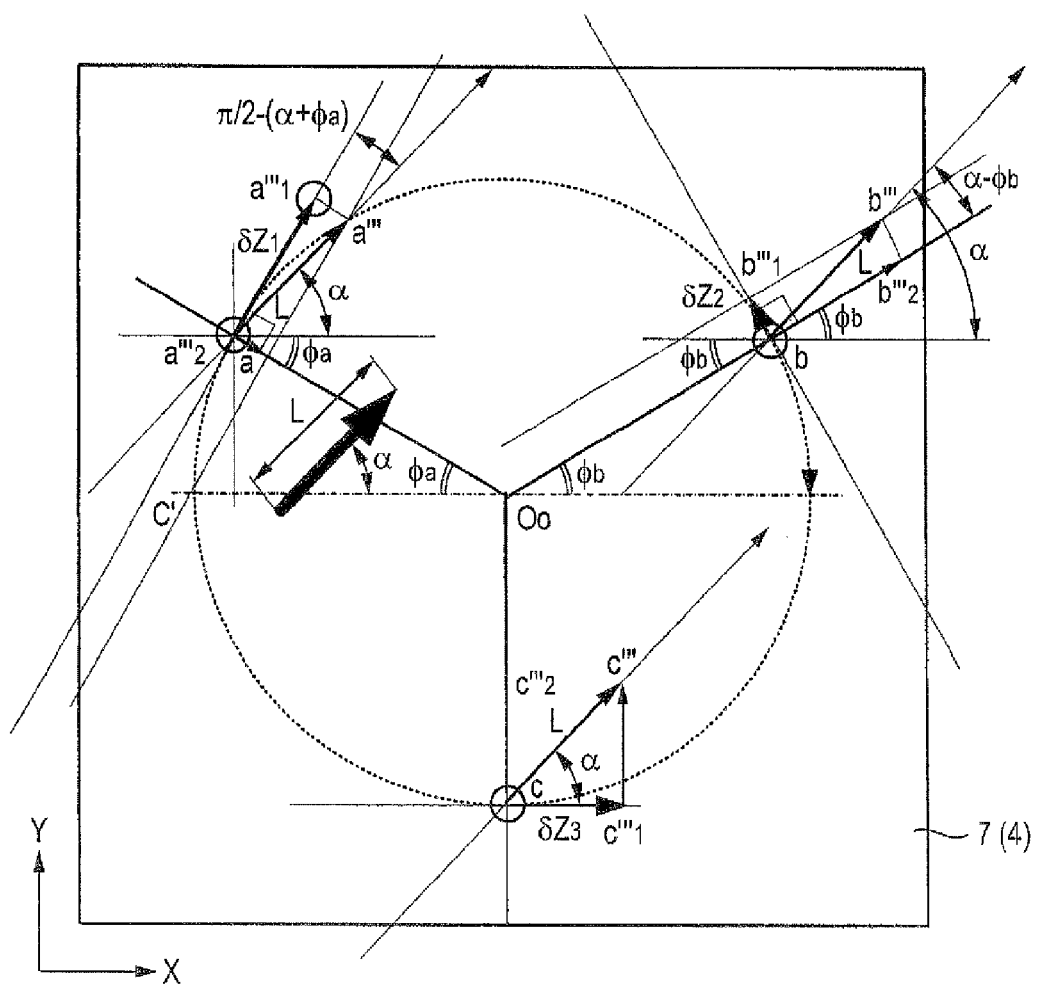
FIG. 30 is a view showing a translational movement of the table of the alignment apparatus showing the second embodiment of the invention.

FIG. 30 is a view showing the translational movement of the table of the alignment apparatus showing the second embodiment of the invention.

In FIG. 29, notation Oo designates the center of the table and the rotational center of the table, notation R designates the radius of rotation, notation $\delta Z_i$ designates the moving distance of the linear motor 1 of the translational drive portion 11 of the translational drive/translational/rotational freedom degree mechanism module 6, notation $\Delta \theta$ designates the angle of rotating the table, notations a, b, c designate the initial positions of the linear motors 1 of the translational drive translational/rotational freedom degree mechanism modules 6, notations a', b', c' designate the positions after moving the linear motors 1 of the translational drive portions 11 of the translational/rotational freedom degree mechanism modules 6 in moving by δZi, notations a", b", c" designate the positions after moving the translational freedom degree guide portions 13 of the translational/rotational freedom mechanism modules 6.

In the rotational movement of the table 4, two the translational freedom degrees are constituted using by the rotational freedom degree, and therefore, an angle made by the translational drive portion 11 and the translational freedom degree guide portion 13 is changed.

As shown by FIG. 29, in order to rotate centering on the table center Oo by Δθ, there is needed δZ1 by movement from the initial position a of the linear motor 1a of the translational drive portion 11a to a'. As in the case of the first embodiment, two the translational freedom degrees are constituted to be fixed to be orthogonal to each other, and therefore, when moved by δZ1-1 in the drawing, the table 4 can be rotated by Δθ, two the translational freedom degrees are connected using by the rotational freedom degree, an angle made by the two translational freedom degrees is changed. Therefore, a component of δZ1-2 in the drawing needs to be added to a moving distance δZ1-1 in the case of the first embodiment. The δZ1-1, δZ1-2 can geometrically be calculated as shown by FIG. 29.

Similarly in other translational/rotational freedom degree mechanism modules 6b, 6c, δZ2, δZ3 by movement from the initial positions b to b', from c to C' of the linear motors 1b, 1c of the translational drive portions 11b, 11c can geometrically be calculated.

In FIG. 30, notation L designates the translational moving distance of the table 4, notation α designates the angle made by the translational moving direction of the table 4, notation δZi designates the moving distance of the linear motor 1 of the translational drive portion 11 of the translational drive/translational/rotational freedom degree mechanism module 6, notations a, b, c designate the initial positions of the linear motors 1 of the translational drive portions 11 of the translational/rotational freedom degree mechanism modules 6, notations a'''1, b'''1, c'''1 designate the positions after moving linear motors 1 of the translational drive portions 11 of the translational/rotational freedom degree mechanism modules 6 in moving by δZi, notation a''', b''', c''' designate the positions after moving the rotational freedom degree guide portions 13 of the translational/rotational freedom degree mechanism modules 6.

In the translational movement of the table 4, a rotational component is not generated, and therefore, the rotational freedom guide portions 12 of the translational/rotational freedom degree mechanisms modules 6 are not operated. Therefore, the moving distances of the respective linear motors 1 in the case of the translational movement of the table 4 is brought into the geometrically relationship similar to that of the first embodiment and can similarly be calculated.

A series of operation of the second embodiment of the invention become similar to that of the first embodiment.

Functions of the two-dimensional position sensor 9 and the calculating portion of compensation value 10 remain unchanged, only the constitution of the translational/rotational freedom degree mechanism module 6 differs therefrom, and therefore, the geometrical relationship of the rotational movement used in calculating the moving distances of the respective linear motor 1 by the calculating portion 15 differs, and a value different from that of the first embodiment is calculated by the calculating portion 15.

Thereafter, similar to the first embodiment, the respective linear motors 1 are operated, the table 4 is moved, and the position of the object member 5 is compensated.

After finishing to compensate the position of the object member 5, similar to the firs embodiment, again, the position of the object member 5 may be detected by the two-dimensional position sensor 9, again, the position of the object member 5 may be compensated.

Further, although according to the embodiment, arrangement of the translational drive/translational/rotational freedom degree mechanism module 6 is as shown by FIG. 27, the invention is not limited thereto but the module may be arranged as in FIG. 8 through FIG. 10, FIG. 12 through FIG. 26 as shown by the first embodiment.

The moving distance of the table 4 and the moving distance of the linear motor 1 of the translational drive/translational/rotational freedom degree mechanism module 6 are brought into the geometrical relationship.

Embodiment 3

A constitution of the alignment apparatus of a third embodiment of the invention is as follows.

Figure 31C:
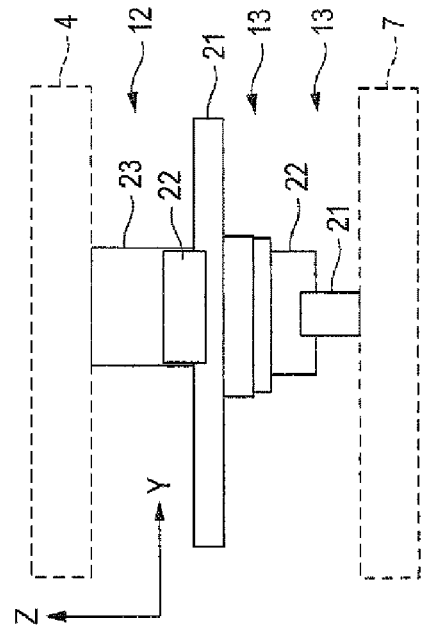
FIGS. 31A to 31C illustrate outline views of a 3 freedom degree module used in an alignment apparatus showing a third embodiment of the invention.
Figure 31A:
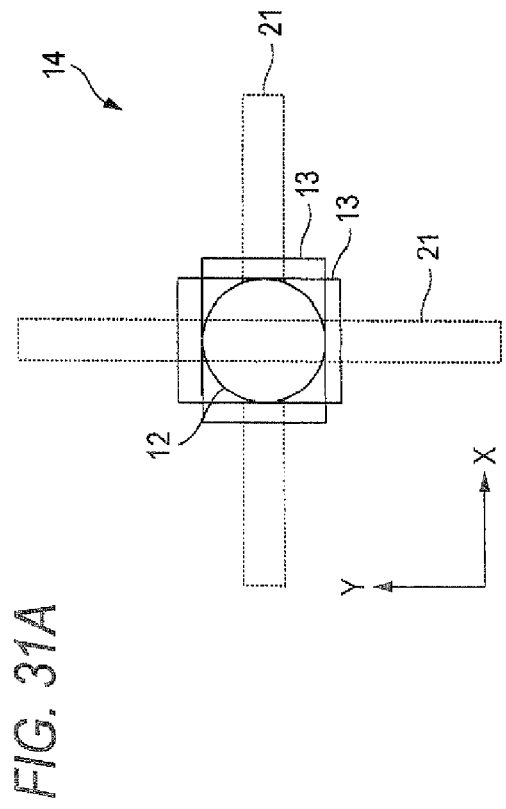
Figure 31B:
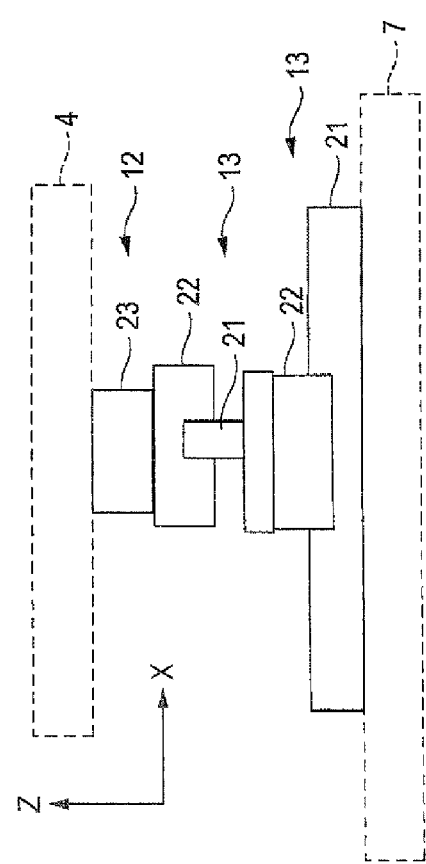

FIGS. 31A to 31C are an outline views of the 3 freedom degree module used in the alignment apparatus shown in the third embodiment of the invention.

Figure 32:
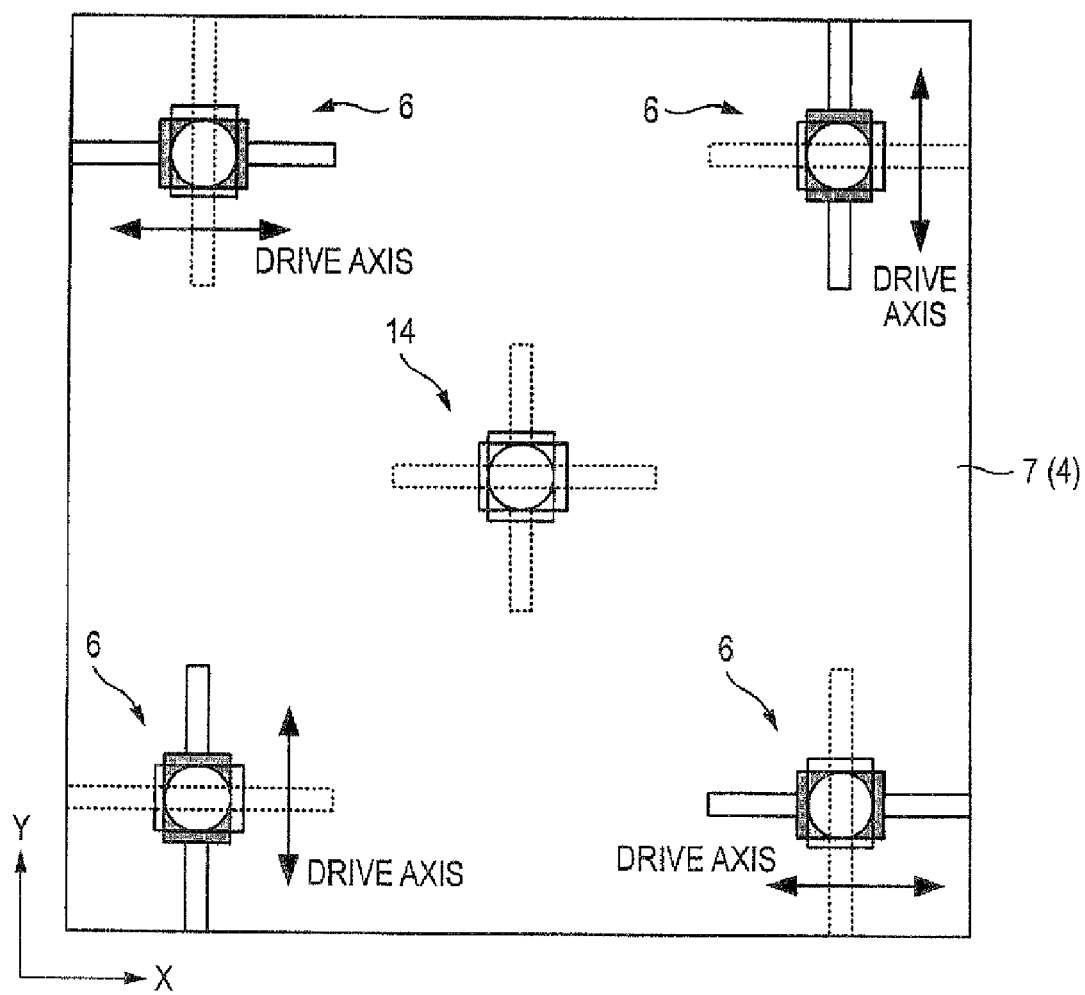
FIG. 32 illustrates a top view of the alignment apparatus showing the third embodiment of the invention and a view showing arrangement example 1 of the translational drive/translational/rotational freedom degree mechanism module and the 3 freedom degree module.

FIG. 32 illustrates a top view of the alignment apparatus showing the third embodiment of the invention and a view showing arrangement example 1 of the translational drive/translational/rotational freedom degree mechanism module and the 3 freedom degree module.

Figure 33:
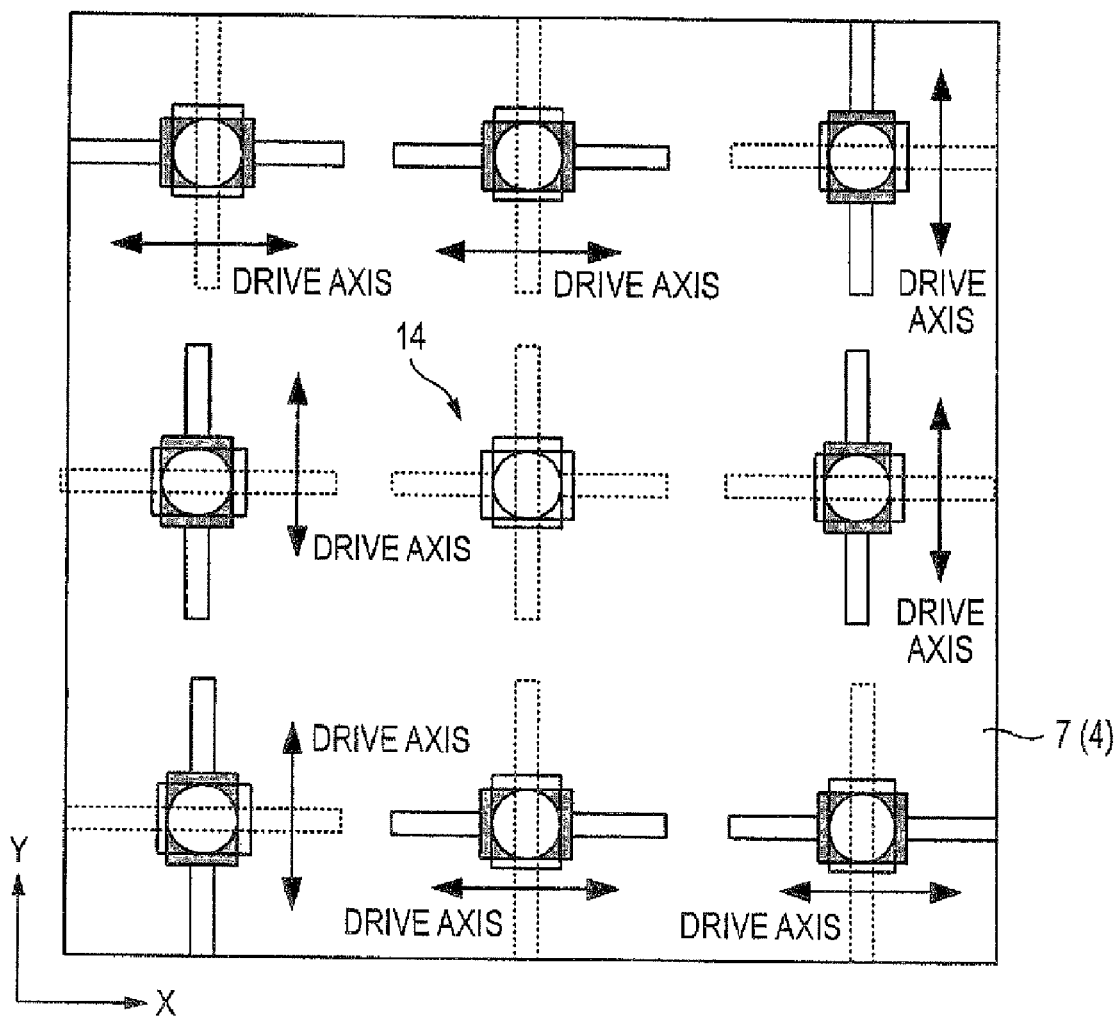
FIG. 33 illustrates a top view of the alignment apparatus showing the third embodiment of the invention and a view showing arrangement example 2 of the translational drive/translational/rotational freedom degree mechanism module and the 3 freedom degree module.

FIG. 33 illustrates a top view of the alignment apparatus showing the third embodiment of the invention and a view showing arrangement example 2 of the translational drive/translational/rotational freedom degree mechanism module and the 3 freedom degree module.

In the drawings, numeral 4 designates the table, numeral 6 designates the translational drive/translational/rotational freedom degree mechanism module, numeral 12 designates the rotational freedom degree guide portion, numeral 13 designates the translational freedom degree guide portion, numeral 14 designates the 3 freedom degree module, numeral 21 designate the linear movement guide, numeral 22 designates the linear movement guide block, numeral 23 designates the rotating bearing.

A total constitution is constructed by a constitution similar to those of the first embodiment and the second embodiment, and includes the linear motor 1, the moving distance detecting portion 2, the controller 3, the table 4, the object member 5, the translational drive/translational/rotational freedom degree mechanism module 6, the machine base portion 7, the reference generator portion 8, the two-dimensional position sensor 9, the calculating portion of compensation value 10, the translational drive guide portion 11, the rotational freedom degree guide portion 12, the translational freedom degree guide portion 13, the calculating portion 15, the linear movement guide 21, the linear movement guide block 22, the rotating bearing 23.

The 3 freedom degree module 14 is a mechanism which is not provided with a drive source as in the translational drive/translational/rotational freedom degree mechanism module 6 but is provided with one rotational and two translational freedom degrees, may be constituted in an order of translational movement, translational movement, rotation from the machine base portion 7 to the table 4 as in the translational drive/translational/rotational freedom degree mechanism module 6 of FIGS. 3A to 3C of the first embodiment, or may be constituted in the order of translational movement, rotation, translational movement, from the machine base portion 7 to the table 4 as in the translational drive/translational/rotational freedom degree mechanism module 6 of FIGS. 28A to 28C of the second embodiment.

Further, also the constitution of the translational drive/translational/rotational freedom degree mechanism module 6 is constructed by the constitution of the first embodiment or the second embodiment.

Although arrangement of the translational drive/translational/rotational freedom degree mechanism module 6 is shown in FIG. 32, FIG. 33, the embodiment may be constituted by adding the 3 freedom degree module 14 to FIG. 8 through FIG. 10, FIG. 12 through FIG. 26.

A portion of the third embodiment of the invention which differs from the first embodiment or the second embodiment resides in the constitution of adding the 3 freedom degree module 14.

Further, according to the third embodiment, as shown by FIG. 32, FIG. 33, an example of using 4 of the translational drive/translational/rotational freedom degree mechanism modules 6 and an example of arranging 8 of the translational drive/translational/rotational freedom degree mechanism modules 6 are illustrated.

Operation of the translational drive/translational/rotational freedom degree mechanism modules 6 and the alignment apparatus using the same is similar to those of the first embodiment, the second embodiment.

The 3 freedom degree module 14 is not provided with the drive source and is provided with 3 freedom degrees, and therefore, the module follows driving of the table 4 and does not hamper movement of the table 4 by operating the respective freedom degrees.

Although when the table 4 is large-sized, a weight thereof is increased, and there is a case of deteriorating a planar accuracy by bending the table 4 per se, when supported by the 3 freedom degree module 14, the planar accuracy can be maintained by restraining deformation of the table 4.

Embodiment 4

Figure 34:
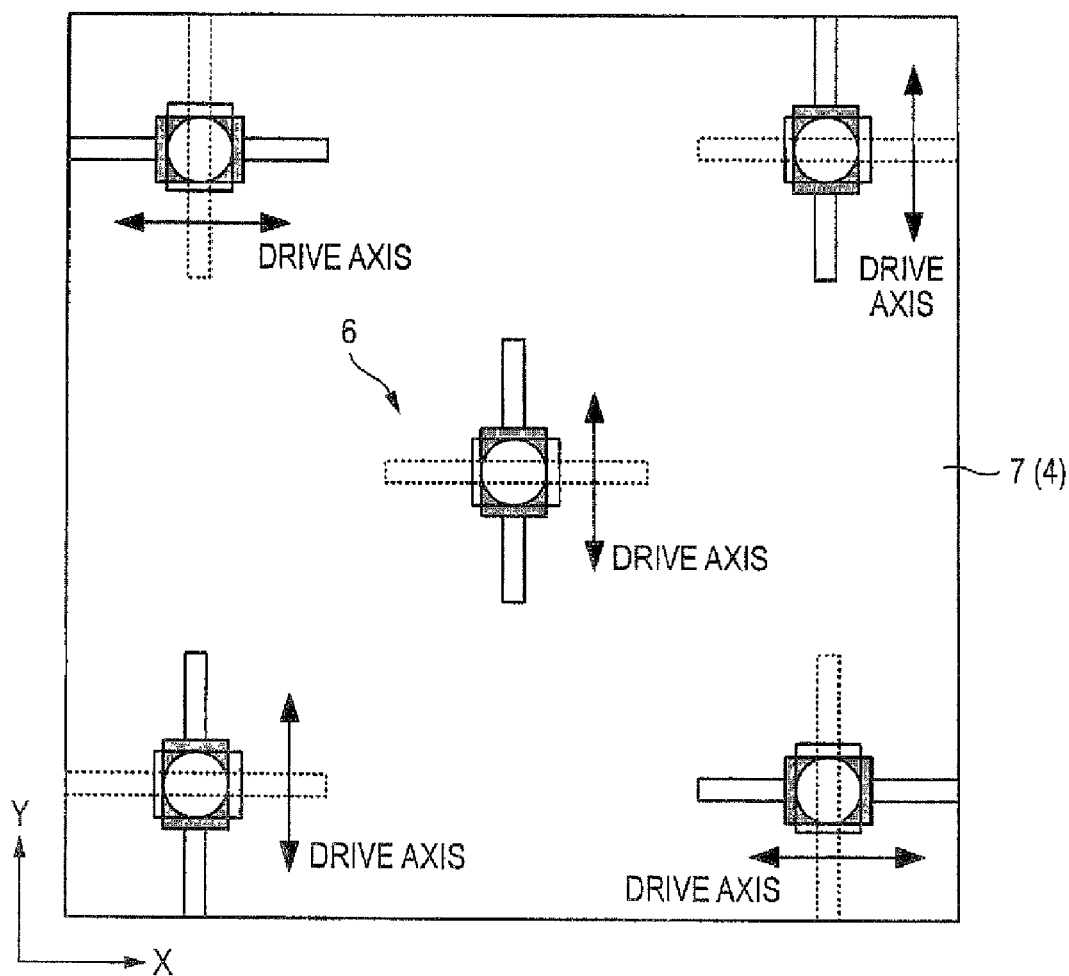
FIG. 34 illustrates a top view of an alignment apparatus showing a fourth embodiment of the invention and a view showing arrangement example 1 of a translational drive/translational/rotational freedom degree mechanism module.

FIG. 34 illustrates a top view of the alignment apparatus showing a fourth embodiment of the invention and a view showing arrangement example 1 of the translational drive/translational/rotational freedom degree mechanism module.

FIG. 34 is constructed by a constitution of adding the translational drive/translational/rotational freedom degree mechanism module 6 to FIG. 14 of Embodiment 1.

A total constitution is constructed by a constitution similar to those of the first embodiment, the second embodiment, the third embodiment, and includes the linear motor 1, the moving distance detecting portion 2, the controller 3, the table 4, the object member 5, the translational drive/translational/rotational freedom degree mechanism module 6, the machine base portion 7, the reference generator portion 8, the two-dimensional position sensor 9, the calculating portion of compensation value 10, the translational drive portion 11, the rotational freedom degree guide portion 12, the translational freedom degree guide portion 13, the calculating portion of moving distance 15, the linear movement guide 21, the linear movement guide block 22, the rotating bearing 23.

A portion of the fourth embodiment of the invention which differs from those of the first embodiment, the second embodiment, the third embodiment resides in a constitution of adding the translational drive/translational/rotational freedom degree mechanism module 6 to the translational drive/translational/rotational freedom degree mechanism modules 6 arranged uniformly to the table 4 and the machine base portion 7, and the linear motor 1 is increased only in one direction.

Also in the embodiment, movement of the table 4 can be carried out similar to the first embodiment, the second embodiment, the third embodiment.

The movement of the table 4 and the moving distance $\delta Zi$ of the respective linear motors can geometrically be determined, when the moving distances are instructed by the reference generator portion 8, the position of the object member 5 on the table 4 can be compensated.

Further, although according to the embodiment, there is constructed the constitution of adding the translational drive/translational/rotational freedom degree mechanism module 6 to FIG. 14 of Embodiment 1, the invention is not limited thereto but the embodiment may be constituted by adding the translational drive/translational/rotational freedom degree mechanism module 6 to FIG. 4, FIG. 8 through FIG. 10, FIG. 12 through FIG. 13, or FIG. 15 through FIG. 26 of the first embodiment.

The translational drive/translational/rotational freedom degree mechanism module 6 is provided with the function the same as that of the 3 freedom degree module 14 having 3 freedom degrees when the function of the linear motor 1 is stopped by the controller 3 to be brought into a free run state, and therefore, when the translational drive/translational/rotational freedom degree mechanism modules 6 arranged non-uniformly are brought into the freedom state, operation and effect the same as those of the third embodiment are provided.

Further, there are the translational drive/translational/rotational freedom degree mechanism modules 6 shown in FIG. 4 of the first embodiment and FIGS. 28A to 28C of the second embodiment, the geometrical relationship between the table 4 and the linear motor 1 is changed, two kinds of the translational drive/translational/rotational freedom degree mechanism modules 6 may mixedly be used when instructions suitable for the respectives are generated.

Embodiment 5

Figure 35:
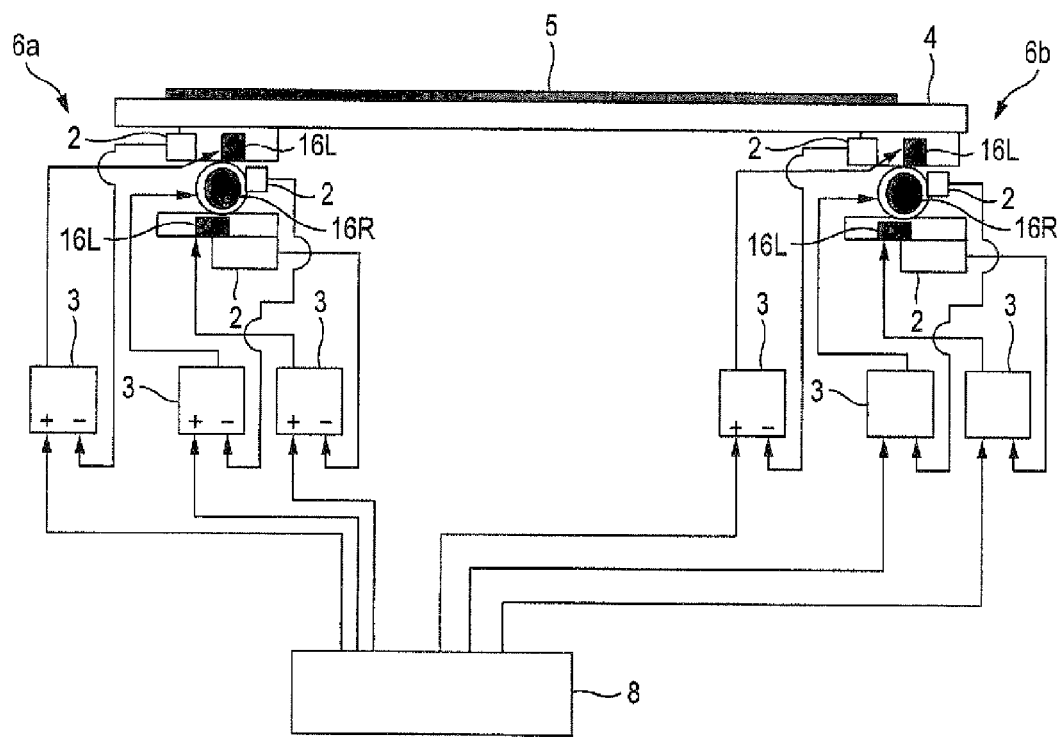
FIG. 35 is a schematic view of an alignment apparatus showing a fifth example embodiment of the invention.

FIG. 35 is a schematic view showing the alignment apparatus showing a fifth embodiment of the invention.

FIG. 36 illustrates a top view and a side view of the translational drive/translational/rotational freedom degree mechanism module showing the fifth embodiment of the invention.

FIG. 37 illustrates a top view of the alignment apparatus showing the fifth embodiment of the invention.

As shown by FIG. 35, the alignment apparatus is constituted by two the translational drive/translational/rotational freedom degree mechanism modules 6 arranged at a lower face of the table and the reference generator portion.

The reference generator portion 8 calculates moving distances of the linear motor 16L and the rotational type motor 16R necessary as the moving distance of the table 4, and instructs the moving distance to the respective controllers 3. The operation of the linear motor 16L and the rotational type motor 16R is controlled by 6 of the controllers 3 in accordance with the instruction of the reference generator portion 8.

As shown by FIG. 36, the translational drive/translational/rotational freedom degree mechanism module 6 comprises two the translational freedom degree portions 11 and the one rotation drive portion 17 having the rotational type motor 1, and is constituted to arrange the translational drive portion 11, the rotational drive portion 17, the translational drive portion 11 in this order from the machine base portion 7 to the table 4. The translational drive portion 11 is mounted with the linear motor 16L and translationally supported by providing the linear movement guide block 22 capable of moving the linear movement guide 21. The rotation drive portion 17 is mounted with the rotational type motor 16R and is rotatably supported by providing the rotating bearing 23. Two the translational drive portions 11 are not necessarily orthogonal to each other since there is the rotation drive portion 17 therebetween.

2 pieces of the first and the second translational drive/translational/rotational freedom degree mechanism modules 6a, 6b are arranged such that centers of rotation of the rotation drive portion 17 are disposed on the same radius from the center (Oo) of the table 4 and axially symmetrically relative to the center of the table 4.

A portion of the invention which differs from Patent Reference 1 and Patent Reference 2 resides in a portion of realizing to move the table in XYθ directions by providing two the translational drive/translational/rotational freedom degree mechanism module 6.

Figure 38:
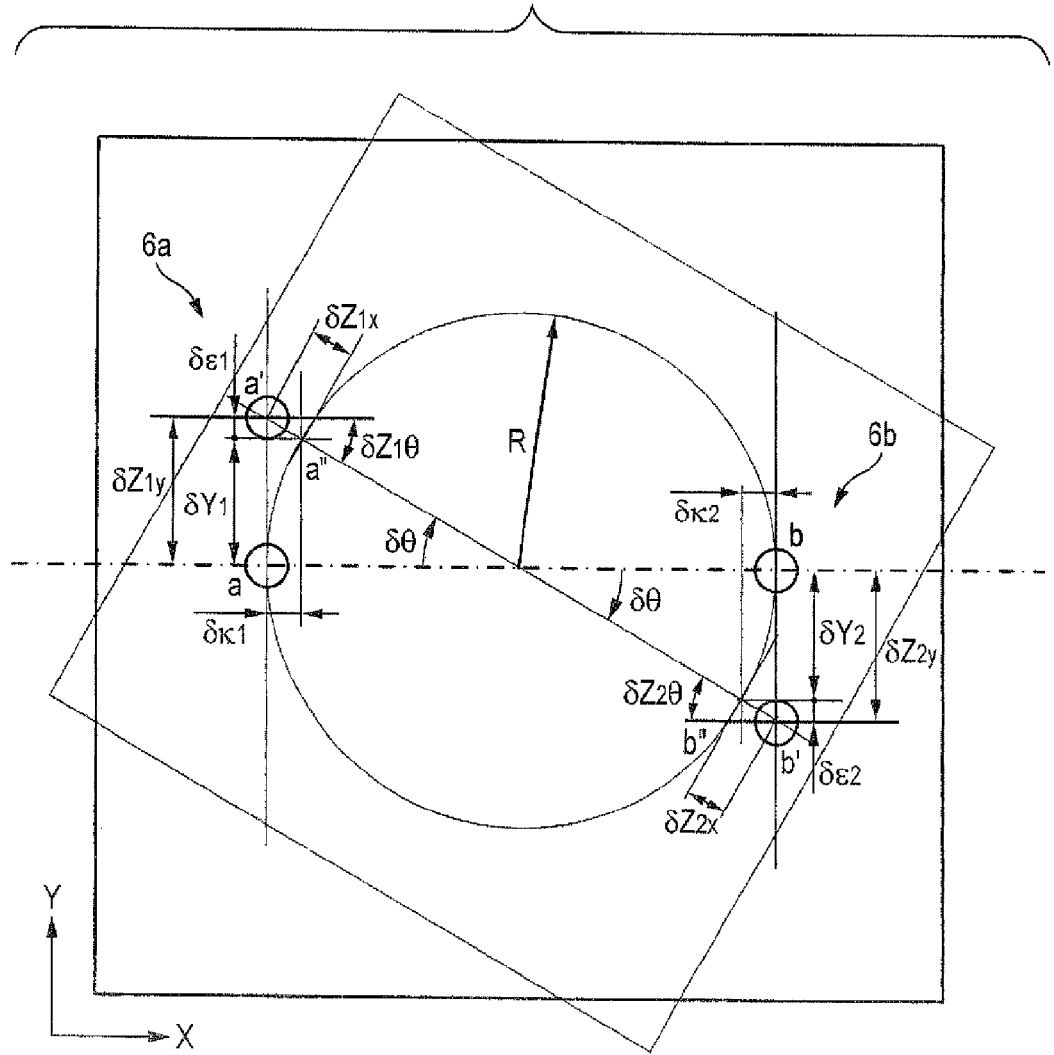
FIG. 38 is a view showing a rotational movement of a table of the alignment apparatus showing the fifth embodiment of the invention.

Next, the rotational movement of the alignment apparatus will be explained in reference to FIG. 38. FIG. 38 is a view showing the rotational movement of the table of the alignment apparatus showing the fifth embodiment of the invention. Notation Oo designates the rotational center of the table of the table and the rotational center of the table, notation R designates the radius of rotation, notation δZij designates an amount of moving the translational drive portion 11 of the translational drive/translational/rotational freedom degree mechanism module 6, notation Δθ designates the angle of rotating the table, notations a, b designate the initial positions.

The rotational movement of the table 4, since two the translational drive portions 11 are constituted using by the rotation drive portion 17, an angle made by two the translational drive portions 11 is not necessarily to be orthogonal to each other.

When the amount of moving the translational drive portion 11 arranged at a lower portion of the first translational drive/translational/rotational freedom degree mechanism module 6a is designated by notation δZ1Y, and the amount of moving the translational drive portion 11 arranged at the upper portion is designated by notation δZ1X, and the amount of moving the rotation drive portion 17 is designated by notation δ1θ as shown by FIG. 38, the table is moved such that the amount of moving the translational freedom degree portion 11 arranged at the lower portion of the second translational drive/translational/rotational freedom degree mechanism module 6b is designated by notation δZ2Y, the amount of moving the translational drive portion 11 arranged at the upper portion is designated by notation δZ2X, and the amount of moving the rotation drive portion 17 is designated by notation δ2θ. Further, two the translational drive portions 11 are arranged using by the rotation drive portion 17, the angle made by two the translational drive portions 11 is not orthogonal to each other, and therefore, by adding a component of δϵ1 to the moving distance δZy1, the table 4 is rotationally moved centering on the table.

In this way, the amount of moving the table 4 and the respective amounts of moving the translational drive/translational/rotational freedom degree mechanism modules 6 are geometrically determined, and the table 4 is rotationally moved centering on the table by moving the translational drive portions 11 and the rotational drive portion 17.

Here, although the center Oo of the table 4 is set to be basis, the rotational center of the table may be set to be any positions. The any positions are rotationally moved as the rotational center of the table based on calculating the respective amounts of moving the translational drive/translational/rotational freedom degree mechanism modules 6 geometrically.

Figure 39:
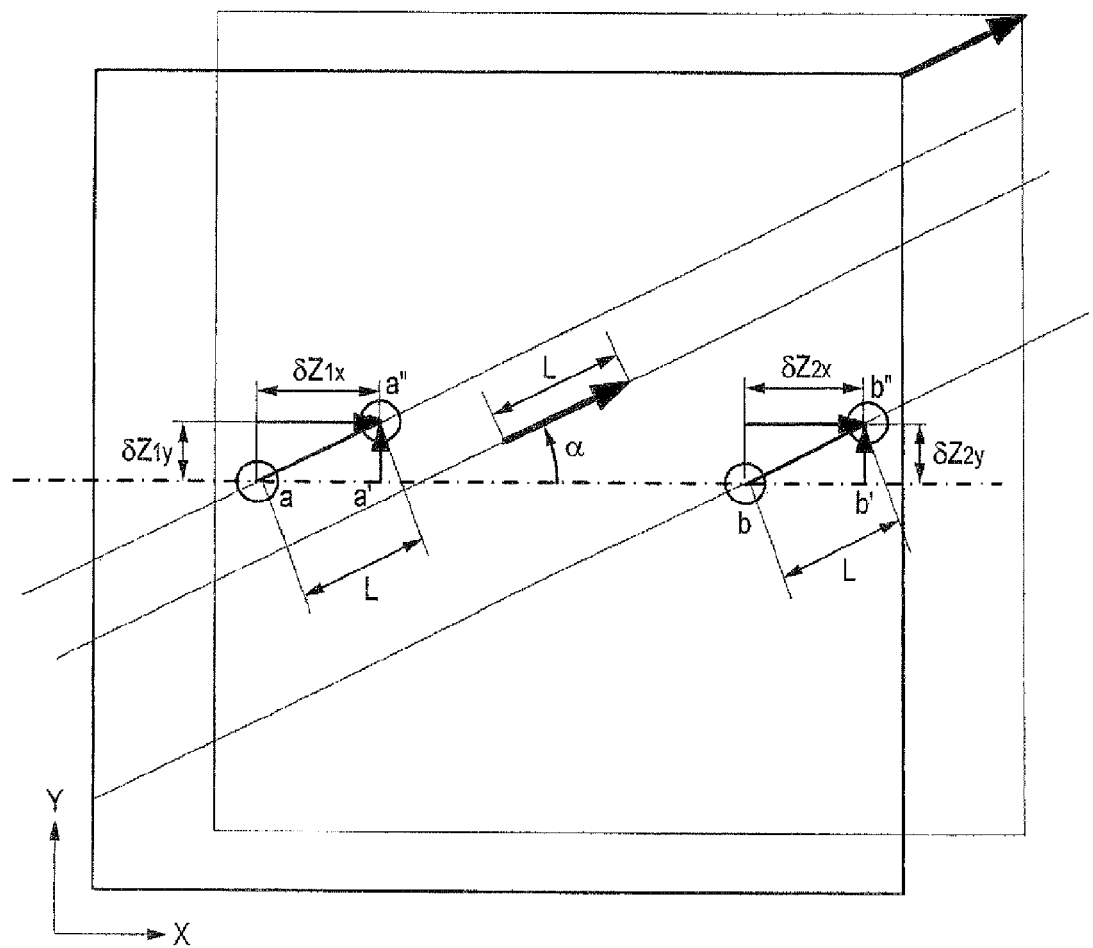
FIG. 39 is a view showing a translational movement of the table of the alignment apparatus showing the fifth embodiment of the invention.

Next, the translational movement of the table will be explained in reference to FIG. 39. FIG. 39 is a view showing the translational movement of the table of the alignment apparatus showing the fifth embodiment of the invention. Notation L designates the amount of translationally operating the table 4, notation α designates an angle made by the direction of translationally moving the table 4, notation δZij designates the amount of moving the respective translational freedom degree portions of the translational drive/translational/rotational freedom degree mechanism modules 6. The table 4 is positioned by instructing the predetermined moving amounts to the translational drive portions 11 arranged on upper and lower portions of the first translational drive/translational/rotational freedom degree mechanism modules 6a, 6b.

In this way, the amount of moving the table 4 and the respective amounts of moving the translational drive/translational/rotational freedom degree mechanism modules 6 are geometrically determined, by moving the translational drive portions 11, the table 4 is translationally moved. The rotation drive portion 17 is not operated and the rotational type motor 16R is held by the table 4 so as not to be moved in the rotational direction.

Since the constitution as described above, in working the object member 5 in moving or after finishing to move the table 4 or the like, even when an external force is operated, the position of the table 4 is detected by the moving distance detecting portion 2 and the translational drive/translational/rotational freedom degree mechanism modules 6 is controlled by a feedback control, and therefore, the positioning position of the table 4 is maintained.

In this way, even when the table 4 is large-sized and heavy-loaded, the load is dispersingly supported by two the translational drive/translational/rotational freedom degree mechanism module 6, and even when an external force is operated to the table 4, by maintaining the position, the table 4 can accurately be positioned to any positions.

Embodiment 6

Figure 40:
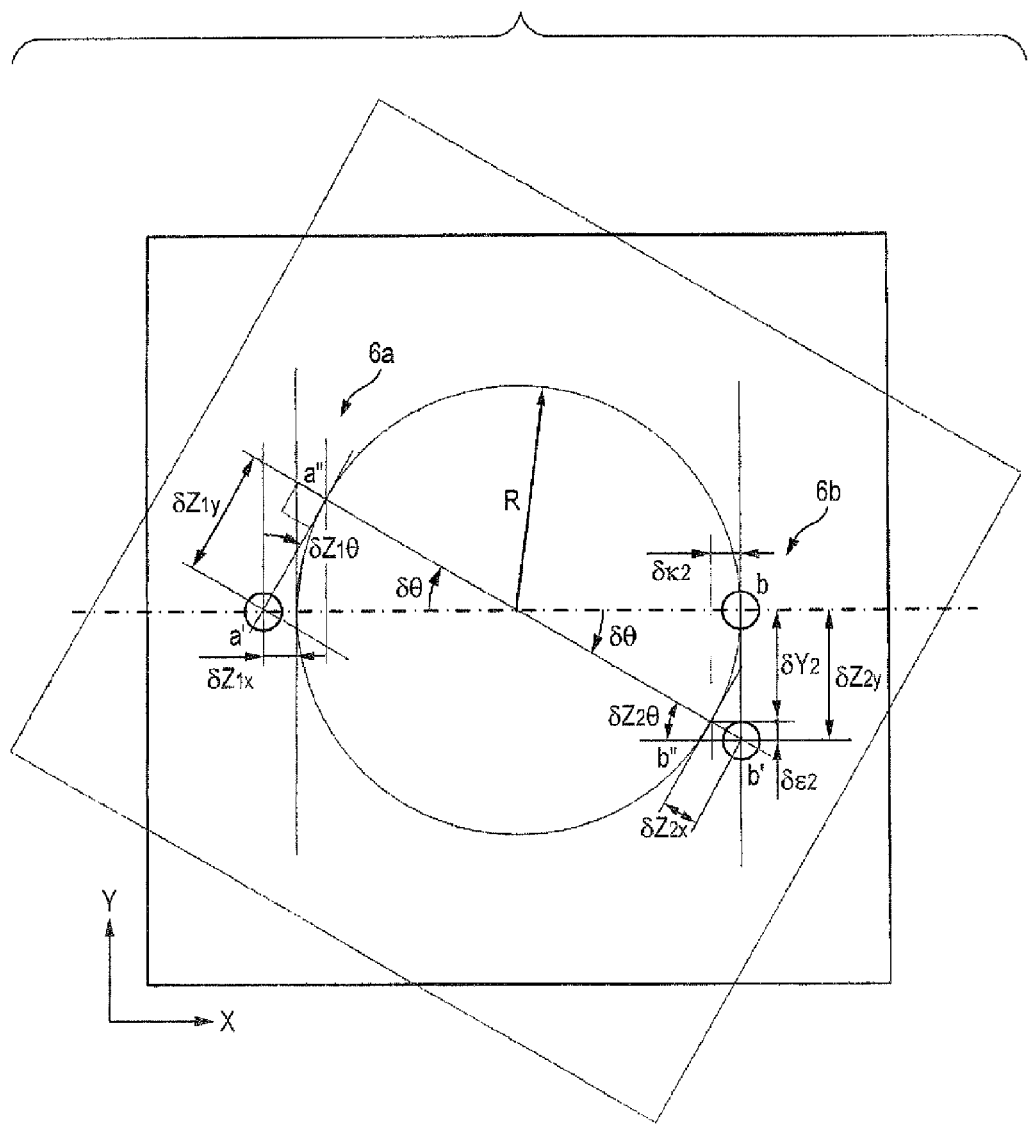
FIG. 40 illustrates a top view and a side view of a translational/rotational drive mechanism showing a sixth embodiment of the invention.

Next, a sixth embodiment of the invention will be explained. FIG. 40 illustrates a side view showing a rotational movement of the table and the arrangement of the translational drive/translational/rotational freedom degree mechanism module showing the sixth embodiment of the invention.

The translational drive/translational/rotational freedom degree mechanism module 6a of Embodiment 6 is the same as that of Embodiment 5 shown in FIG. 36. Further, a portion of Embodiment 6 which differs from Embodiment 5 resides in that the first translational drive/translational/rotational freedom degree mechanism module 6a is constituted such that the translational drive portion 11 of the lower portion is arranged to be driven in X direction, the translational drive portion 11 of the upper portion is arranged to be driven in Y direction above the rotation drive portion 17, the second translational drive/translational/rotational freedom degree mechanism module 6b is constituted such that the translational drive portion 11 of the lower portion is arranged to be driven in Y direction, the translational drive portion 11 of the upper portion is arranged to be driven in X direction above the rotation drive portion 17.

With regard to operation, the operation of the translational drive/translational/rotational freedom degree mechanism module 6a is the same as that of Embodiment 5, although directions of arranging the translational drive portions 11 of two the first and the second translational drive/translational/rotational freedom degree mechanism module 6a, 6b differ from each other, an instruction may be carried out to the respective drive portions from the geometrically calculated compensation value, the operations of the translational drive portion 11 and the rotation drive portion 17 are similar to those of Embodiment 5, and therefore, an explanation thereof will be omitted.

In this way, even when the table 4 is large-sized and heavy-loaded, the load is dispersingly supported by two the translational drive/translational/rotational freedom degree mechanism module 6, even when an external force is operated to the table 4, the position is maintained, thereby, the table 4 can accurately be positioned to any positions.

Embodiment 7

Next, a seventh embodiment of the invention will be explained.

Figure 41:
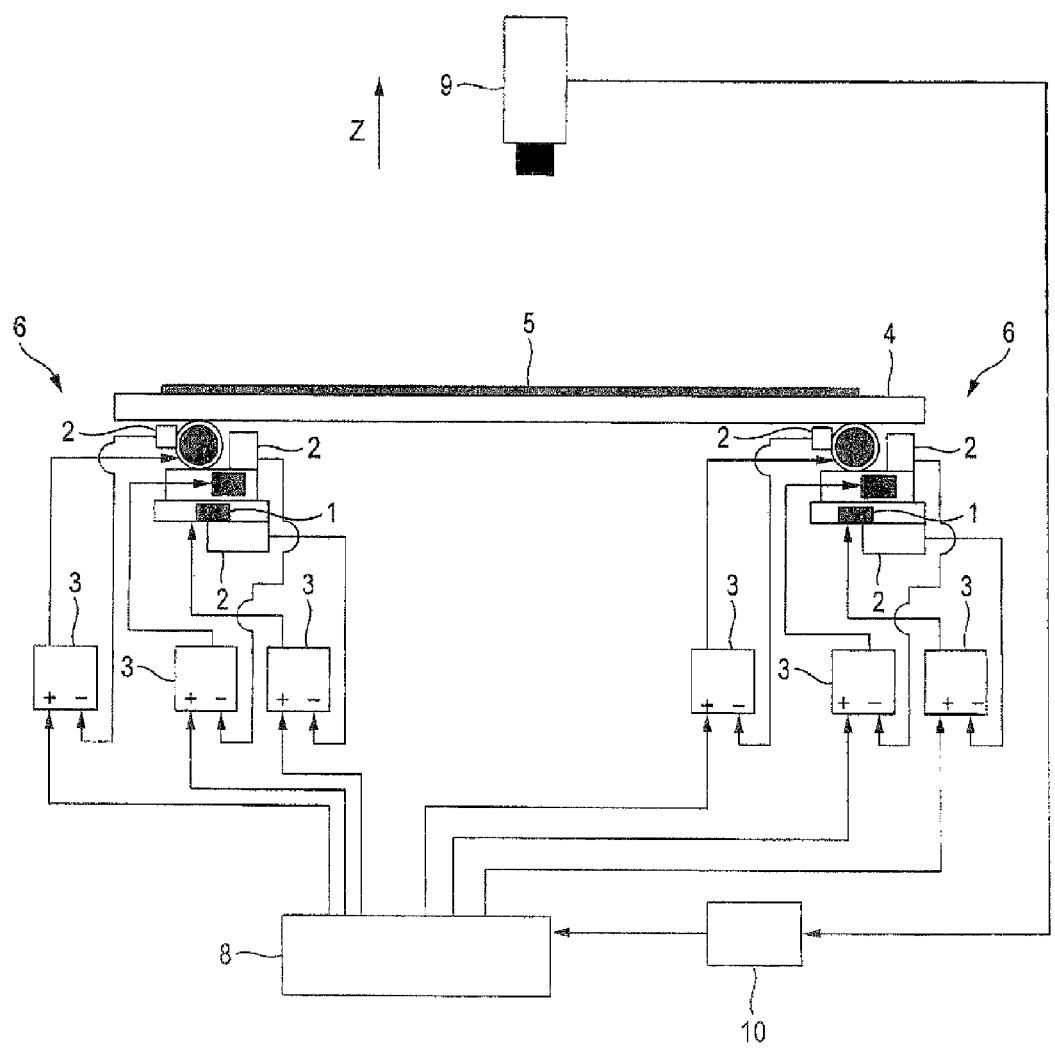
FIG. 41 is a schematic view of an alignment apparatus showing a seventh embodiment of the invention.

FIG. 41 is a schematic view showing an alignment apparatus showing the seventh embodiment of the invention.

Figure 42:
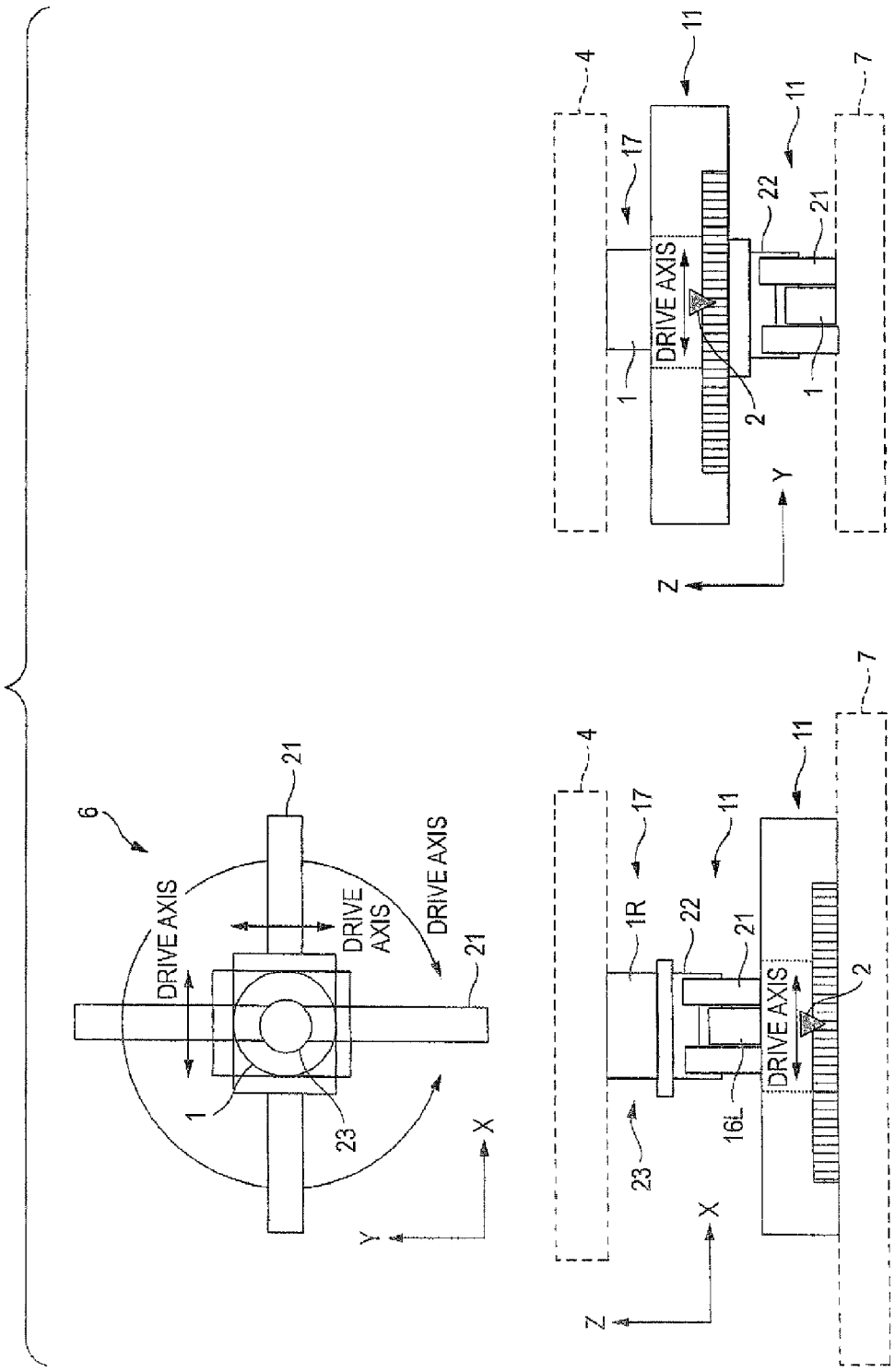
FIG. 42 illustrates a top view and a side view of a translational/rotational drive mechanism showing the seventh embodiment of the invention.

FIG. 42 illustrates a top view and a side view of the translational drive/translational/rotational freedom degree mechanism module 6 showing the seventh embodiment of the invention.

FIG. 43 is a view showing an arrangement of the translational drive/translational/rotational freedom degree mechanism module 6 and the rotational movement of the table of the alignment apparatus showing the seventh embodiment of the invention.

In FIG. 41, numeral 9 designates the two-dimensional position sensor, numeral 10 designates the calculating portion of compensation value.

A portion of Embodiment 7 which differs from Embodiment 5, Embodiment 6 resides in that the two-dimensional position sensor 9 comprising a CCD camera or the like arranged on the upper side of the table and the calculating portion of compensation value 10 for controlling based on a detecting signal of the two-dimensional position sensor 9 are added to the constitution as shown by FIG. 41 and that two the translational drive/translational/rotational freedom degree mechanism modules 6 arranged on the lower face of the table are constructed by a constitution as shown by FIG. 42.

An image of the object member 5 monitored by the two-dimensional position sensor 9 is subjected to an image processing, an arrangement position at which the object member 5 is to be disposed is calculated by the calculating portion of compensation value 10, and therefore, the operation of the linear motor 16L and the rotational type motor 16R is controlled by 6 of the controllers 3 in accordance with an instruction from the reference generator portion 8 similar to the fifth example to constitute the arrangement and which the object member 5 is to be disposed.

The translational drive/translational/rotational freedom degree mechanism module 6 is constituted by the translational drive portion 11, the translational drive portion 11, the rotation drive portion 17 successively from the lower side as shown by FIG. 42 different from Embodiment 5.

Further, 2 pieces of the first and the second translational drive/translational/rotational freedom degree mechanism modules 6a, 6b are arranged such that the center of the rotation of the rotational drive portion 12 is disposed on the same radius from the center (Oo) of the table 4 to be axially symmetrically relative to the center of the table 4.

A portion of the invention which differs from Patent Reference 1 and Patent Reference 2 resides in a portion in which two the translational drive/translational/rotational freedom degree mechanism modules 6 are provided at the lower face of the table 4 and the table is moved in XYθ directions.

Next, the rotational movement of the alignment apparatus of Embodiment 7 will be explained in reference to FIG. 43. Notation Oo designates the center of the table and the rotational center of the table, notation R designates the radius of rotation, notation δZij designates the amount of moving the translational drive portion 11, notation Δθ designates the angle of rotating the table, notations a, b designate the initial positions.

When the amount of moving the translational drive portion 11 of the lower portion of the first translational drive translational/rotational freedom degree mechanism module 6a is designated by δZ1Y, the amount of moving the translational drive portion 11 of the upper portion is designated by δZ1X, and the amount of moving the rotational drive portion 12 is designated by Δ1θ, the table 4 is rotationally moved centering on the table by being moved such that the amount of moving the translational drive portion 11 of the lower portion of the second translational drive translational/rotational freedom degree mechanism module 6b is designated by notation δZ2Y, the amount of moving the translational drive portion 11 of the upper portion is designated by δZ2X, the amount of moving the rotational drive portion 12 is designated by δ2θ.

Although since the constitution of the translational drive/translational/rotational freedom degree mechanism module 6 differs from that of Embodiment 5 as shown by FIG. 42, the geometrical relationship is changed, the moving distances of the respective motors 1 differ, the amounts of moving the table 4 and the respective amounts of moving the translational drive/translational/rotational freedom degree mechanism module 6 are geometrically determined similarly, and the table 4 is rotationally moved centering on the table by moving the translational drive portion 11 and the rotational drive portion 12.

An explanation of the translational movement of the table will be omitted since the rotational drive portion 17 is not operated and operation similar to that of Embodiment 5 is carried out.

Next, a series of operation of the alignment apparatus of Embodiment 7 will be explained.

Figure 44:
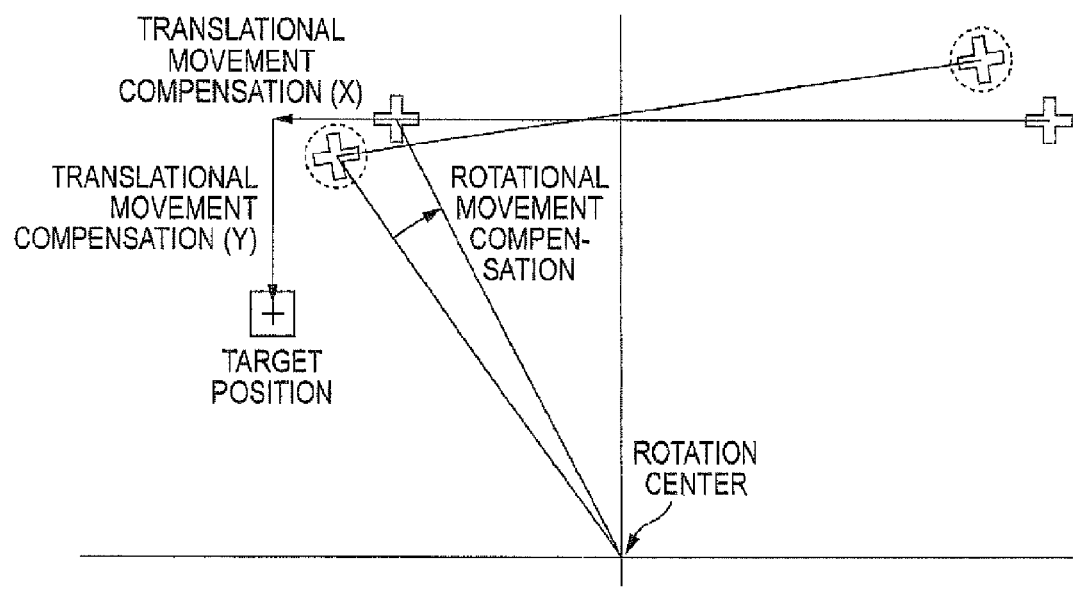
FIG. 44 is a schematic view showing a position compensating method showing the seventh embodiment of the invention.

FIG. 44 is a schematic view showing a position compensating method showing the seventh embodiment of the invention.

A position of the object member 5 placed on the table 4 is recognized as the image by the two-dimensional position sensor 9. The calculating portion of compensation value 10 detects a mark previously described on the object member 5 or a characteristic of the object member 5 (as shown by + in the drawing) and the rotational angle of the rotational center of the table, and the translational moving distance are calculated from an angle of the inclination.

The compensation angle Φ, the moving distance L are calculated by the calculating portion of compensation value 10, from the position of the table 4, geometrically, the moving distances of the respective drive portions of the translational drive/translational/rotational freedom degree mechanism modules 6 are calculated, the reference generator portion 8 instructs the moving distances δZij to the respective controllers 3, the table 4 is positioned, and the position of the object member 5 is compensated.

Here, in working the object member 5 in moving or after finishing to move the table 4, even when an external force is operated, the translational drive/translational/rotational freedom degree mechanism module 6 detects the position of the table 4 by the moving distance detecting portion 2 to be controlled by a feedback control, and therefore, the positioning of the position of the table 4 is maintained.

In this way, even when the table 4 is large-sized and heave-loaded, the load is dispersingly supported by two the translational drive/translational/rotational freedom degree mechanism module 6, even when the external force is operated to the table 4, the position is maintained, thereby, the table 4 can accurately be positioned at any positions.

Further, even when the table 4 is moved accidentally by the external force, the two-dimensional position sensor 9 can detect movement of the table 4, and therefore, two-dimensional positioning may be carried out again.

Although here, an explanation has been given such that 2 pieces of the linear motors 16L are used for the translational drive portions 11, the translational drive portions 11 may be constituted by plane motors, or may be constructed by a constitution of freely moving in a plane. Further, although an explanation has been given such that the drive portions of the respective drive mechanisms are constituted by an electromagnetic type, the drive portions may be constituted by a piezoelectric type or the like, and are not particularly limited.

Embodiment 8

Next, an eighth embodiment of the invention will be explained. FIG. 45 illustrates a view showing an arrangement of the translational drive/translational/rotational freedom degree mechanism module and the rotational movement of the table of the alignment apparatus showing the eighth embodiment of the invention.

A portion of Embodiment 8 which differs from Embodiment 5 and Embodiment 6 resides in the constitution of the translational drive/translational/rotational freedom degree mechanism module 6. The constitution of the drive/translational/rotational freedom degree mechanism module 6 is the same as that of Embodiment 6 shown in FIG. 42. Further, the two-dimensional position sensor 9 and the calculating portion of compensation value 10 shown in Embodiment 7 will be omitted.

A portion of Embodiment 8 which differs from Embodiment 7 resides in that the first translational drive/translational/rotational freedom degree mechanism module 6a is constituted such that the translational drive portion 11 of the lower portion is arranged to be driven in X direction, the translational drive portion 11 of the upper portion is arranged to be driven in Y direction, the second translational drive/translational/rotational freedom degree mechanism module 6b is constituted such that the translational drive portion 11 of the lower portion is arranged to be driven in Y direction, the translational drive portion 11 of the upper portion is arranged to be driven in X direction.

With regard to the operation, although the arrangements of the translational drive portions 11 of 2 pieces of the first and the second translational drive/translational/rotational freedom degree mechanism module 6a, 6b differ from each other, the instruction may be carried out from the respective drive portions from the geometrically calculated compensation value, the operation of the translational drive portion 11 and the rotational drive portion 12 are similar to that of Embodiment 6, and therefore, an explanation thereof will be omitted.

In this way, even when the table 4 is large-sized and heavy-loaded, the load is dispersingly supported by two the translational drive/translational/rotational freedom degree mechanism module 6, even when the external force is operated to the table 4, by maintaining the position, the table 4 can accurately be positioned to any positions.

Embodiment 9

Next, a ninth embodiment of the invention will be explained. FIG. 46 illustrates a top view and a side view of the translational drive/translational/rotational freedom degree mechanism module showing the ninth embodiment of the invention.

Figure 47A:
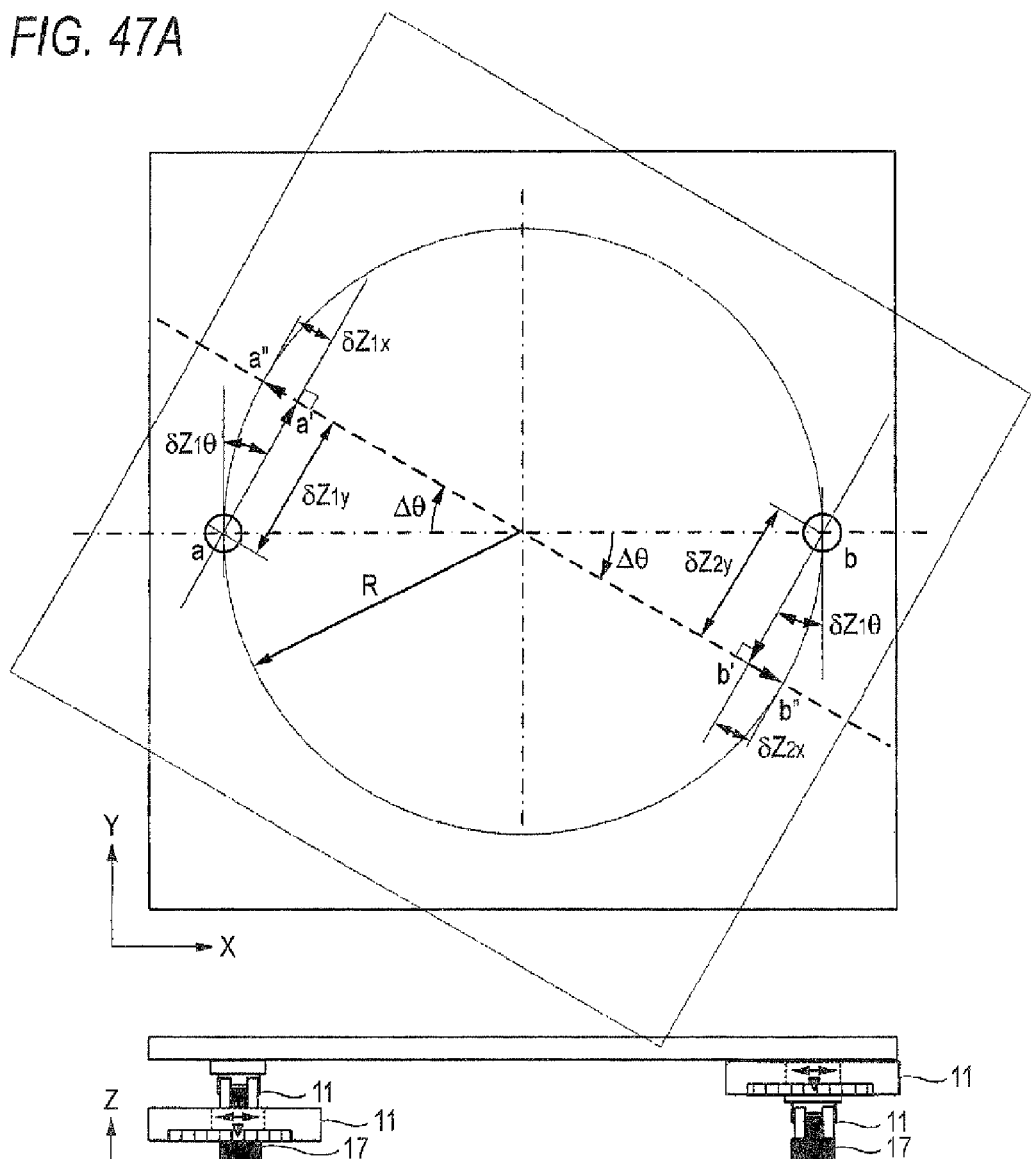
FIGS. 47A and 47B are views showing an arrangement/rotational drive mechanism showing the ninth embodiment of the invention and a rotational movement of the table.
Figure 47B:
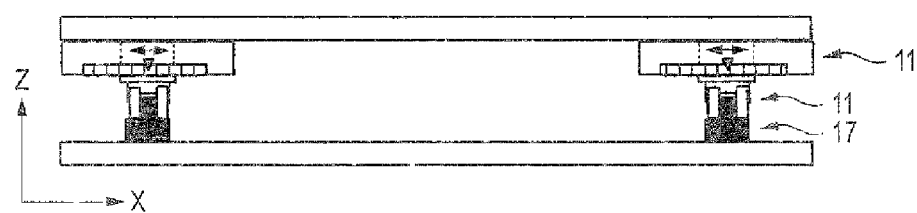
Figure 48:
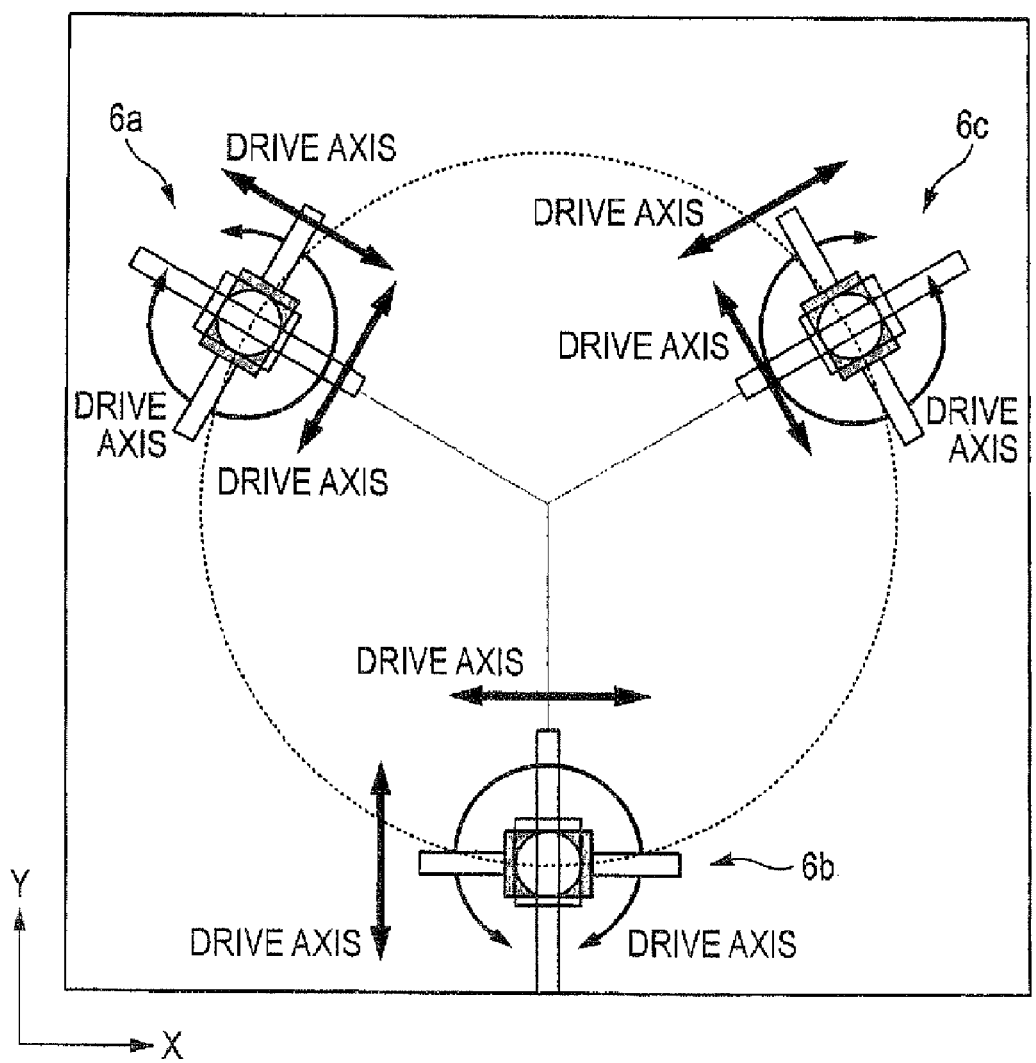
FIG. 48 is a top view of an alignment apparatus showing a tenth embodiment of the invention.

FIGS. 47A and 47B are views showing arrangement of the translational drive/translational/rotational freedom degree mechanism module and the rotational movement of the table showing the ninth embodiment of the invention.

A portion of Embodiment 9 which differs from Embodiment 5 through Embodiment 8 resides in the constitution of the translational drive/translational/rotational freedom degree mechanism module 6. As shown by FIG. 46, the portion resides in that the translational drive/translational/rotational freedom degree mechanism module 6 comprises two the translational drive portions 11 and the rotation drive portion 17, the rotation drive portion 17, the translational drive portion 11, the translational drive portion 11 are arranged in this order between the machine base portion 7 to the table 4. Further, the two-dimensional position sensor 9 and the calculating portion of compensation value 10 shown in Embodiment 7 are omitted.

Next, the rotational movement of the alignment apparatus will be explained in reference to FIGS. 47A and 47B. FIG. 47A shows a case in which directions of arranging two the translational drive/translational/rotational freedom degree mechanism module 6 differ from each other, FIG. 47B shows a case in which the directions of arranging two the translational drive/translational/rotational freedom degree mechanism module 6 are the same. That is, the cases correspond to differences between Embodiment 5 (FIG. 37) and Embodiment 6 (FIG. 40), between Embodiment 7 (FIG. 43) and Embodiment 8 (FIG. 45).

Notation Oo designates the center of the table and the rotational center of the table, notation R designates the radius of rotation, notation $\delta Zij$ designates the amount of moving the translational drive portion 11 of the translational drive/translational/rotational freedom degree mechanism module 6, notation $\Delta\theta$ designates the angle of rotating the table, notations a, b designate the initial positions.

In either of cases (A) (B), the moving amounts of the respective freedom degrees in X direction, Y direction, the rotational direction stay the same. When as shown by FIG. 46, the amount of moving the translational drive mechanism 11 arranged at the lower portion of the first translational drive/translational/rotational freedom degree mechanism module 6a is designated by notation $\delta Z1Y$, the amount of moving the translational drive portion 11 arranged at the upper portion is designated by notation $\delta Z1X$, the amount of moving the rotational drive portion 17 is designated by notation $\delta 1\theta$, the table 4 is rotationally moved centering on the table by being moved such that the amount of moving the translational drive portion 11 arranged at the lower portion of the second translational drive/translational/rotational freedom degree mechanism module 6b is designated by notation $\delta Z2Y$, the amount of moving the translational drive portion 11 arranged at the upper portion is designated by notation $\delta Z2X$, the amount of moving the rotation drive portion 17 is designated by notation $\delta 2\theta$.

With regard to the translational movement of the table, by not operating the rotation drive portion 17, operation similar to that of Embodiment 5 is constituted, and therefore, an explanation thereof will be omitted. Further, also the series of operation of Embodiment 9 is similar to those of Embodiment 5 and Embodiment 7, and therefore, an explanation thereof will be omitted.

As described above, as shown by Embodiment 5 through Embodiment 9, even when the constitution of the translational drive/translational/rotational freedom degree mechanism module 6 is changed, the amount of moving the table 4 and the amounts of moving the respective drive portions of the respective drive/translational/rotational freedom degree mechanism modules 6 can geometrically be calculated.

In this way, even when the table is large-sized and heavy-loaded, the load is dispersingly supported by two the translational drive/translational/rotational freedom degree mechanism modules 6, even when an external force is operated to the table 4, by maintaining the position, the table 4 can accurately be positioned to any positions.

Embodiment 10

Next, a tenth embodiment will be explained. FIG. 8 is a top view of an alignment apparatus showing the tenth embodiment of the invention. A portion of Embodiment 10 which differs from Embodiments 5 through 9 resides in a number of the translational drive/translational/rotational freedom degree mechanism module 6, and 3 of the translational drive/translational/rotational freedom degree mechanism modules 6 are used. Further, the two-dimensional position sensor 9, the calculating portion of compensation value 10 shown in Embodiment 7 are omitted.

With regard to the series of operation of the rotational movement, the translational movement and the table of the alignment apparatus, only a number of pieces of the translational drive/translational/rotational freedom degree mechanism modules 6 is increased, the series of operation stays the same, and therefore, an explanation thereof will be omitted.

The translational drive/translational/rotational freedom degree mechanism module 6 can geometrically be determined even when the constitution is any of those shown in Embodiment 5 through Embodiment 9, further, even when the translational drive/translational/rotational freedom degree mechanism modules 6 having different constitutions are mixedly present, further, even when the direction of the arrangement is any of those.

In this way, even when the table is large-sized and heavy-loaded, the load is dispersingly supported by 3 of the translational drive/translational/rotational freedom degree mechanism modules 6, even when an external force is operated to the table 4, by maintaining the position, the table 4 can accurately be positioned to any positions.

Embodiment 11

Figure 49:
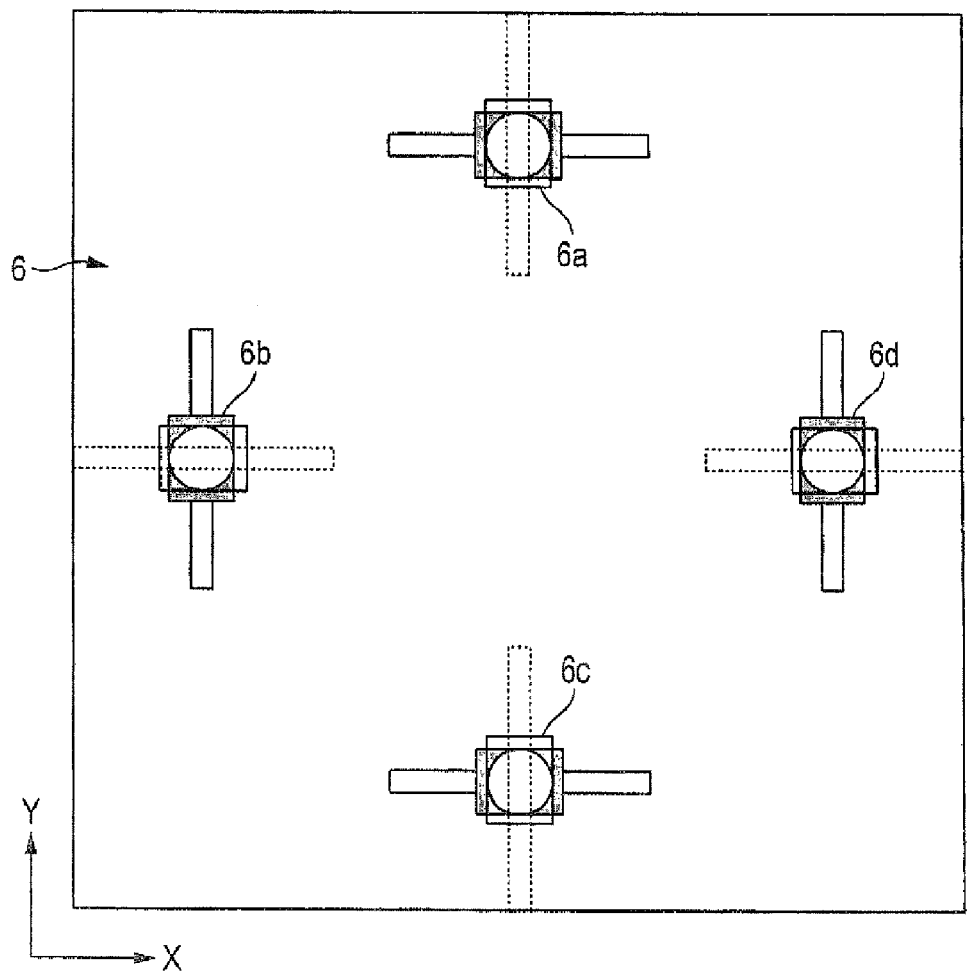
FIG. 49 is a top view of an alignment apparatus showing an eleventh embodiment of the invention.

Next, an eleventh embodiment will be explained. FIG. 49 is a top view of an alignment apparatus showing the eleventh embodiment of the invention.

A portion of Embodiment 11 which differs from Embodiments 5 through 10 resides in a number of the translational drive/translational/rotational freedom degree mechanism modules 6. The translational drive/translational/rotational freedom degree mechanism module 6 can geometrically be determined even when the constitution is any of those shown in Embodiment 5 through Embodiment 9, further, even when the translational drive/translational/rotational freedom degree mechanism modules 6 having different constitutions are mixedly present, further, even when the direction of the arrangement is any of those, and therefore, the series of operation of the rotational movement, the translational movement and the table of the alignment apparatus stay the same, and therefore, an explanation thereof will be omitted.

In this way, even when the table is large-sized and heavy-loaded, the load is dispersingly supported by 3 of the translational drive/translational/rotational freedom degree mechanism modules 6, even when an external force is operated to the table 4, by maintaining the position, the table 4 can accurately be positioned to any positions.

In this way, even when the table is large-sized and heavy-loaded, the load is dispersingly supported by 3 of the translational drive/translational/rotational freedom degree mechanism modules 6, even when an external force is operated to the table 4, by maintaining the position, the table 4 can accurately be positioned to any positions.

Embodiment 12

Figure 50:
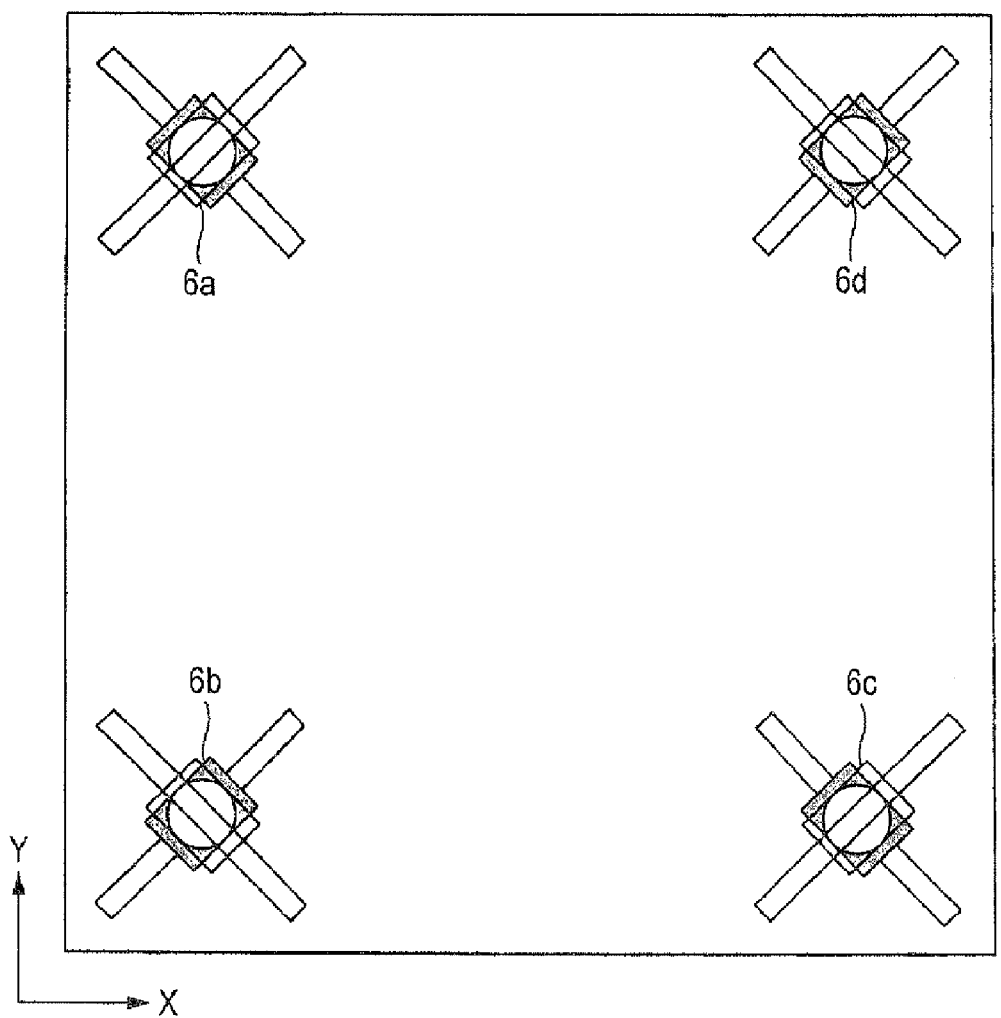
FIG. 50 is a top view of an alignment apparatus showing a twelfth embodiment of the invention.

Next, a twelfth embodiment will be explained. FIG. 50 is a top view of an alignment apparatus showing the twelfth embodiment of the invention. A portion of Embodiment 12 which differs from Embodiments 5 through 10 resides in a number of the translational drive/translational/rotational freedom degree mechanism modules 6. A number of 4 is the same as the number of the translational drive/translational/rotational freedom degree mechanism modules 6 of Embodiment 11.

The translational drive/translational/rotational freedom degree mechanism modules 6 can geometrically be determined even when the constitution is any of those shown in Embodiment 5 through Embodiment 9, even when the translational drive/translational/rotational freedom degree mechanism modules 6 having different constitutions are mixedly present, further even when the direction of the arrangement is any of those, and therefore, the series of operation of the rotational movement, the translational movement and the table of the alignment apparatus stay the same, and therefore, an explanation thereof will be omitted.

In this way, even when the table is large-sized and heavy-loaded, the load is dispersingly supported by 2 of the translational drive/translational/rotational freedom degree mechanism modules 6, even when an external force is operated to the table 4, by maintaining the position, the table 4 can accurately be positioned to any positions.

Embodiment 13

Next, a thirteenth embodiment will be explained.

Figure 51:
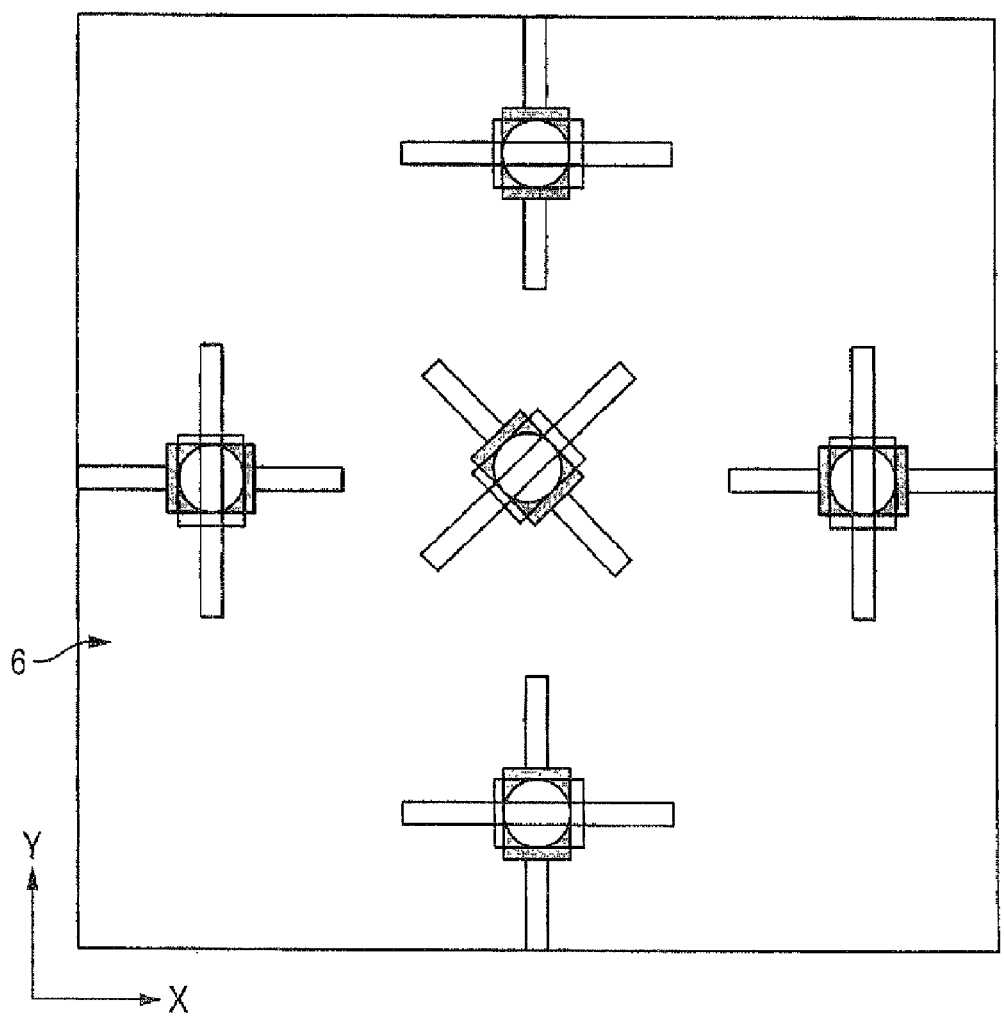
FIG. 51 is a top view of an alignment apparatus showing a thirteenth embodiment of the invention (other modified arrangement example 1).
Figure 52:
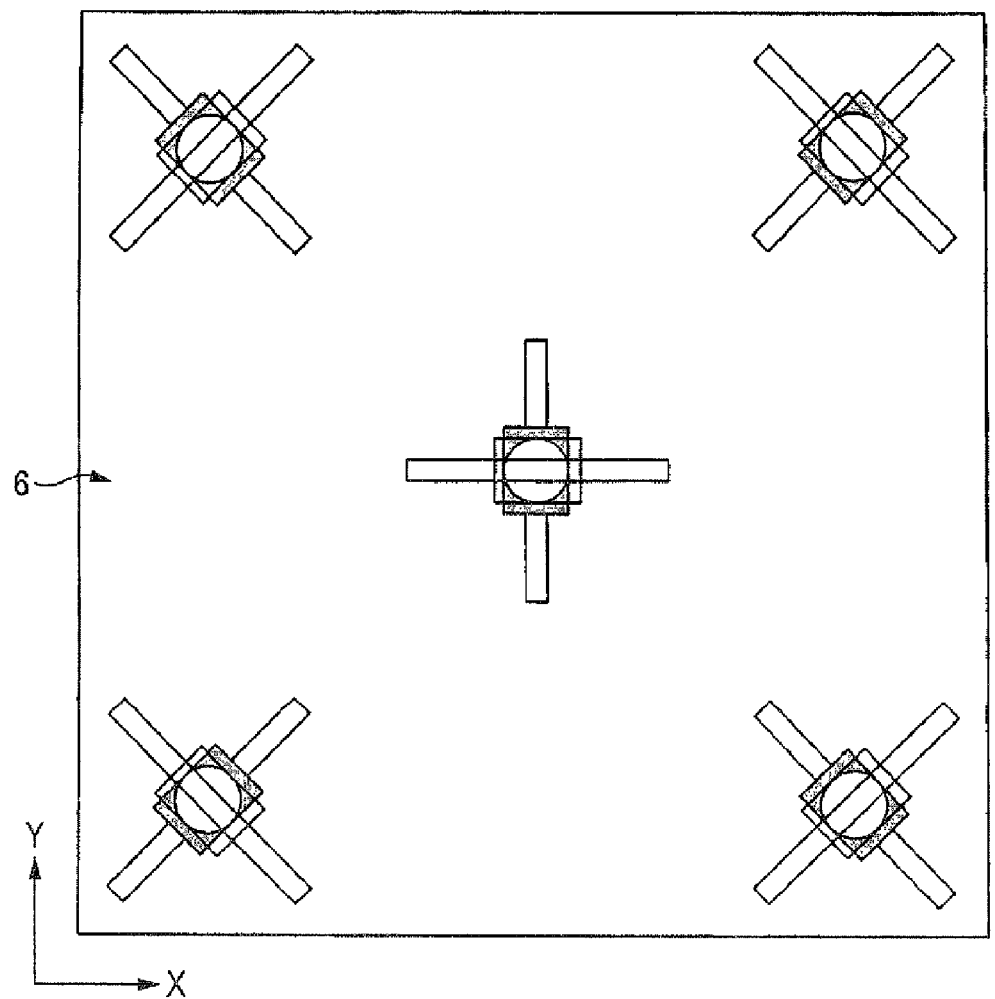
FIG. 52 is a top view of an alignment apparatus showing the thirteenth embodiment of the invention (other modified arrangement example 2).
Figure 53:
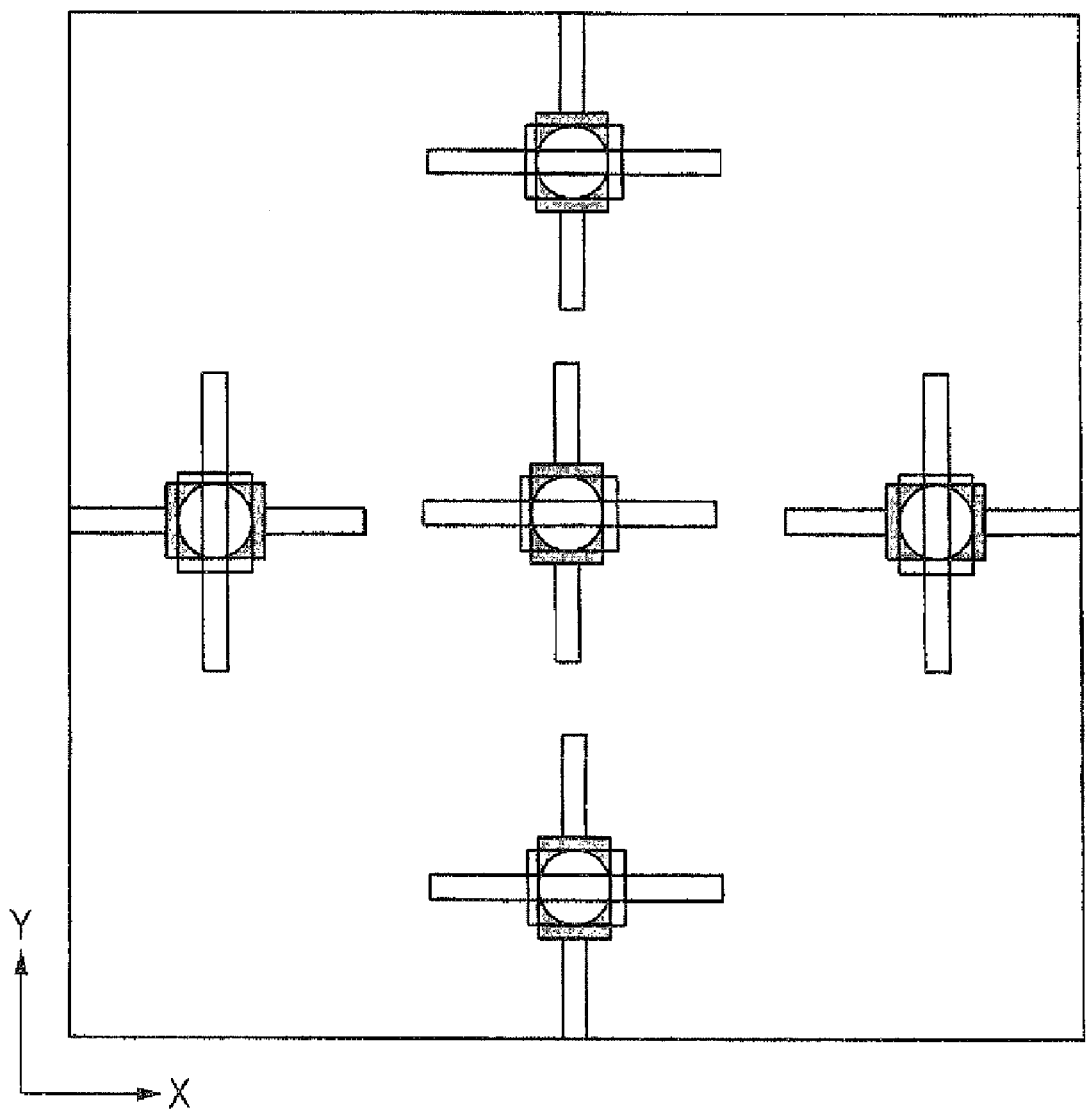
FIG. 53 is a top view of an alignment apparatus showing the thirteenth embodiment of the invention (other modified arrangement example 3).
Figure 54:
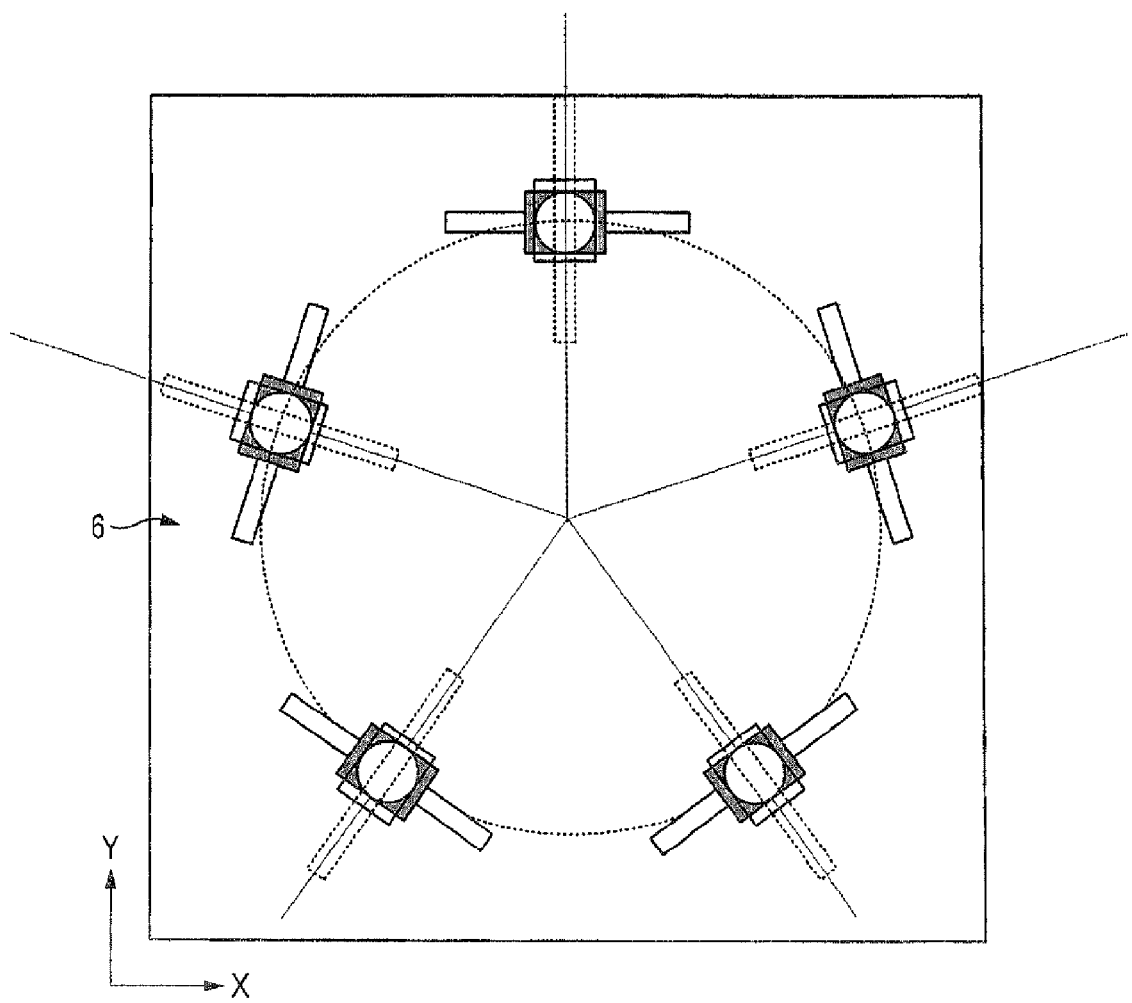
FIG. 54 is a top view of an alignment apparatus showing the thirteenth embodiment of the invention (other modified arrangement example 4).
Figure 55:
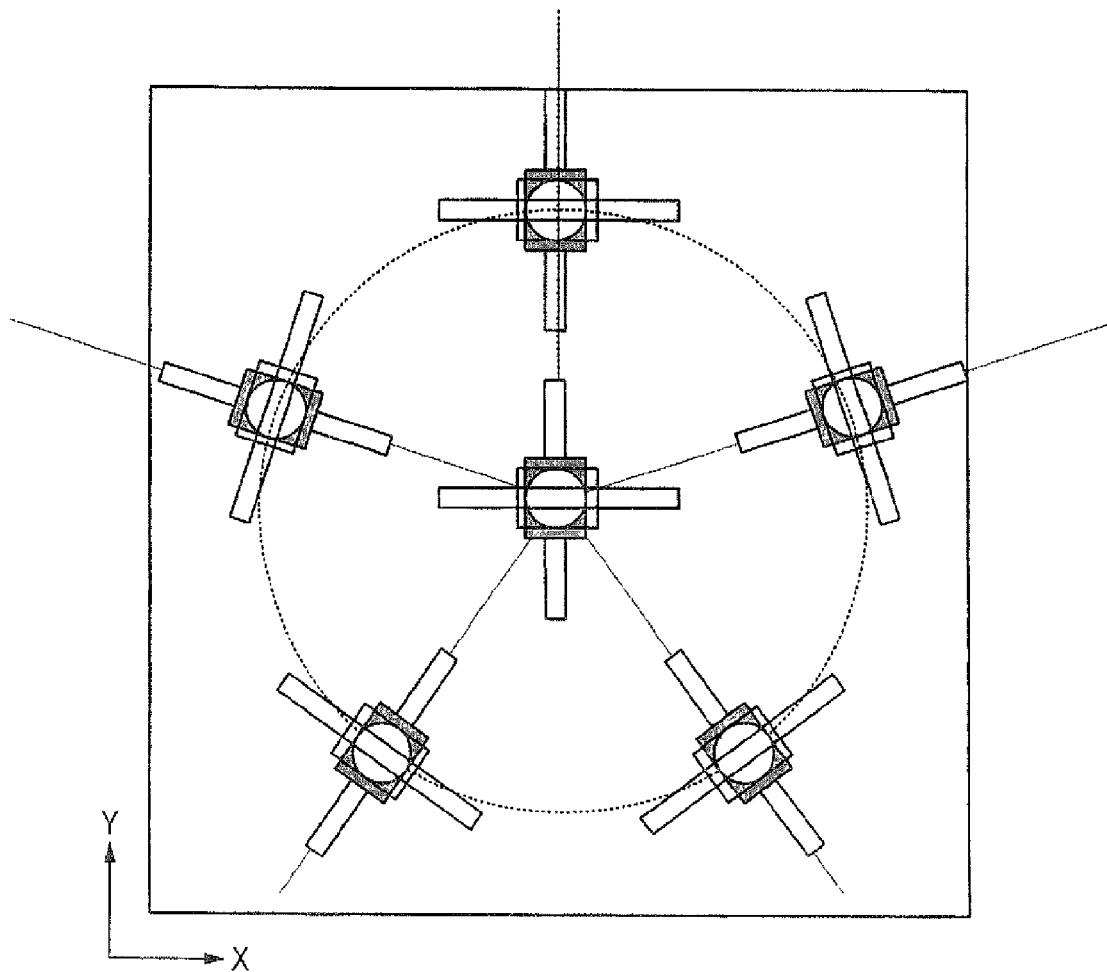
FIG. 55 is a top view of an alignment apparatus showing the thirteenth embodiment of the invention (other modified arrangement example 5).
Figure 56:
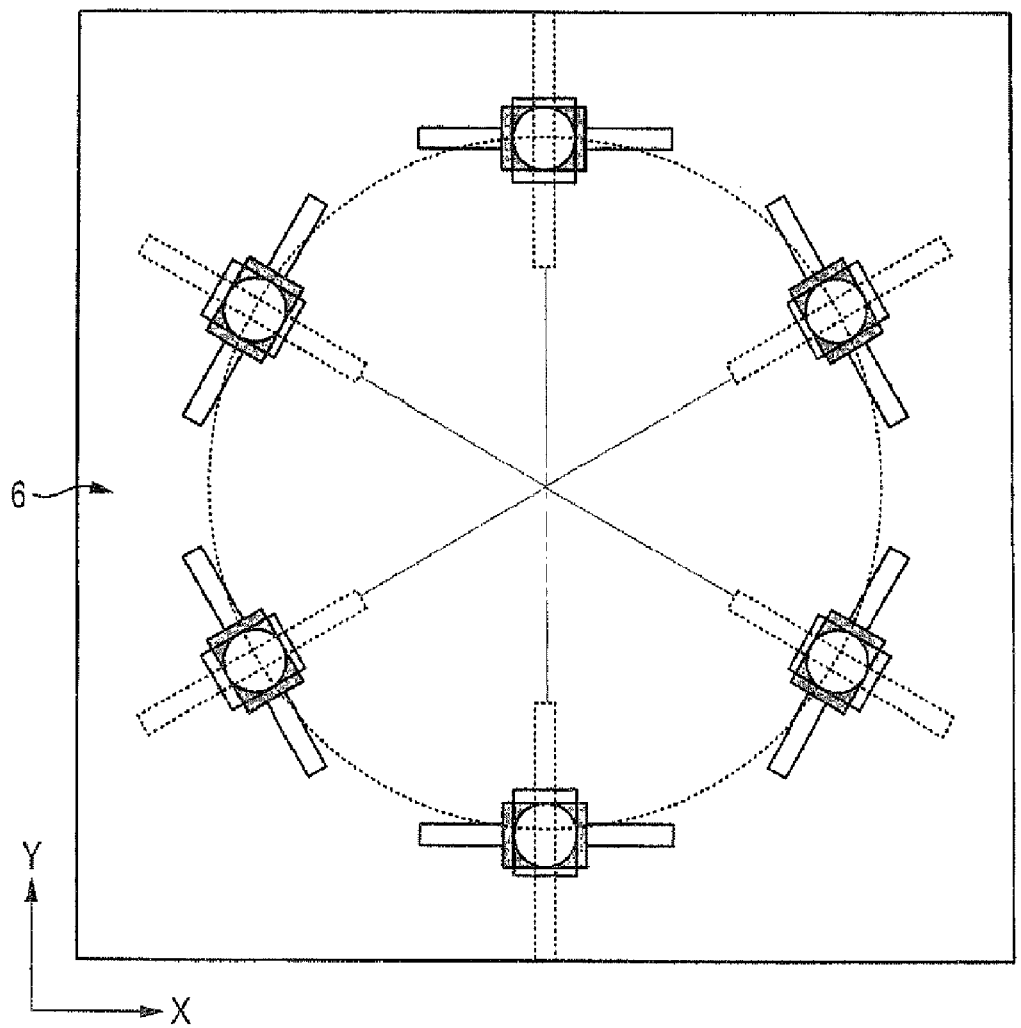
FIG. 56 is a top view of an alignment apparatus showing the thirteenth embodiment of the invention (other modified arrangement example 6).
Figure 57:
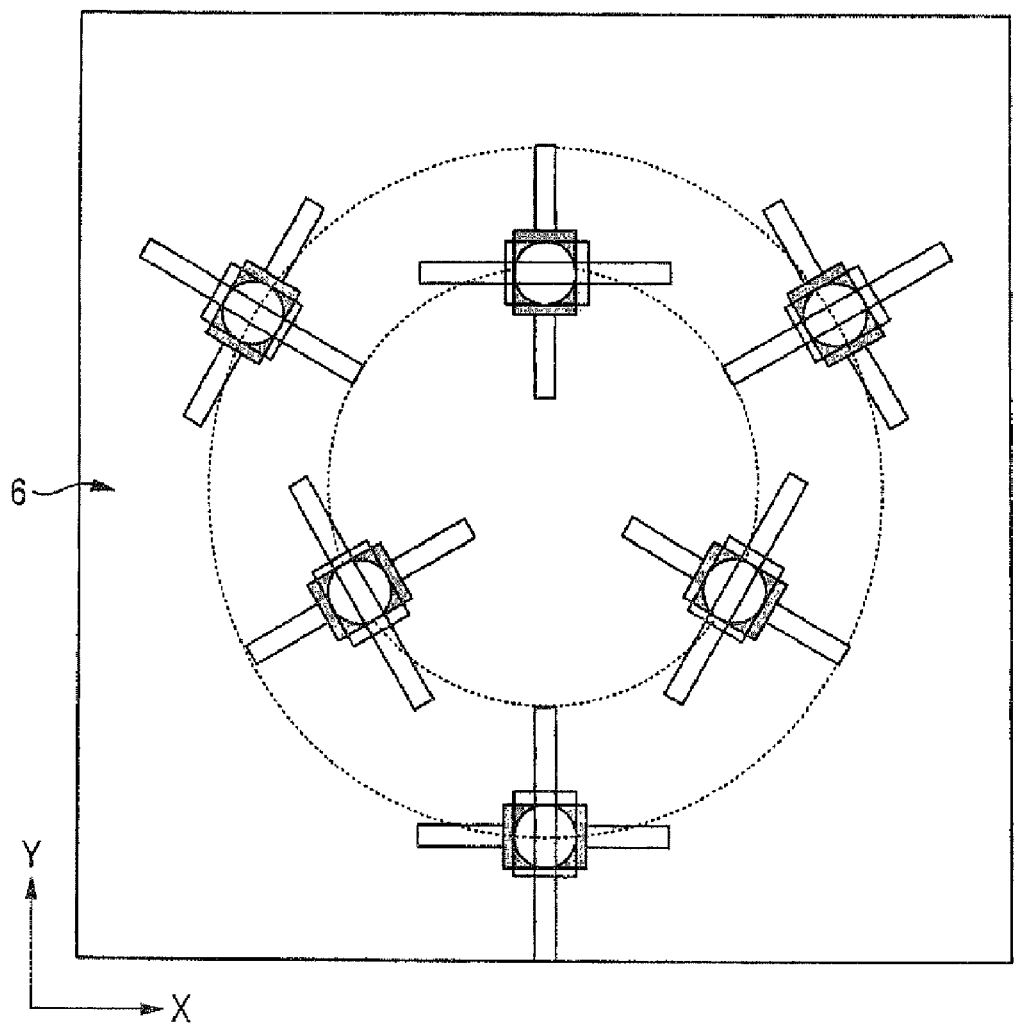
FIG. 57 is a top view of an alignment apparatus showing the thirteenth embodiment of the invention (other modified arrangement example 7).
Figure 58:
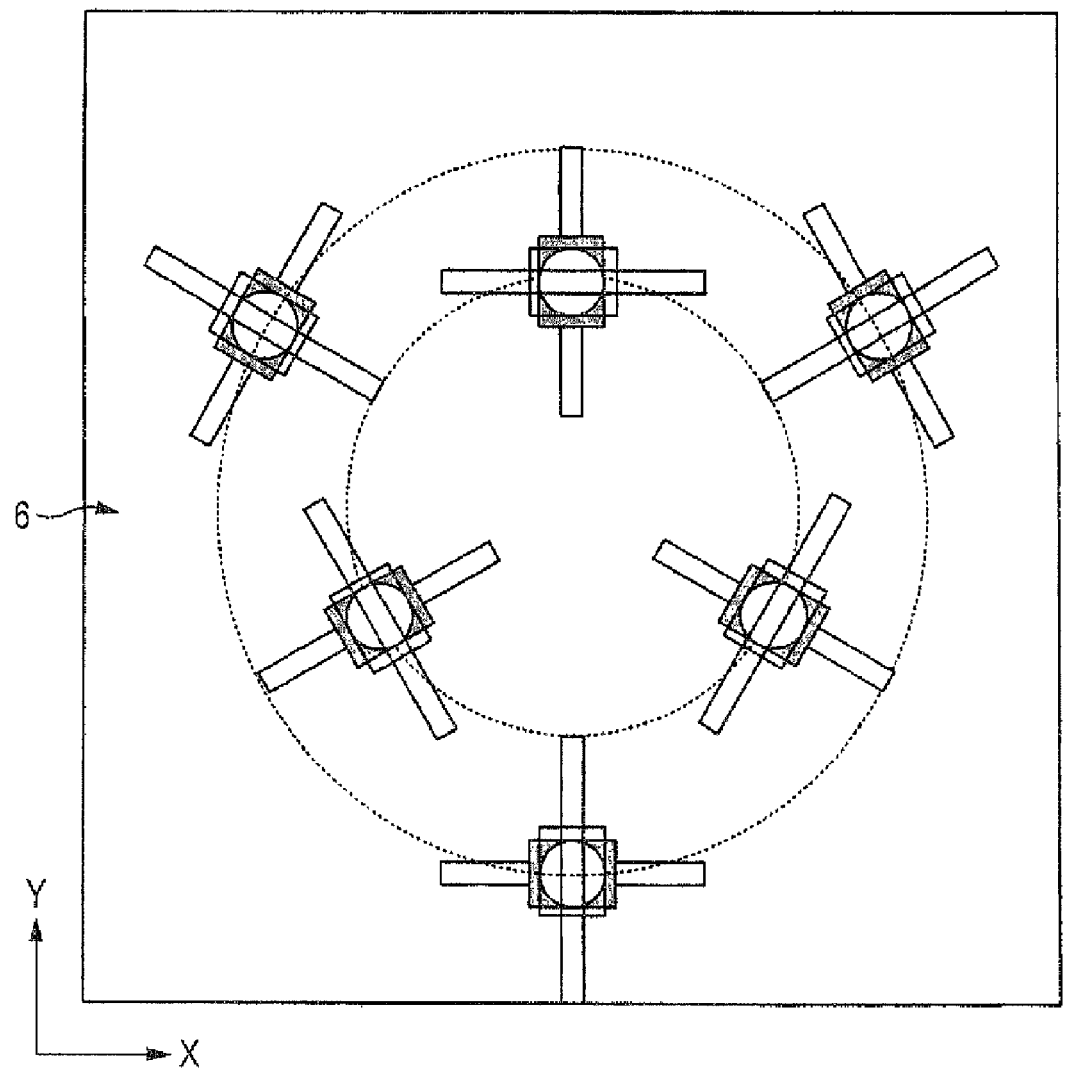
FIG. 58 is a top view of an alignment apparatus showing the thirteenth embodiment of the invention (other modified arrangement example 8).
Figure 59:
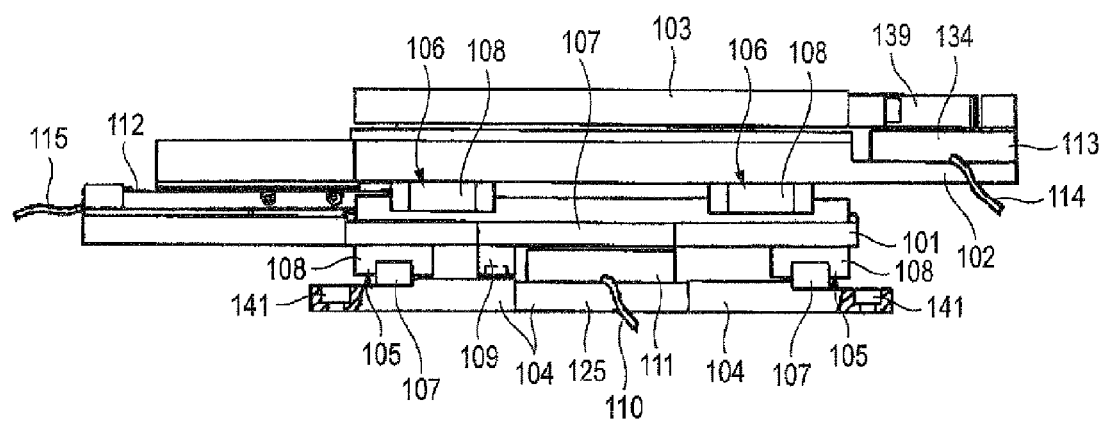
FIG. 59 is a front view of a stage apparatus including a linear motor of a first background art example.
Figure 60:
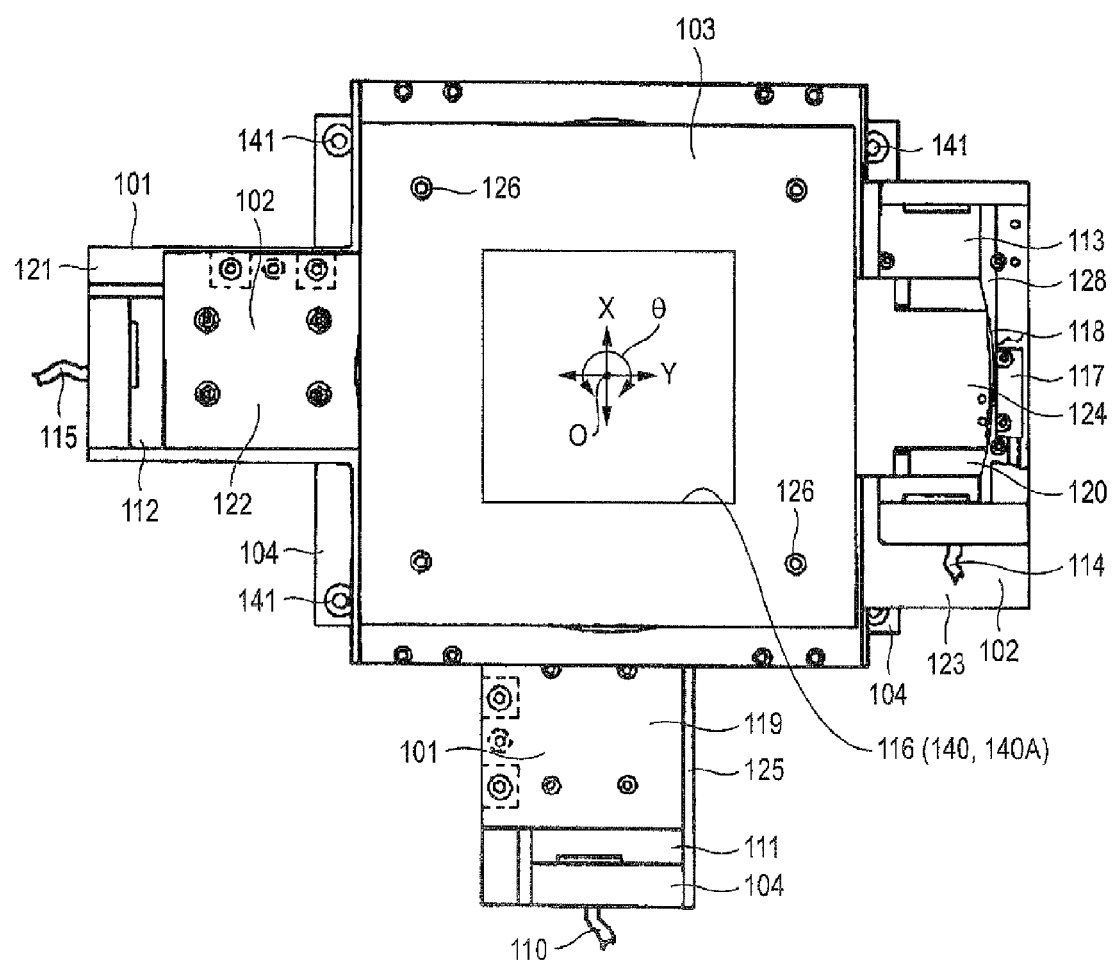
FIG. 60 is a plane view of the stage apparatus including the linear motor of the first background art example.
Figure 61:
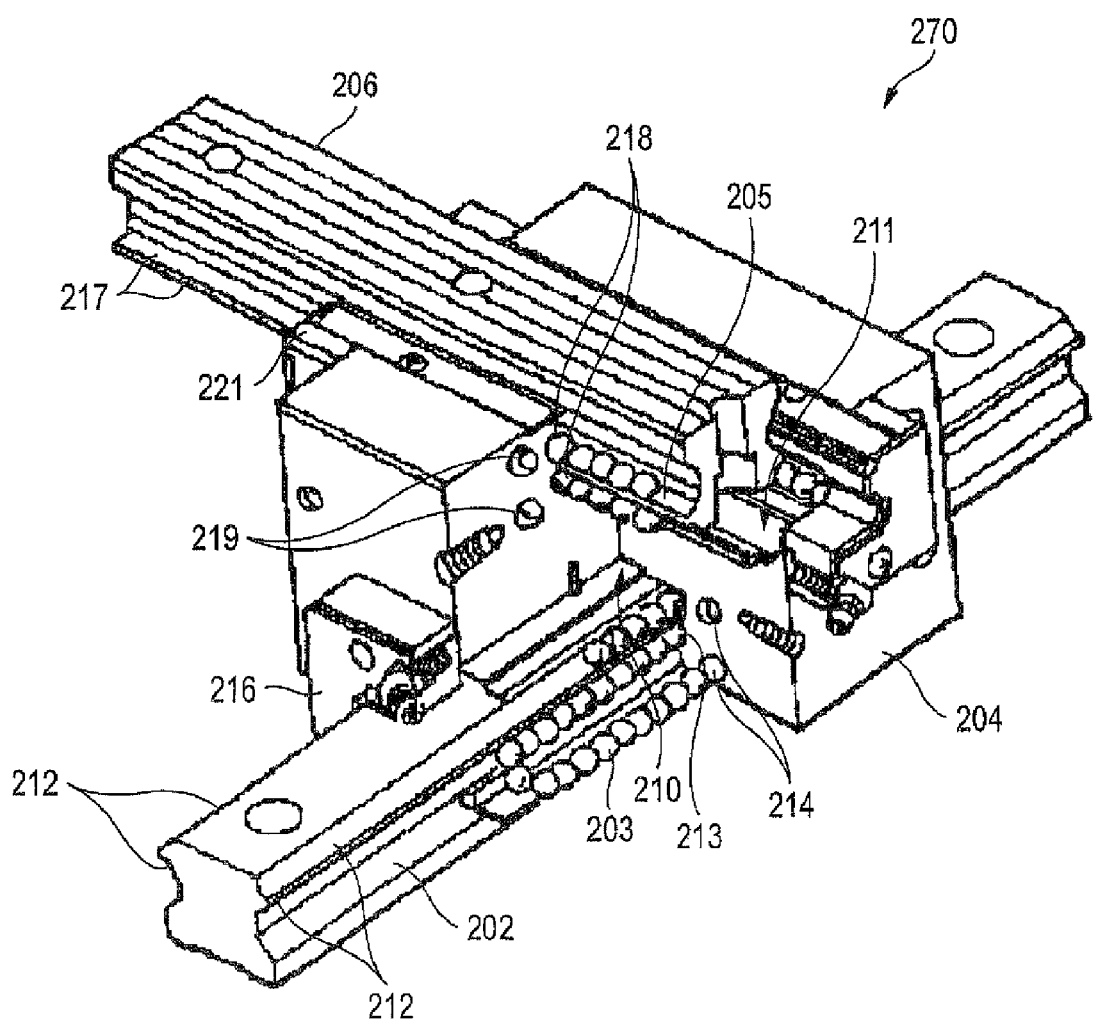
FIG. 61 is a partially broken disassembled perspective view of a biaxial parallel/monoaxial swiveling motion guide mechanism of a second background art example.
Figure 62A:
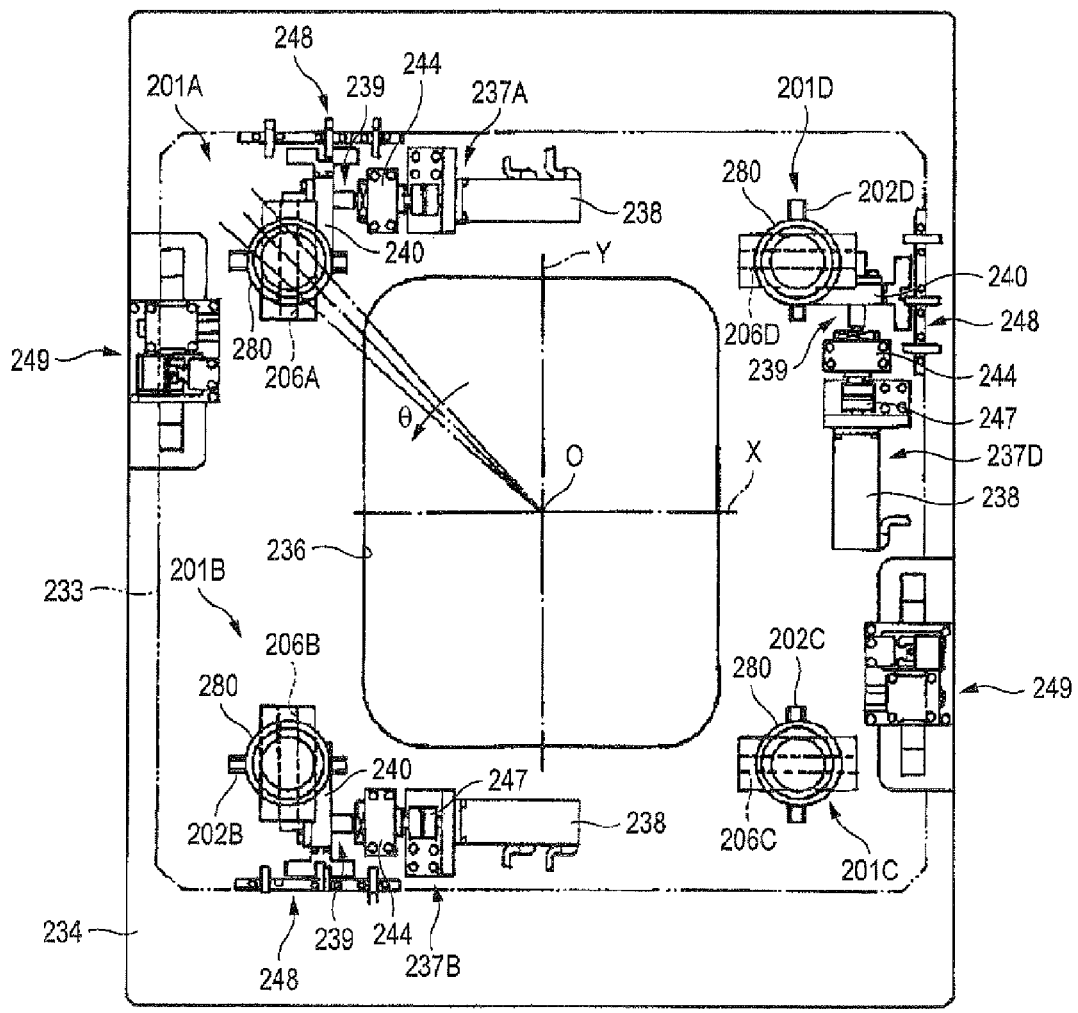
FIGS. 62A and 62B illustrate a plane view and side view of a biaxial parallel/monoaxial swiveling table apparatus of the second background art example.
Figure 62B:
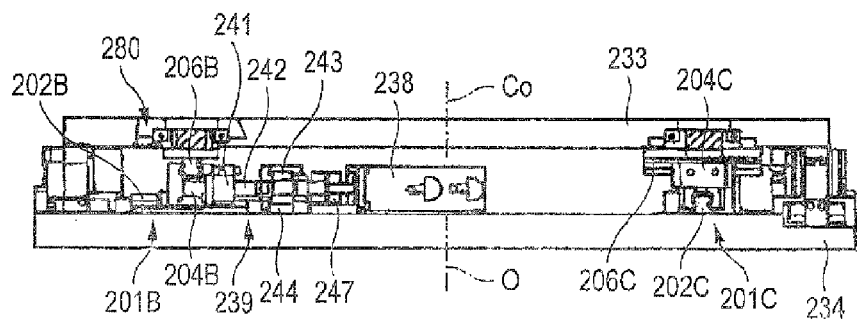
Figure 63:
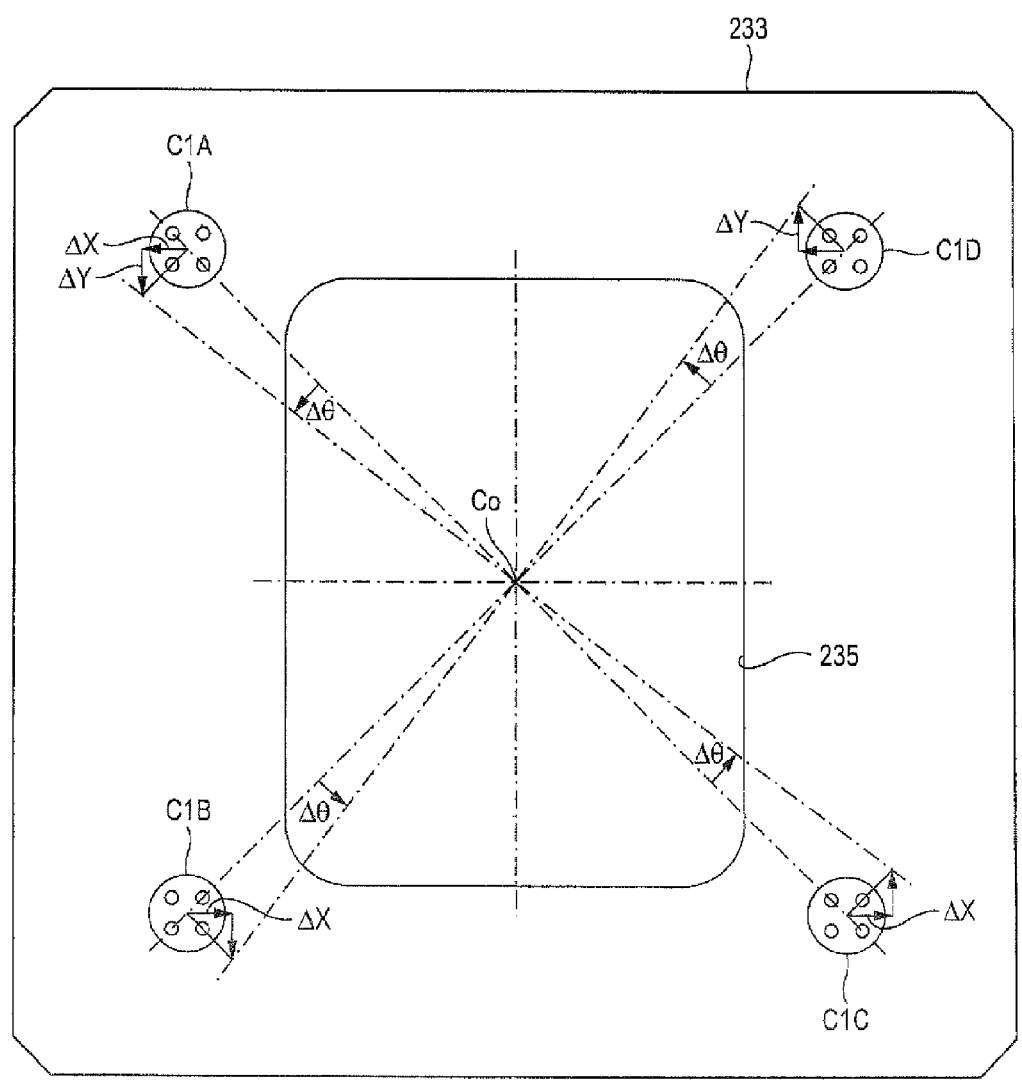
FIG. 63 is a plane view of a table of the second background art example.

FIG. 51 is a top view of an alignment apparatus showing the thirteenth embodiment of the invention (other modified arrangement example 1), FIG. 52 is a top view of the alignment apparatus showing the thirteenth embodiment of the invention (other modified arrangement example 2), FIG. 53 is a top view of an alignment apparatus showing the thirteenth embodiment of the invention (other modified arrangement example 3), FIG. 54 is a top view of the alignment apparatus showing the thirteenth embodiment of the invention (other modified arrangement example 4), FIG. 55 is a top view of an alignment apparatus showing the thirteenth embodiment of the invention (other modified arrangement example 5), FIG. 56 is a top view of the alignment apparatus showing the thirteenth embodiment of the invention (other modified arrangement example 6), FIG. 57 is a top view of an alignment apparatus showing the thirteenth embodiment of the invention (other modified arrangement example 7), FIG. 58 is a top view of the alignment apparatus showing the thirteenth embodiment of the invention (other modified arrangement example 8). A portion of Embodiment 13 which differs from Embodiments 5 through 12 resides in a number of the translational drive/translational/rotational freedom degree mechanism modules 6, and resides in that as shown by FIGS. 51 through 58, 5 pieces or more of the translational drive/translational/rotational freedom degree mechanism modules 6 are used. The translational drive/translational/rotational freedom degree mechanism module 6 can geometrically be determined even when the constitution is any of those shown in Embodiment 5 through Embodiment 9, further, even when the translational drive/translational/rotational freedom degree mechanism module 6 having different constitutions are mixedly present, further, even when the direction of the arrangement of any of those, and therefore, with regard to the series of operation of the rotational movement, the rotational movement and the translational movement of the alignment apparatus, the operation stay the same, and therefore, an explanation thereof will be omitted. Further, the two-dimensional position sensor 9, the calculating portion of compensation value 10 shown in Embodiment 7 are omitted.

That is, even when the translational drive/translational/rotational freedom degree mechanism module 6 is arranged by the different constitution, the moving amount may be instructed by the reference generator portion 8 in accordance with the constitution, the translational drive/translational/rotational freedom degree mechanism modules 6 having different arrangements of the translational drive portion 11 and the rotation drive portion 17 may mixedly be present.

Further, even when a number and the arrangement of the translational drive/translational/rotational freedom degree mechanism modules 6 are not those shown in Embodiment 5 through Embodiment 13, the plurality of translational drive/translational/rotational freedom degree mechanism modules 6 may be arranged at the lower face of the table 4, the table 4 may rotationally be moved and translationally be moved.

As described above, even when the table is large-sized and heavy-loaded, the load is dispersingly supported by 2 or more of the translational drive/translational/rotational freedom degree mechanism modules 6, even when an external force is operated to the table 4, by maintaining the position, the table 4 can accurately be positioned to any positions.

INDUSTRIAL APPLICABILITY

By constituting all of the linear motors at the lower portion by the translational drive/translational/rotational freedom degree mechanism module, the table can be constituted by restraining the height thereof even when the table is large-sized. Therefore, the invention is applicable to also a use of downsizing the height of the apparatus.

Further, even when the apparatus is large-sized, the drive force thereof can be dispersed by utilizing a plurality of standard linear motors without using a special large-sized linear motor. Therefore, there is also achieved an advantage of easily capable of procuring the part of the apparatus in comparison with the special product in view of delivery and cost.

The invention claimed is:

1. An alignment apparatus positioning a table portion on which an object is mounted to a predetermined position using a drive mechanism, the alignment apparatus comprising:
   at least three translational drive/translational/rotational freedom degree mechanism modules each comprising:
   two translational freedom degree guide portions each having a translational freedom degree, wherein a linear motor is provided to one of the translational freedom degree guide portions; and
   one rotational freedom degree guide portion having a rotational freedom degree;
   a detecting portion that detects a moving distance of each of the linear motors;
   a motor controller that controls each of the linear motors in response to a reference signal; and
   a reference signal generator that sends the reference signal to the motor controller, and
   wherein the at least three translational drive/translational/rotational freedom degree mechanism modules are arranged with respect to the table portion such that a moving directions of the other translational freedom degree guide portion and a moving direction of the rotational freedom degree guide portion can be determined by operating the linear motors in a translation direction, and
   wherein each of the linear motors is located on a circle whose center point is located on a center point of the table portion, and is moved in a tangential direction of the circle, so that
   the table portion is moved in two independent translational directions or in a rotational direction by operating the linear motors in the translational directions.

2. The alignment apparatus according to claim 1, wherein the reference signal generator includes a calculating portion that calculates a moving distance of the linear motor based on a moving distance of the table portion.

3. The alignment apparatus according to claim 1, further comprising:
   a two-dimensional position sensor that detects an arrangement of the object; and
   a calculating portion that calculates a compensation value for compensating a position of the object,
   wherein the position of the object is compensated by moving the table portion in the two independent translational directions on in the rotational direction by driving the linear motor to thereby compensate the position of the object detected by the two-dimensional position sensor.

4. The alignment apparatus according to claim 1, wherein the translational drive/translational/rotational freedom degree mechanism module further provides the translational freedom degree guide portion on a translational drive portion to which the linear motor is attached at the translational freedom degree guide portion, and the rotational freedom degree guide portion is provided on the translational freedom degree guide portion.

5. The alignment apparatus according to claim 1, wherein the translational drive/translational/rotational freedom degree mechanism module provides the rotational freedom degree guide portion on a translational drive portion to which the linear motor is attached at the translational freedom degree guide portion, and the rotational freedom degree guide portion is provided further on the rotational drive portion.

6. The alignment apparatus according to claim 1, further comprising:
   a 3 freedom degree module that includes two translational freedom degree guide portions, wherein one of the rotational freedom degree guide portion does not include a linear motor.

7. The alignment apparatus according to claim 1, further comprising:
   a two-dimensional position sensor that detects a position of the object; and
   a calculating portion that calculates a compensation value for compensating the position of the object by image processing the object detected by the two-dimensional position sensor, wherein the position of the table portion is compensated by driving the linear motor based on the compensation value calculated by the calculating portion.

8. The alignment apparatus according to claim 7, wherein the calculating portion generates the compensating value so as to compensate the position of the object after the position of the object is detected by the two-dimensional position sensor and the table portion is moved in the independent translational direction by the translational drive/translational/rotational freedom degree mechanism module.

9. The alignment apparatus according to claim 7, wherein the two-dimensional position sensor detects the position of the object, the calculating portion generates the compensation value to compensate the position of the object, the rotational drive portion is moved, and then the reference generator sends the reference signal so as to move the translational drive portion.

10. An alignment apparatus positioning a table portion on which an object is mounted to a predetermined position using a drive mechanism, the alignment apparatus comprising:
at least two sets of translational drive/translational/rotational freedom degree mechanism modules comprising:
two translational drive portions each having a translational freedom degree;
one rotational drive portion having a rotational freedom degree;
three linear motors provided to the translational drive portions and the rotational drive portions, respectively, to drive the respective drive portions;
a detecting portion that detects a moving distance of each of the linear motors; and
a motor controller that controls each of the linear motors in response to a reference signal; and
a reference generator that sends the reference signal to the controller,
wherein each of the linear motors is located on a circle whose center point is located on a center point of the table portion, and is moved such that an angle formed by a moving direction of one of the linear motors and a moving direction of another linear motor adjacent to said one linear motor is set to a given angle, so that the table portion is moved in two independent translational directions or in a rotational direction by operating the translational drive portions and the rotational drive portion using the linear motors.

11. The alignment apparatus according to claim 10, wherein
the translational drive/translational/rotational freedom degree mechanism module comprises at least one translational drive portion and one rotational drive portion, and a rotational center of the rotational drive portion is arranged on the same radius from the rotational center and is arranged axially symmetrically with respect to the rotational center.

12. The alignment apparatus according to claim 11, wherein
the translational drive/translational/rotational freedom degree mechanism module is arranged such that one of moving directions of the translational drive portion coincides with the rotational center.

13. The alignment apparatus according to claim 11, wherein
the translational drive/translational/rotational freedom degree mechanism module includes the rotational drive portion arranged at an upper portion or a lower portion of the translational drive portion having two freedom degrees.

14. The alignment apparatus according to claim 11, wherein
in the translational drive/translational/rotational freedom degree mechanism module, the rotational drive portion is arranged at an upper portion of the translational drive portion having at least one freedom degree, and the translational drive portion having at least one freedom degree is arranged at an upper portion of the rotational drive portion.

* * * * *